US012446231B1

(12) United States Patent
Manfrini et al.

(10) Patent No.: US 12,446,231 B1
(45) Date of Patent: Oct. 14, 2025

(54) METHOD OF INTEGRATING A CAPACITOR INCLUDING A NON-LINEAR POLAR MATERIAL WITH A TRANSISTOR THROUGH WAFER BONDING

(71) Applicant: Kepler Computing Inc., San Francisco, CA (US)

(72) Inventors: Mauricio Manfrini, Heverlee (BE); Noriyuki Sato, Hillsboro, OR (US); James David Clarkson, El Sobrante, CA (US); Abel Fernandez, Berkeley, CA (US); Somilkumar J. Rathi, San Jose, CA (US); Niloy Mukherjee, San Ramon, CA (US); Tanay Gosavi, Portland, OR (US); Amrita Mathuriya, Portland, OR (US); Rajeev Kumar Dokania, Beaverton, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 92 days.

(21) Appl. No.: 18/326,433

(22) Filed: May 31, 2023

Related U.S. Application Data

(63) Continuation of application No. 18/167,816, filed on Feb. 10, 2023, now Pat. No. 11,765,908.

(51) Int. Cl.
*H10B 53/30* (2023.01)
(52) U.S. Cl.
CPC .................... *H10B 53/30* (2023.02)
(58) Field of Classification Search
CPC ........ H10B 53/30; H10B 53/40; H10B 53/50; H10B 12/01; H10B 12/02; H10B 12/03;
(Continued)

(56) References Cited

U.S. PATENT DOCUMENTS

| 3,260,863 A | 7/1966 | Burns et al. |
| 3,524,977 A | 8/1970 | Wang |

(Continued)

FOREIGN PATENT DOCUMENTS

| JP | HO0722578 | 1/1995 |
| JP | H0982907 A | 3/1997 |

(Continued)

OTHER PUBLICATIONS

"Kepler Logic", Named for Amalie Emmy Noether @ https://en.wikipedia.org/wiki/Emmy_Noether. Downloaded from internet on Jan. 10, 2020.

(Continued)

*Primary Examiner* — Thanhha S Pham
(74) *Attorney, Agent, or Firm* — MUGHAL GAUDRY & FRANKLIN PC

(57) ABSTRACT

A method of fabricating a device comprises forming a multi-layer stack above a first substrate, where multi-layer stack includes a non-linear polar material. In at least one embodiment, method further includes forming a first conductive layer on multi-layer stack and annealing multi-layer stack. A transistor is formed above a second substrate. In at least one embodiment, method also includes forming a second conductive layer above electrode structure and bonding first conductive layer with second conductive layer. After bonding, method includes removing at least a portion of first substrate patterning multi-layer stack to form a memory device.

22 Claims, 41 Drawing Sheets

(58) Field of Classification Search
CPC .... H10B 12/36; H10H 20/018; H10H 20/032; H01H 20/011
See application file for complete search history.

(56) References Cited

U.S. PATENT DOCUMENTS

| | | |
|---|---|---|
| 5,086,412 A | 2/1992 | Jaffe et al. |
| 5,381,352 A | 1/1995 | Shou et al. |
| 5,539,279 A | 7/1996 | Takeuchi et al. |
| 5,739,563 A | 4/1998 | Kawakubo et al. |
| 5,818,380 A | 10/1998 | Ito et al. |
| 5,835,045 A | 11/1998 | Ogawa et al. |
| 5,926,057 A | 7/1999 | Ogawa et al. |
| 5,978,827 A | 11/1999 | Ichikawa |
| 6,043,675 A | 3/2000 | Miyamoto |
| 6,198,652 B1 | 3/2001 | Kawakubo et al. |
| 6,208,282 B1 | 3/2001 | Miyamoto |
| 6,368,910 B1 | 4/2002 | Sheu et al. |
| 6,656,301 B2 | 12/2003 | Kirby |
| 6,798,686 B2 | 9/2004 | Takashima |
| 6,873,536 B2 | 3/2005 | Komatsuzaki |
| 6,906,944 B2 | 6/2005 | Takeuchi et al. |
| 7,075,134 B2 | 7/2006 | Araujo et al. |
| 7,169,621 B2 | 1/2007 | Hasegawa et al. |
| 7,405,959 B2 | 7/2008 | Koide et al. |
| 7,791,922 B2 | 9/2010 | Doumae et al. |
| 7,837,110 B1 | 11/2010 | Hess et al. |
| 7,897,454 B2 | 3/2011 | Wang et al. |
| 8,247,855 B2 | 8/2012 | Summerfelt |
| 8,300,446 B2 | 10/2012 | Qidwai |
| 8,865,628 B2 | 10/2014 | Manabe et al. |
| 9,276,040 B1 | 3/2016 | Marshall et al. |
| 9,324,405 B2 | 4/2016 | Evans, Jr. et al. |
| 9,472,560 B2 | 10/2016 | Ramaswamy et al. |
| 9,697,882 B1 | 7/2017 | Evans, Jr. et al. |
| 9,858,979 B1 | 1/2018 | Derner et al. |
| 9,973,329 B2 | 5/2018 | Hood et al. |
| 10,217,522 B2 | 2/2019 | Wang et al. |
| 10,679,782 B2 | 6/2020 | Manipatruni et al. |
| 10,847,201 B2 | 11/2020 | Manipatruni et al. |
| 10,998,025 B2 | 5/2021 | Manipatruni et al. |
| 11,482,270 B1 | 10/2022 | Dokania et al. |
| 2001/0052619 A1 | 12/2001 | Inoue et al. |
| 2002/0079520 A1 | 6/2002 | Nishihara et al. |
| 2003/0012984 A1 | 1/2003 | Ueda |
| 2003/0112650 A1 | 6/2003 | Kang |
| 2004/0089854 A1 | 5/2004 | Chen et al. |
| 2004/0183508 A1 | 9/2004 | Toyoda et al. |
| 2004/0245547 A1 | 12/2004 | Stipe |
| 2006/0002170 A1 | 1/2006 | Kumura et al. |
| 2010/0320519 A1* | 12/2010 | Nagai .................... H10B 53/40 257/295 |
| 2012/0127776 A1 | 5/2012 | Kawashima |
| 2015/0337983 A1 | 11/2015 | Dolenti et al. |
| 2017/0069735 A1 | 3/2017 | Oh et al. |
| 2017/0243917 A1 | 8/2017 | Manipatruni et al. |
| 2017/0277459 A1 | 9/2017 | Rodriguez et al. |
| 2017/0337983 A1 | 11/2017 | Wang et al. |
| 2018/0076815 A1 | 3/2018 | Vigeant et al. |
| 2018/0240583 A1 | 8/2018 | Manipatruni et al. |
| 2018/0331113 A1 | 11/2018 | Liao et al. |
| 2019/0074295 A1 | 3/2019 | Schröder |
| 2019/0318775 A1 | 10/2019 | Rakshit et al. |
| 2019/0348098 A1 | 11/2019 | El-Mansouri et al. |
| 2020/0051607 A1 | 2/2020 | Pan et al. |
| 2020/0091414 A1 | 3/2020 | Liu et al. |
| 2020/0210233 A1 | 7/2020 | Chen et al. |
| 2021/0142837 A1 | 5/2021 | Yu et al. |
| 2021/0193209 A1 | 6/2021 | Swami et al. |

FOREIGN PATENT DOCUMENTS

| | | |
|---|---|---|
| JP | H10242426 A | 9/1998 |
| JP | H1174488 A | 3/1999 |
| JP | 2000156472 A | 6/2000 |
| JP | 2000174224 A | 6/2000 |
| JP | 2001237393 A | 8/2001 |
| JP | 2002026256 A | 1/2002 |
| JP | 2002158339 A | 5/2002 |
| JP | 2005142322 A | 6/2005 |
| JP | 2005322925 A | 11/2005 |
| JP | 2008210955 A | 9/2008 |
| JP | 2010021544 A | 1/2010 |
| JP | 2011151370 A | 8/2011 |
| JP | 2017518632 A | 7/2017 |
| KR | 100481867 B1 | 4/2005 |
| KR | 20050105695 A | 11/2005 |
| KR | 100895740 B1 | 4/2009 |
| KR | 20160089141 A | 7/2016 |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Final Office Action notified Aug. 15, 2022 for U.S. Appl. No. 17/346,083.

Final Office Action notified Sep. 12, 2022 for U.S. Appl. No. 17/367,217.

Gupta et al., "Buried Power Rail Integration with Si FinFETs for CMOS Scaling beyond the 5 nm Node," 2020 IEEE Symposium on VLSI Technology, Jun. 16-19, 2020, Honolulu, HI, US. 2 pages. DOI: 10.1109/VLSITechnology18217.2020.9265113.

Gupta et al., "Buried Power Rail Scaling and Metal Assessment for the 3 nm Node and Beyond," 2020 IEEE International Electron Devices Meeting (IEDM), Dec. 12-18, 2020, San Francisco, CA, US. 4 pages. DOI: 10.1109/IEDM13553.2020.9371970.

Magnuson et al., "Bonding Mechanism in the Nitrides Ti2AlN and TiN: an Experimental and Theoretical Investigation," Physical Review B76, 195127, Nov. 13, 2007. (18 pages).

Mathur et al., "Buried Bitline for sub-5nm SRAM Design," 2020 IEEE International Electron Devices Meeting (IEDM), San Francisco, CA, US. 4 pages. DOI: 10.1109/IEDM13553.2020.9372042.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., Threshold Logic and Its Applications, Wiley-Interscience, a Division of John Wiley & Sons, Inc. New York, 1971. 8 page excerpt.

Niklaus "Adhesive Wafer Bonding for Microelectronic and Microelectromechanical Systems," PhD dissertation, School of Electrical Engineering, Royal Institute of Technology, Stockholm, Sweden, 2002 (65 pages).

Non-Final Office Action notified Aug. 16, 2022 for U.S. Appl. No. 17/367,217.

Non-Final Office Action notified May 10, 2023 for U.S. Appl. No. 18/167,816.

Non-Final Office Action notified Nov. 4, 2022 for U.S. Appl. No. 17/530,362.

Non-Final Office Action notified Nov. 21, 2022 for U.S. Appl. No. 7/532,657.

Non-Final Office Action notified Nov. 28, 2022 for U.S. Appl. No. 17/532,552.

Non-Final Office Action notified Oct. 12, 2022 for U.S. Appl. No. 17/530,365.

Non-Final Office Action notified Oct. 26, 2022 for U.S. Appl. No. 17/531,577.

Non-Final Office Action notified Sep. 1, 2022 for U.S. Appl. No. 17/339,850.

Non-Final Office Action notified Sep. 7, 2022 for U.S. Appl. No. 17/530,360.

Notice of Allowance notified Aug. 17, 2022 for U.S. Appl. No. 17/346,087.

Notice of Allowance notified Aug. 22, 2022 for U.S. Appl. No. 7/390,791.

Notice of Allowance notified Aug. 25, 2022 for U.S. Appl. No. 17/367,101.

(56) References Cited

OTHER PUBLICATIONS

Notice of Allowance notified Aug. 31, 2022 for U.S. Appl. No. 17/359,325.
Notice of Allowance notified Jan. 20, 2023 for U.S. Appl. No. 17/532,657.
Notice of Allowance notified Jan. 30, 2023 for U.S. Appl. No. 17/531,535.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Oct. 20, 2022 for Taiwan Patent Application No. 110129115.
Notice of Allowance notified Oct. 31, 2022 for U.S. Appl. No. 17/390,796.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Nov. 22, 2022 for Japanese Patent Application No. 2021-546864.
Nowick et al., "Asynchronous Design—Part 1: Overview and Recent Advances." IEEE Design & Test ( vol. 32, Issue: 3, Jun. 2015).
Restriction Requirement notified Aug. 26, 2022 for U.S. Appl. No. 17/390,796.
Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).
Salahuddin et al., "Buried Power SRAM DTCO and System-Level Benchmarking in N3," 2020 Symposium on VLSI Technology Digest of Technical Papers—JFS3.3 IEEE. 2 pages.
Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.
Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.
Sutherland et al., "Computers without Clocks," Scientific American. Aug. 1, 2002;287(2):62-69.
Tsukimoto et al., "Microstructure of Amorphous Tantalum Nitride Thin Films," Thin Solid Films, 460 (2004, pp. 222-226. Department of Materials Science and Engineering, Kyoto University, Japan (5 pages).
Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

* cited by examiner

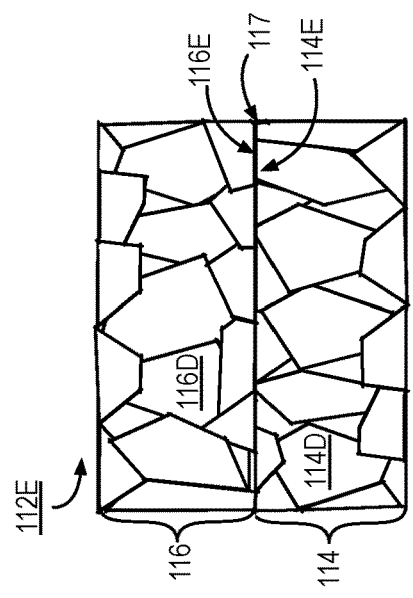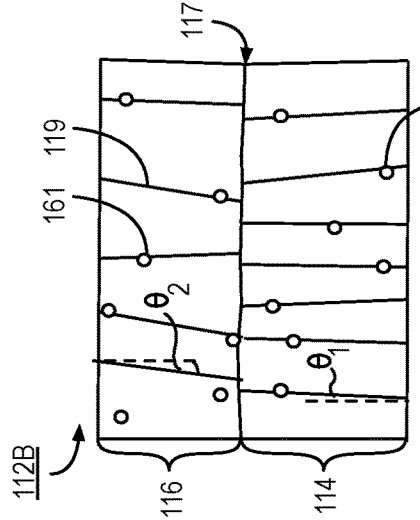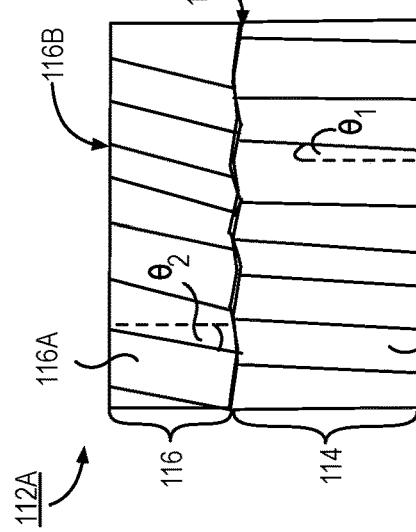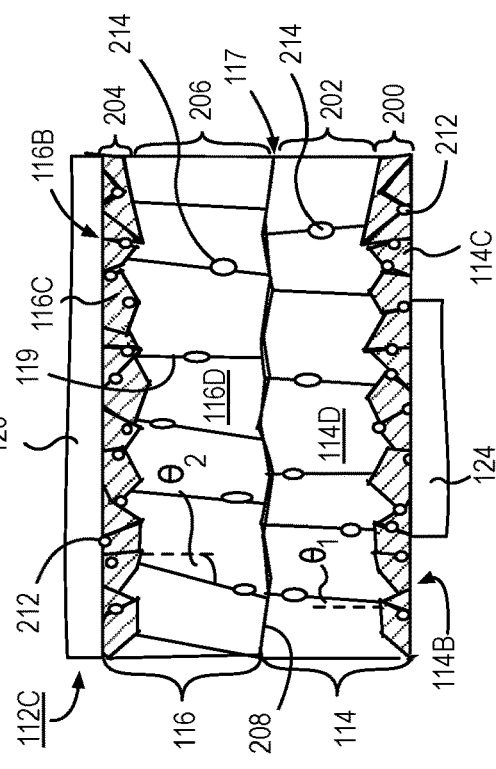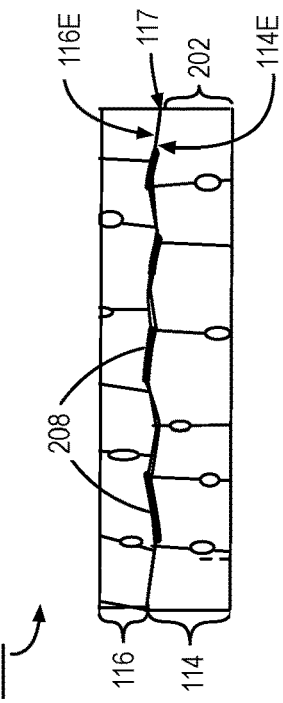

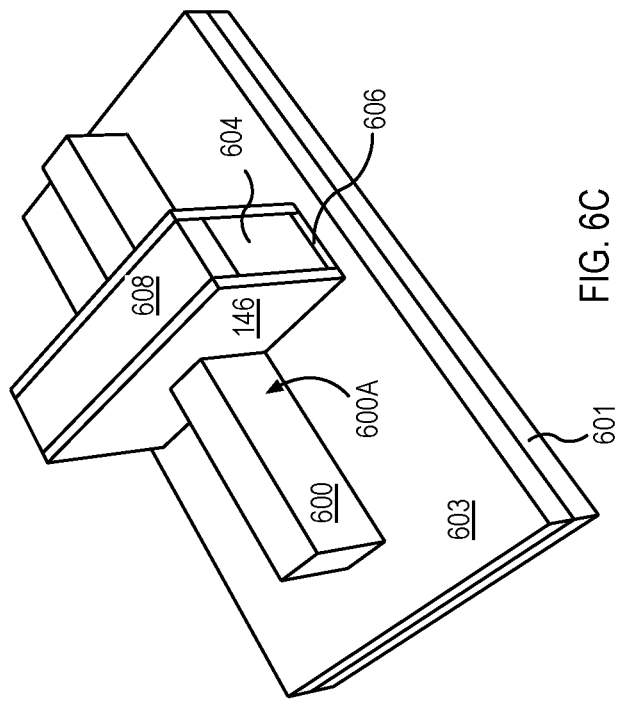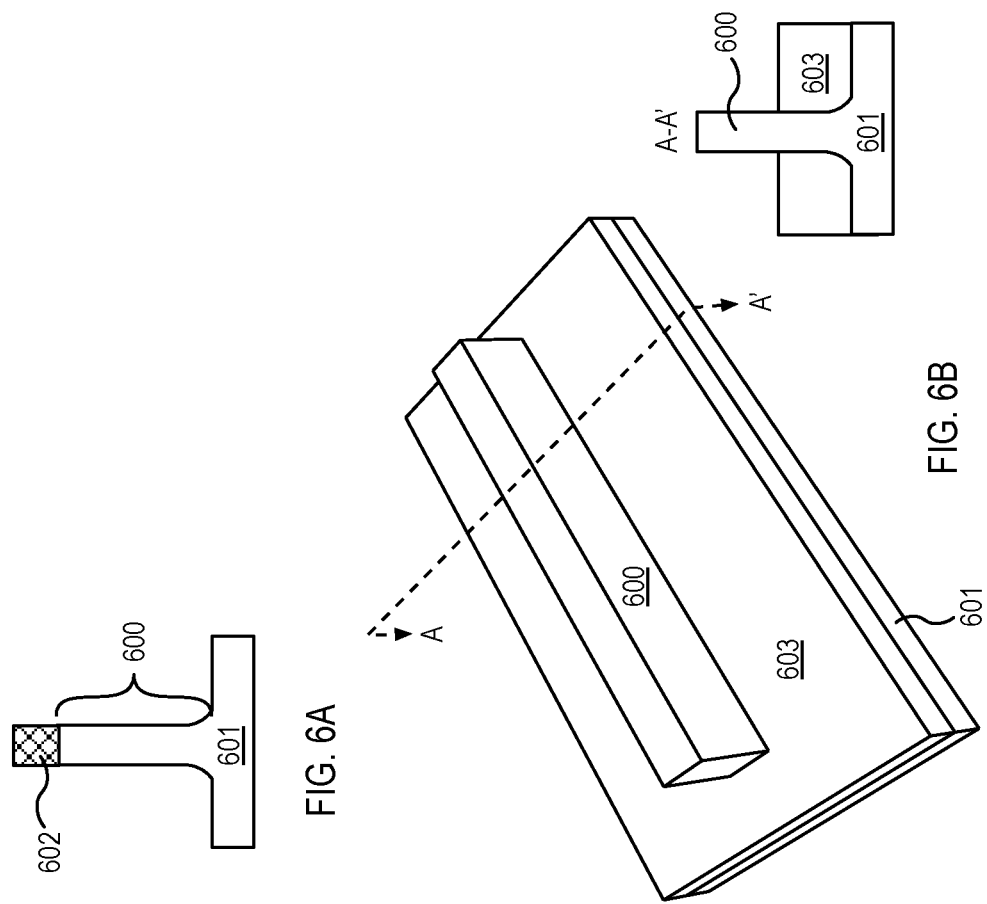

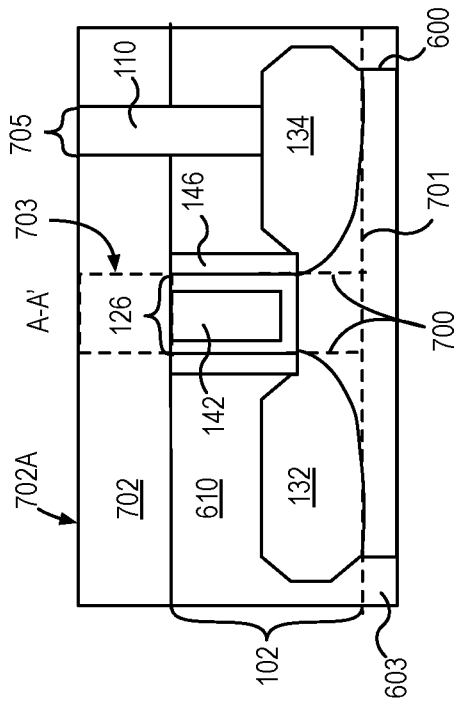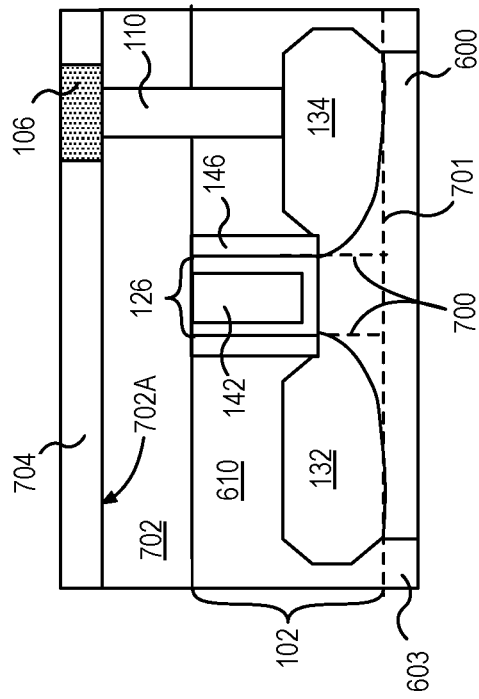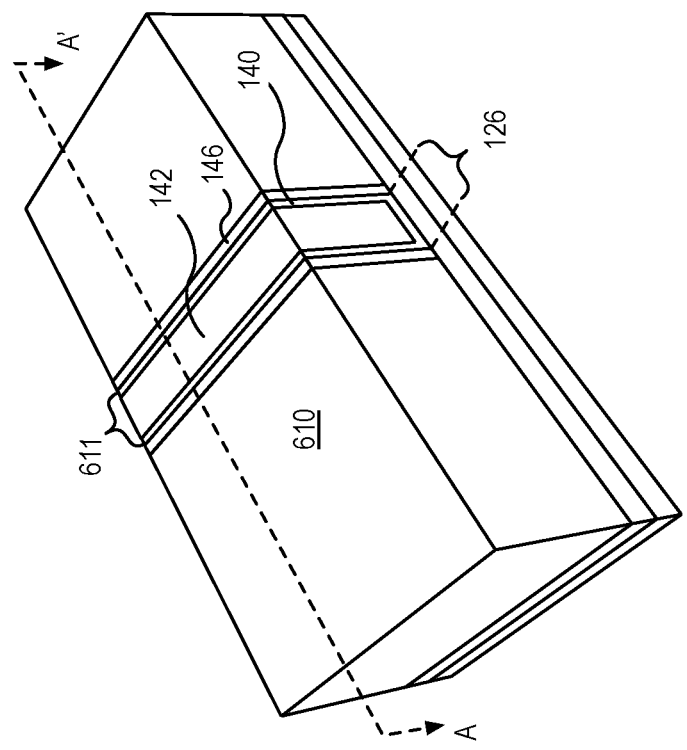

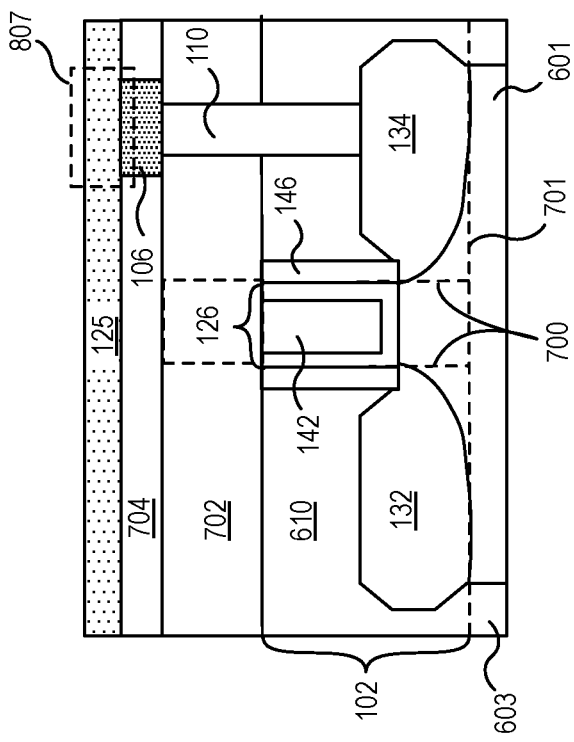
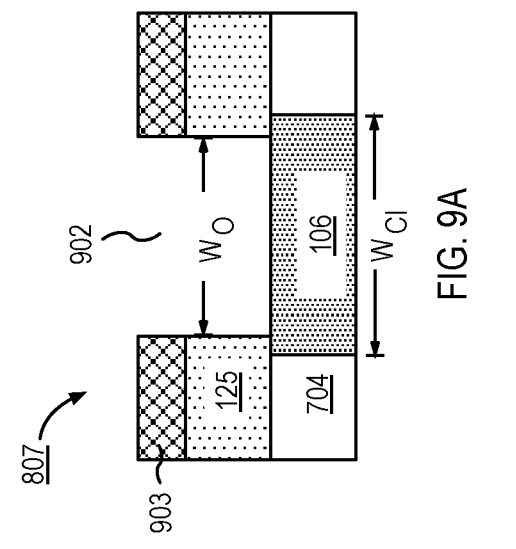
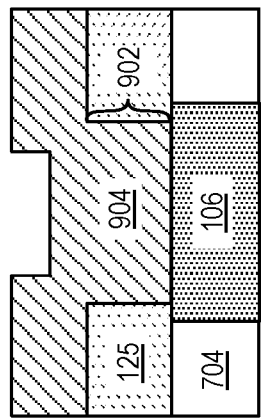
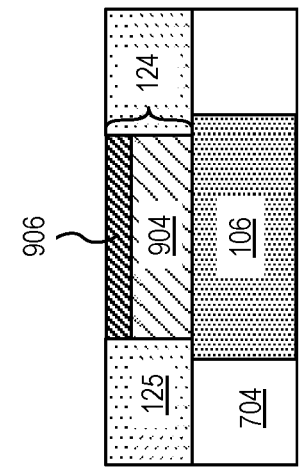
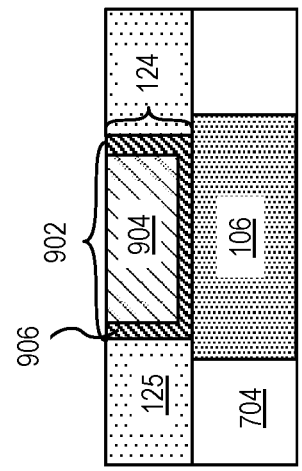
FIG. 8
FIG. 9A
FIG. 9B
FIG. 9C
FIG. 9D
FIG. 9E

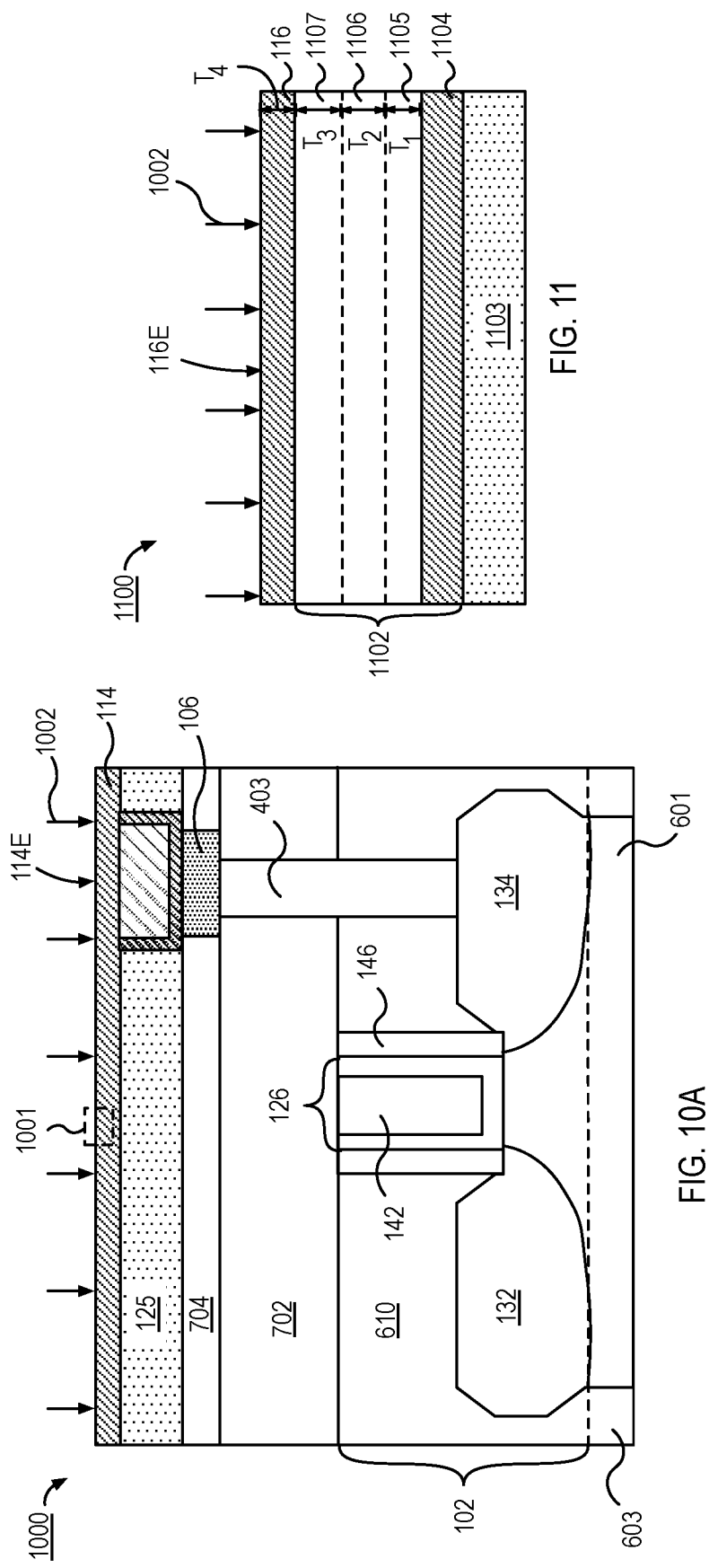
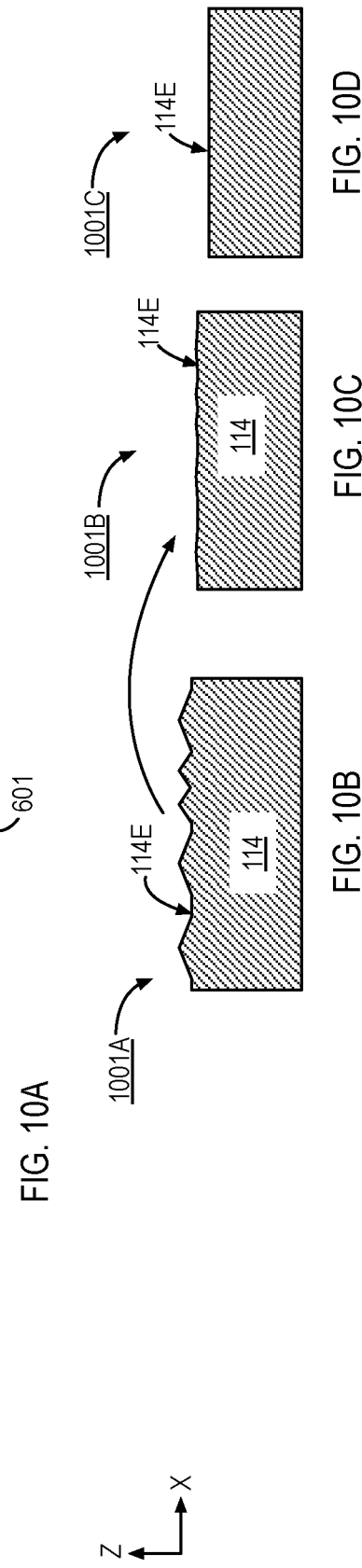
FIG. 10A
FIG. 10B
FIG. 10C
FIG. 10D
FIG. 11

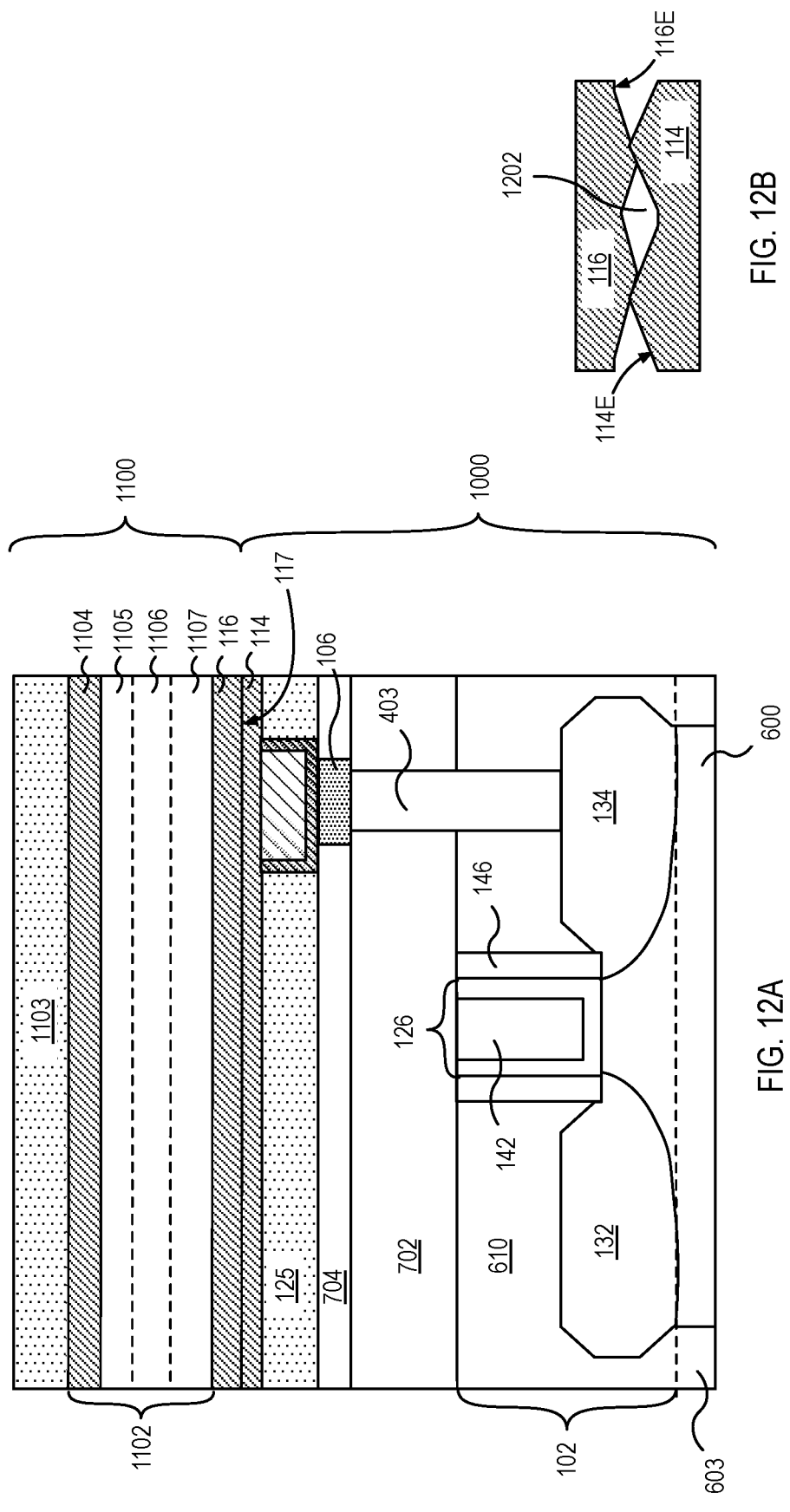

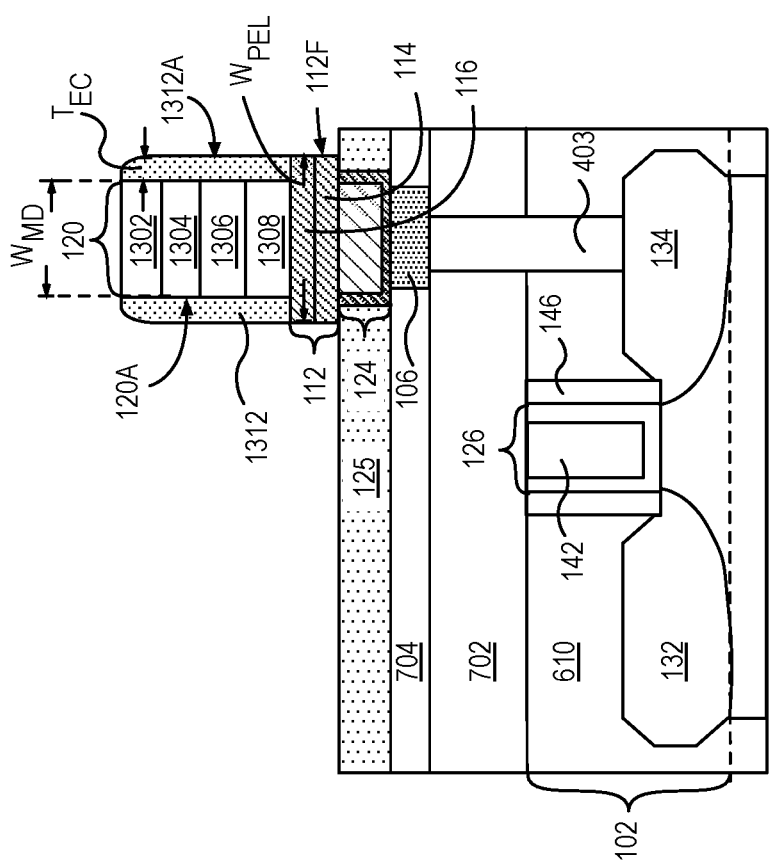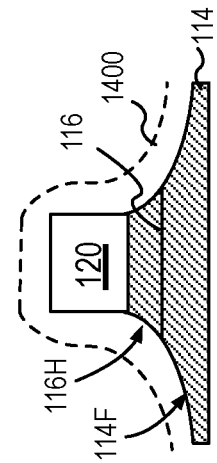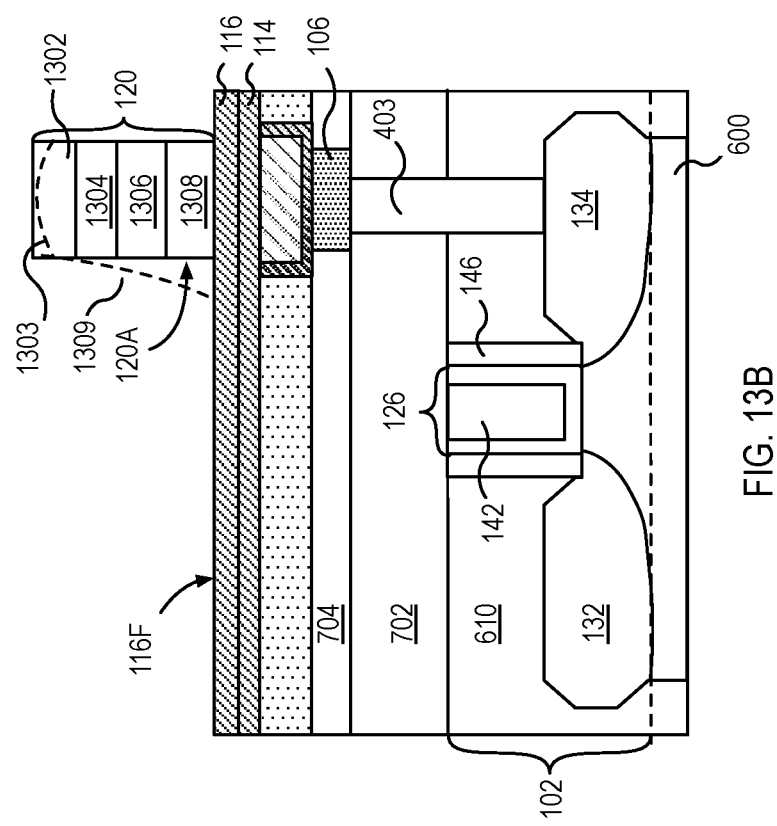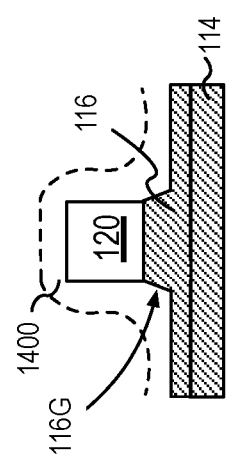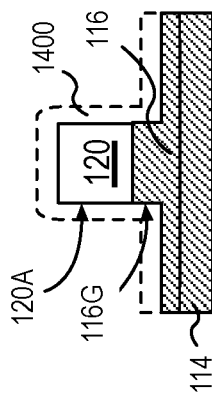

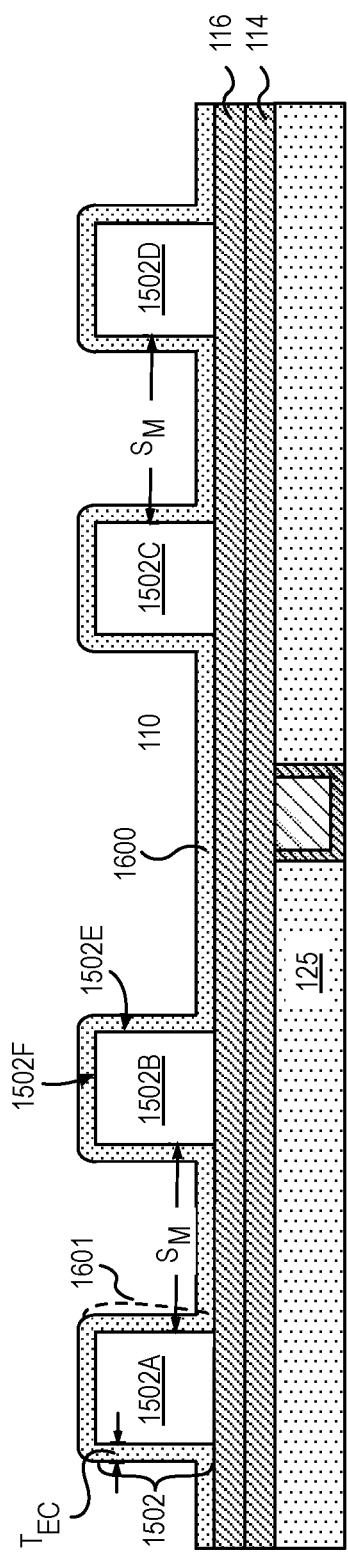
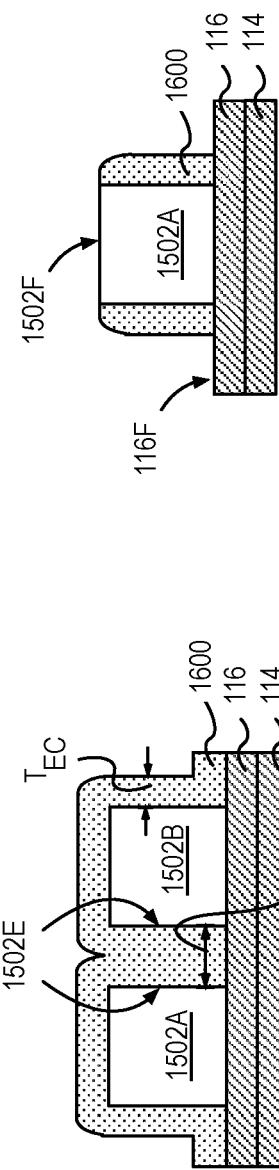
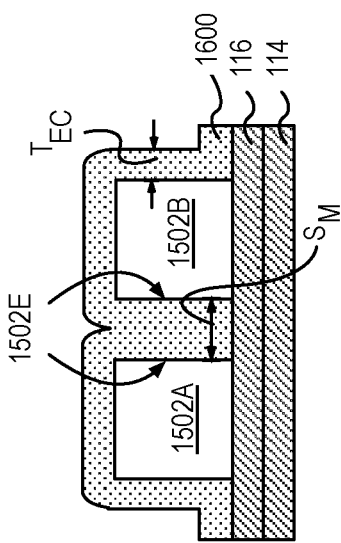
FIG. 16A
FIG. 16B
FIG. 16C

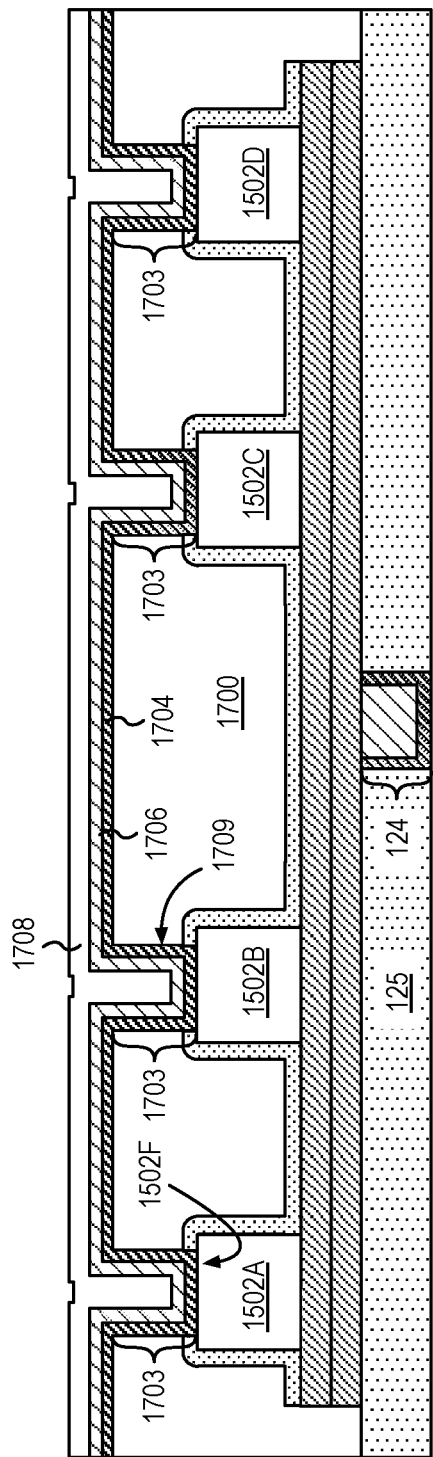
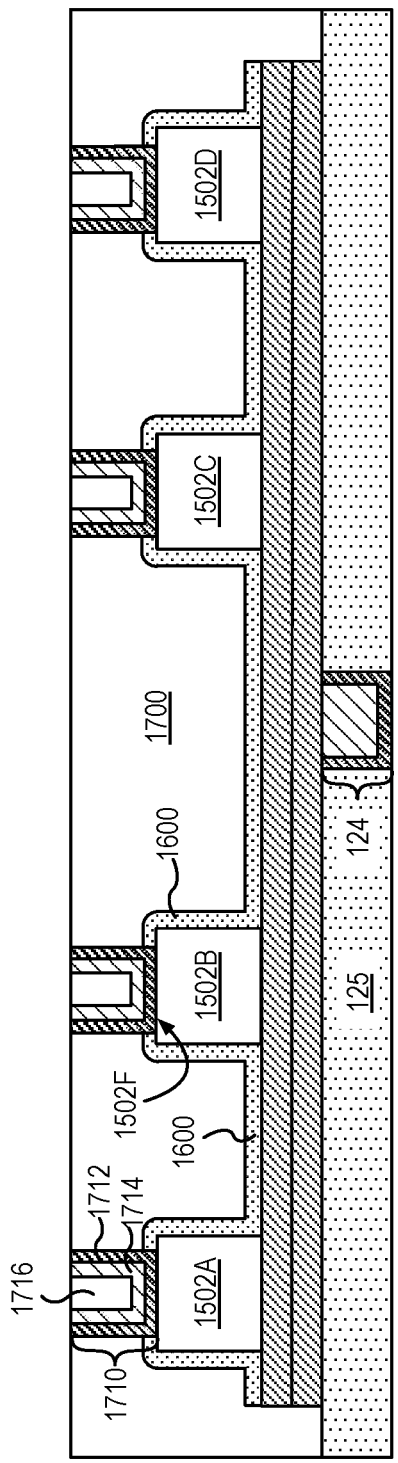
FIG. 17C
FIG. 17D

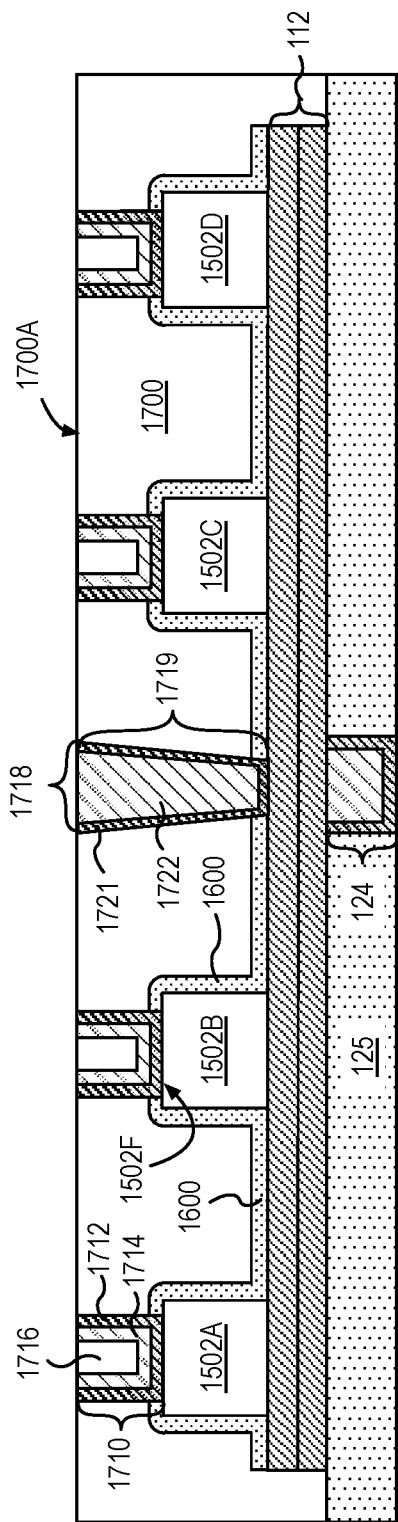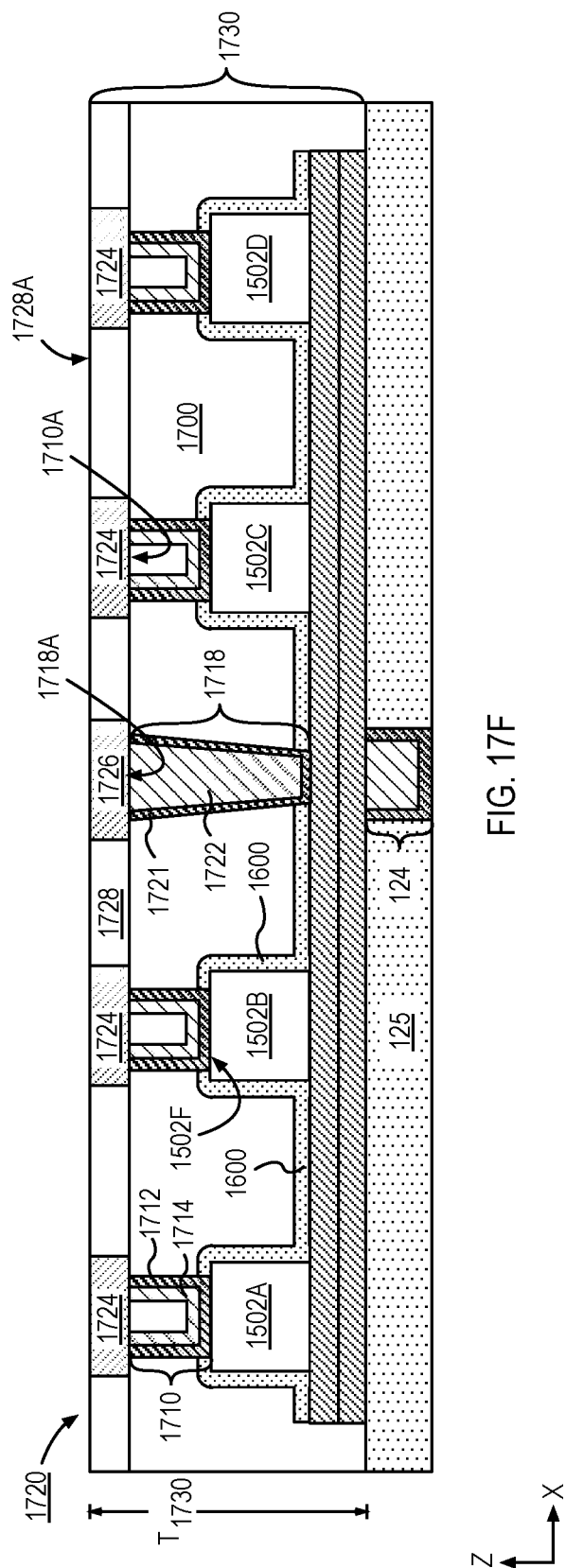
FIG. 17E
FIG. 17F

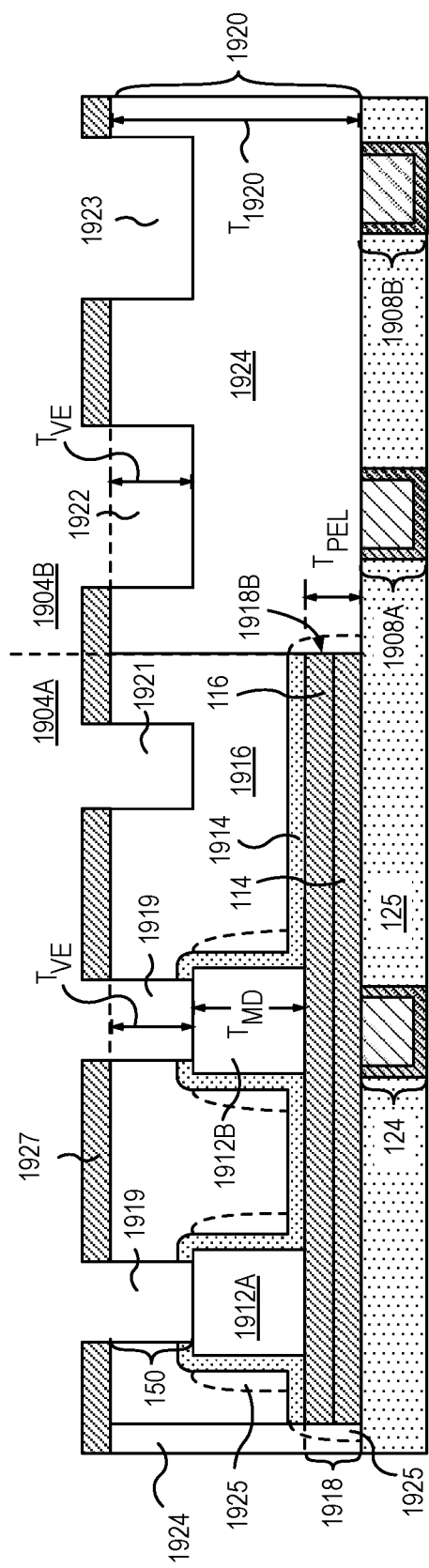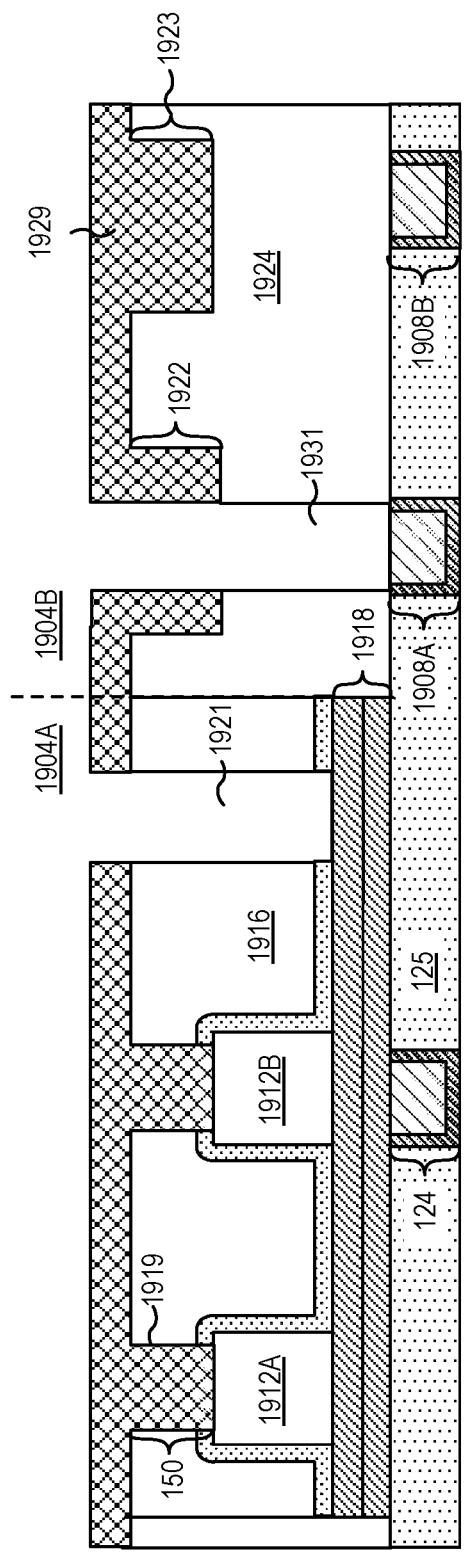
FIG. 19D
FIG. 19E

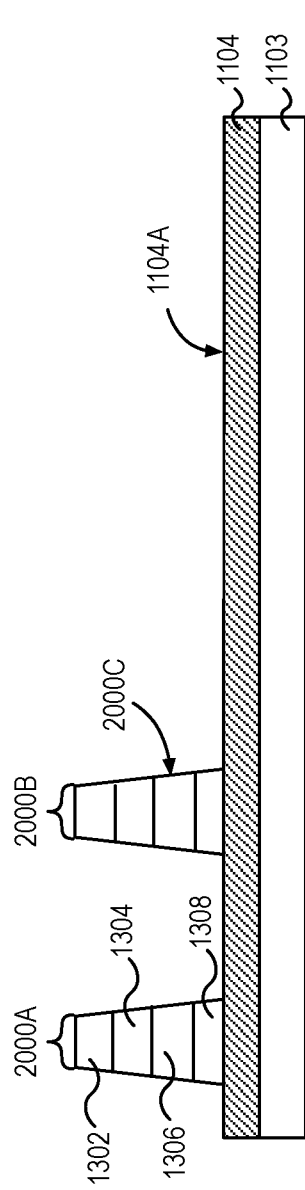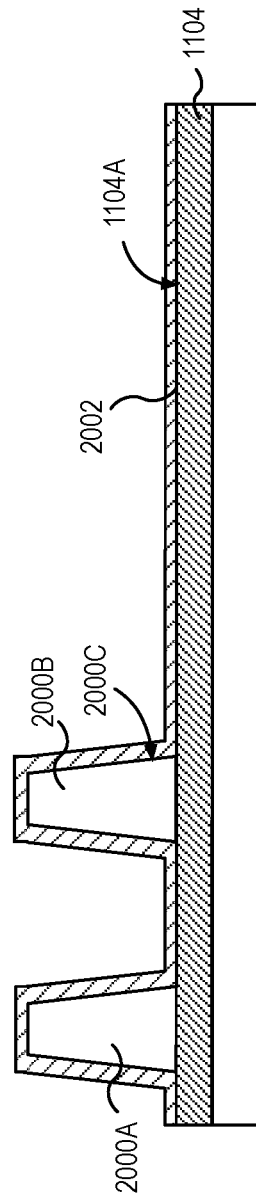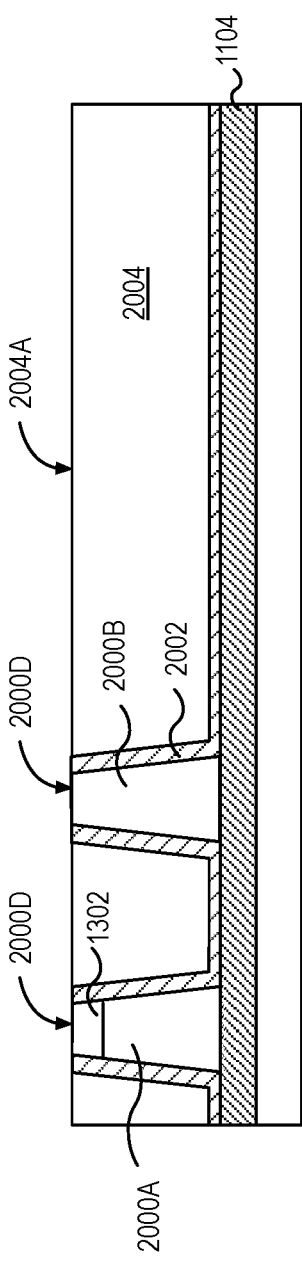

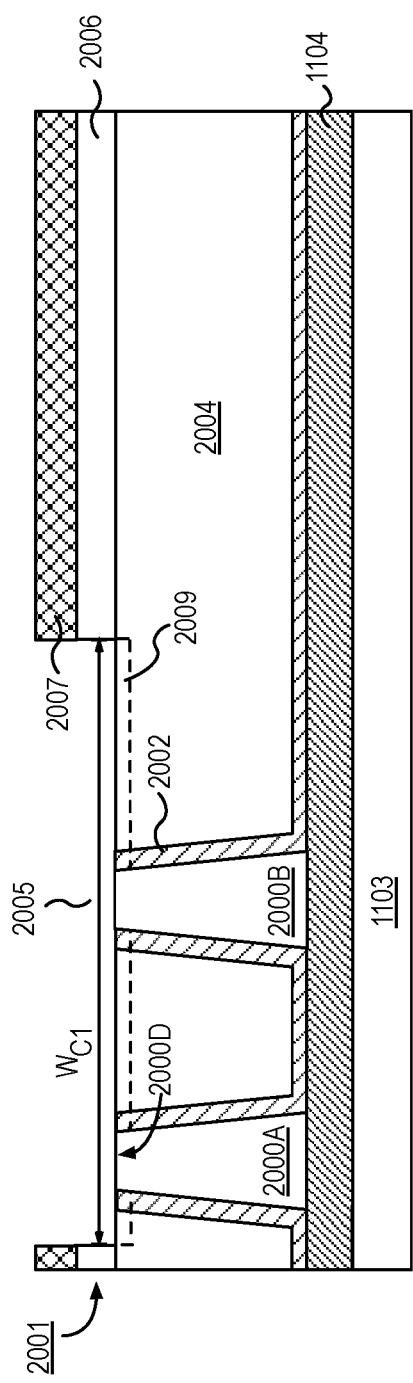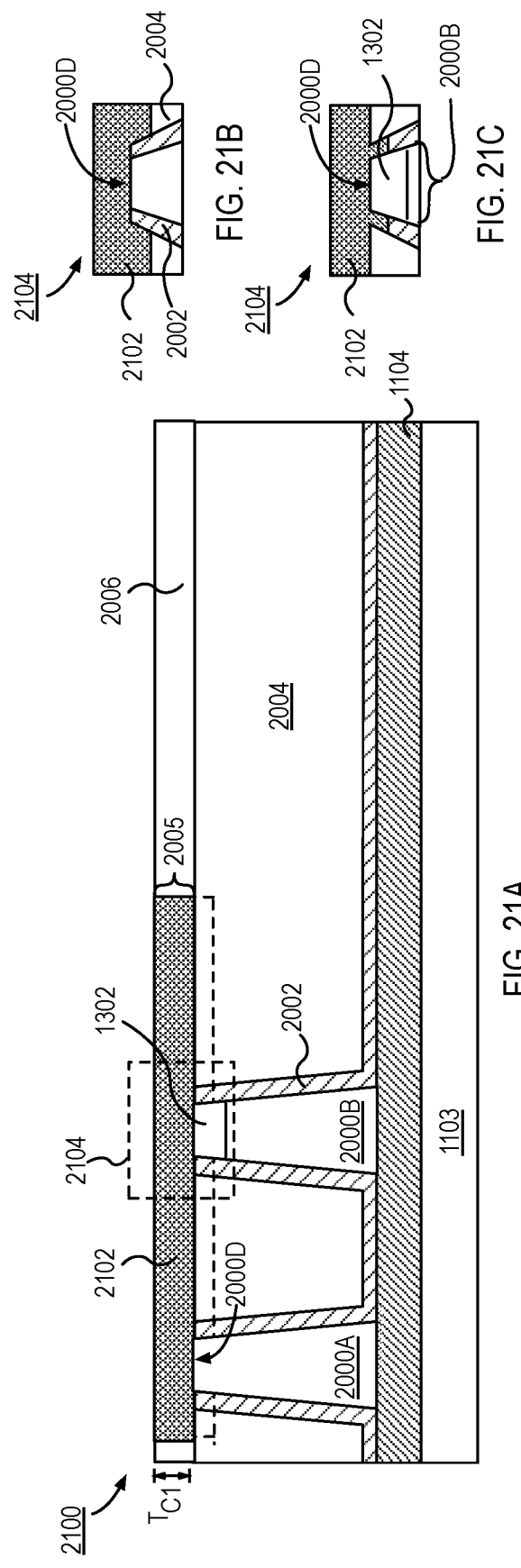
FIG. 20D
FIG. 21A
FIG. 21B
FIG. 21C

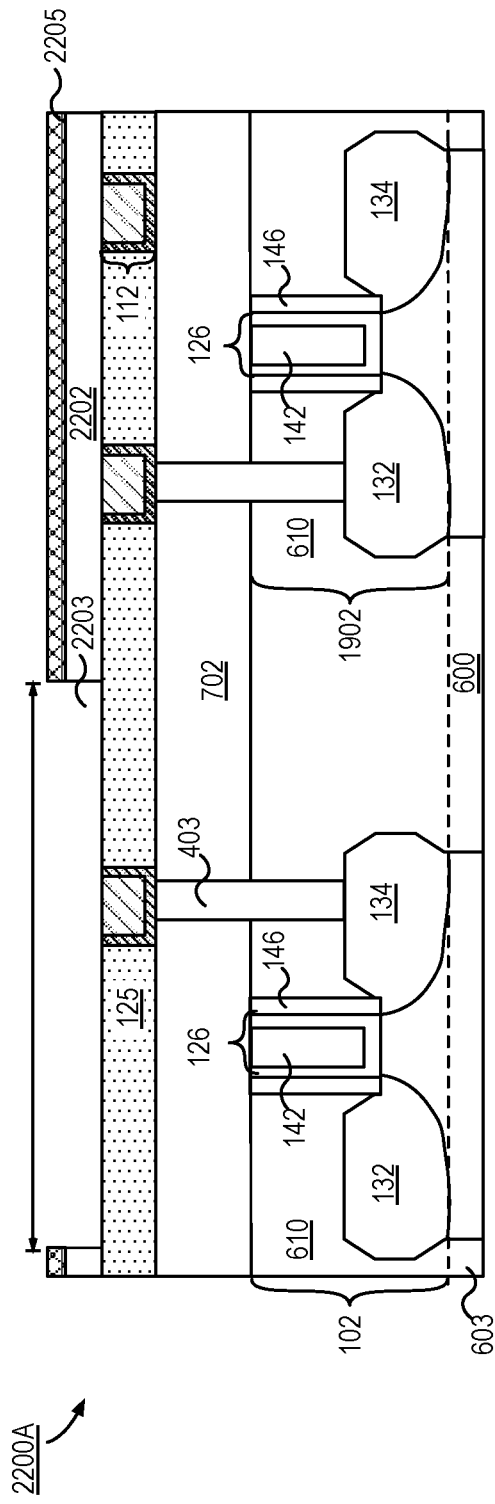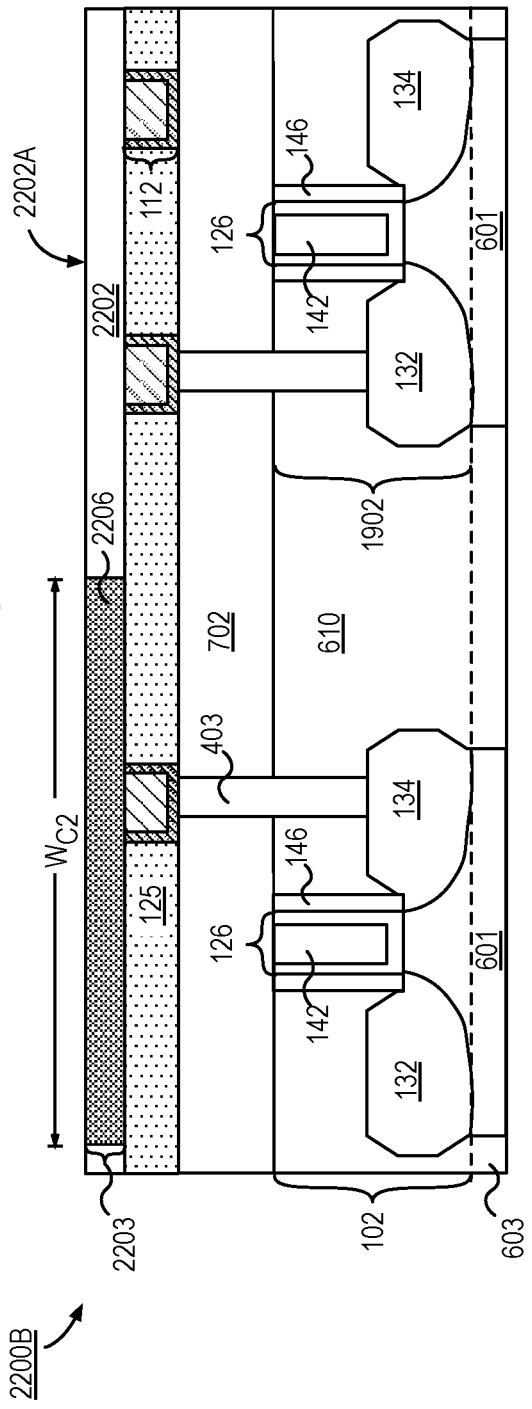
FIG. 22A
FIG. 22B

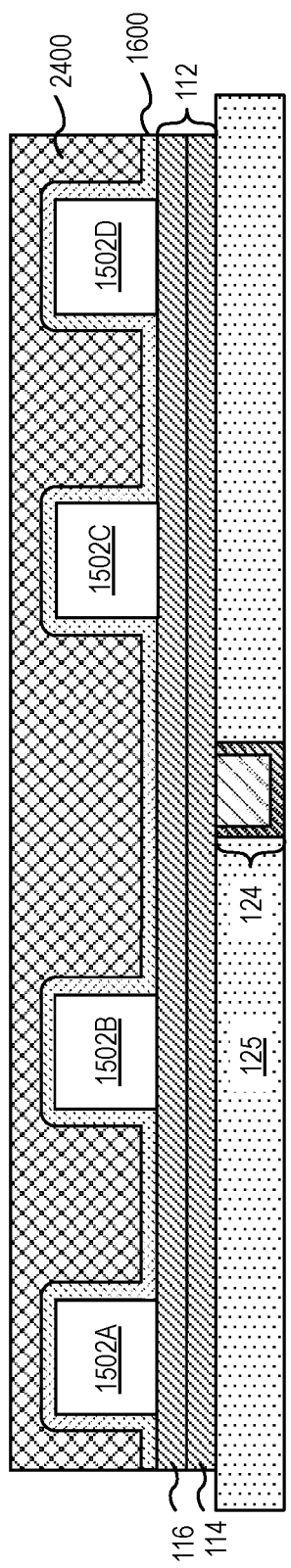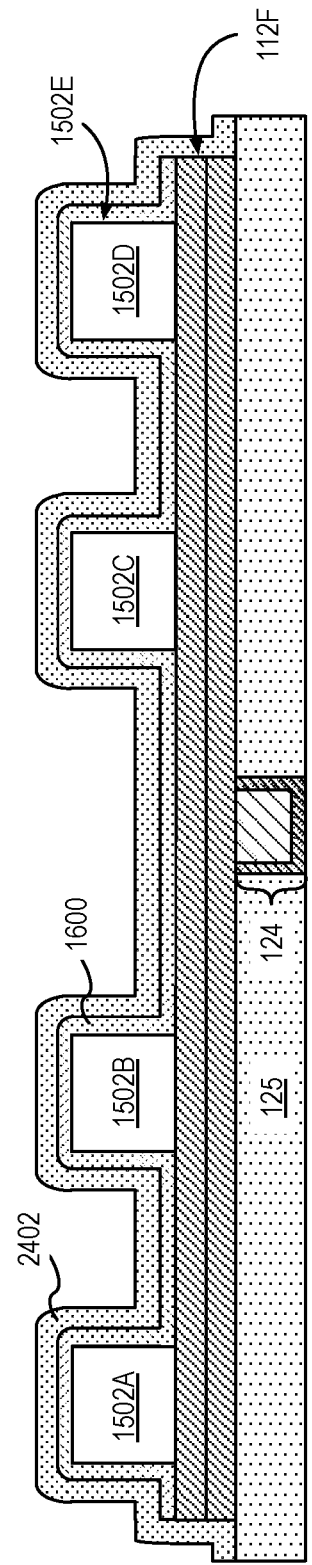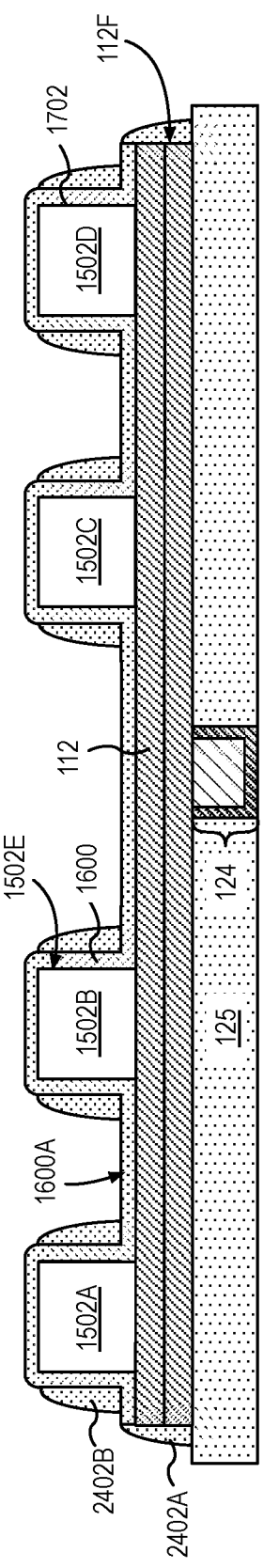
FIG. 24A
FIG. 24B
FIG. 24C

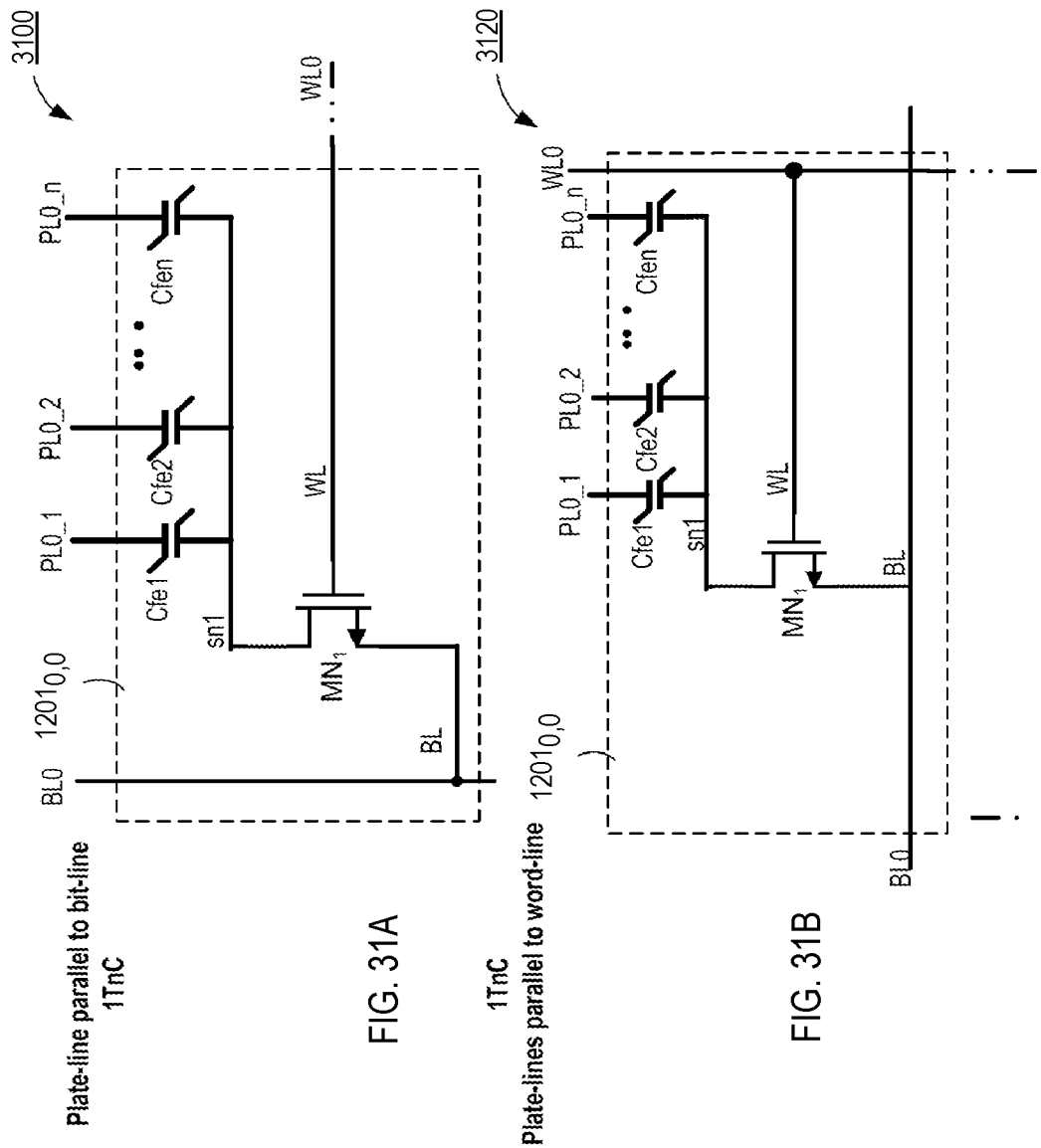

METHOD OF INTEGRATING A CAPACITOR INCLUDING A NON-LINEAR POLAR MATERIAL WITH A TRANSISTOR THROUGH WAFER BONDING

CLAIM FOR PRIORITY

This application is a continuation of, and claims the benefit of priority to U.S. patent application Ser. No. 18/167,816, filed on Feb. 10, 2023, and now issued as U.S. Pat. No. 11,765,908 on Sep. 19, 2023, titled "MEMORY DEVICE FABRICATION THROUGH WAFER BONDING," and which is incorporated by reference in its entirety.

BACKGROUND

Integration of capacitors including ferroelectric or paraelectric materials on a same substrate as logic devices can be challenging. As such, alternate methods to form structures that can couple capacitors with logic transistors are desirable to increase charge storage and facilitate operation of memory and logic devices based on capacitors.

BRIEF DESCRIPTION OF DRAWINGS

Material described herein is illustrated by way of example and not by way of limitation in accompanying figures. For simplicity and clarity of illustration, elements illustrated in figures are not necessarily drawn to scale. For example, dimensions of some elements may be exaggerated relative to other elements for clarity. Also, various physical features may be represented in their simplified "ideal" forms and geometries for clarity of discussion, but it is nevertheless to be understood that practical implementations may approximate illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among figures to indicate corresponding or analogous elements.

FIG. 1B is an enhanced cross-sectional illustration of a portion of a pair of conductive layers directly under memory device in FIG. 1A, in at least one embodiment.

FIG. 1C is an enhanced cross-sectional illustration of a portion of a pair of conductive layers, in at least one embodiment.

FIG. 2A is an enhanced cross-sectional illustration of a portion of a pair of conductive layers in FIG. 1A, where individual conductive layers comprise two different grain structures, in at least one embodiment.

FIG. 2B is an enhanced cross-sectional illustration of a portion of structure in FIG. 2A, where an interface between individual conductive layers comprises a non-contiguous layer comprising oxygen, in at least one embodiment.

FIG. 2C is an enhanced cross-sectional illustration of a portion of a pair of conductive layers in FIG. 1A, where individual conductive layers comprise polycrystalline grain structure, in at least one embodiment.

FIG. 6A illustrates a cross-section of a fin structure formed on a substrate, in at least one embodiment.

FIG. 6B is an isometric illustration of structure in FIG. 6A following process to form a dielectric adjacent to a portion of fin structure, in at least one embodiment.

FIG. 6C is an isometric illustration of structure in FIG. 6B following formation of a dummy gate on fin, in at least one embodiment.

FIG. 6F illustrates a cross-section of structure in FIG. 6E following process to form a gate structure in gate opening, in at least one embodiment.

FIG. 7A illustrates a cross-section of structure in FIG. 6F through a line A-A' following process to form a via electrode on a drain structure, in at least one embodiment.

FIG. 7B illustrates a cross-section of structure in FIG. 7A, following process to form a conductive interconnect coupled with transistor, in at least one embodiment.

FIG. 8 illustrates a cross-section of structure in FIG. 7B following process to deposit an etch stop layer to form an electrode structure, in at least one embodiment.

FIG. 9A is an enhanced cross-sectional illustration of a portion of structure in FIG. 8 following process to etch an opening in etch stop layer, in at least one embodiment.

FIG. 9B illustrates a cross-section of structure in FIG. 9A following process to deposit a conductive fill material within opening, in at least one embodiment.

FIG. 9C illustrates a cross-section of structure in FIG. 9B following process to planarize and recess conductive fill material within opening, in at least one embodiment.

FIG. 9D illustrates a cross-section of structure in FIG. 9C following process to form a conductive hydrogen barrier on conductive fill material, in at least one embodiment.

FIG. 9E illustrates a cross-section of structure in FIG. 9A following process to form an electrode structure where a conductive hydrogen barrier laterally surrounds a conductive fill material, in at least one embodiment.

FIG. 10A illustrates a cross-section of structure in FIG. 9A following process to deposit a first conductive layer on electrode structure and prepare materials for bonding, in at least one embodiment.

FIG. 10B is an enhanced cross-sectional illustration of a portion structure in FIG. 10A, illustrating an upper most surface of first conductive layer, in at least one embodiment.

FIG. 10C illustrates a cross-section of structure in FIG. 10B following process to planarize upper most surface of first conductive layer, in at least one embodiment.

FIG. 10D illustrates a cross-section of structure in FIG. 10B following process to planarize upper most surface of first conductive layer, in at least one embodiment.

FIG. 11 illustrates a cross-section of a multi-layer stack formed on a second substrate, followed by formation of a second conductive layer on multi-layer stack and followed by a process to treat an upper most surface of second conductive layer, in at least one embodiment.

FIG. 12A illustrates a cross-section of structures in FIG. 10A and FIG. 11 following process to bond first conductive layer and second conductive layer and remove one or more upper sacrificial layers including second substrate, in at least one embodiment.

FIG. 12B is an enhanced cross-sectional illustration of structure in FIG. 12A, in at least one embodiment.

FIG. 13B illustrates a cross-section of structure in FIG. 13A, following process to etch multi-layer stack and form a memory device, in at least one embodiment.

FIG. 13C illustrates a cross-section of structure in FIG. 13B, following formation of a spacer adjacent to memory device and following process to pattern first conductive layer and second conductive layer to form a plate electrode, in at least one embodiment.

FIG. 14A illustrates a cross-section of a portion of structure in FIG. 13B, depicting etching of first conductive layer during a process to etch and form memory device, in at least one embodiment.

FIG. 14B illustrates a cross-section of a portion of structure in FIG. 13B, depicting etching of first conductive layer during process to etch and form memory device, in at least one embodiment.

FIG. 14C illustrates a cross-section of a portion of structure in FIG. 13B, depicting etching of first conductive layer and second conductive layer during process to etch and form memory device, in at least one embodiment.

FIG. 16A illustrates a cross-section of structure in FIG. 15B following process to form encapsulation layer on memory devices, in at least one embodiment.

FIG. 16B illustrates a cross-section of structure in FIG. 16A, depicting merging of encapsulation layer between two adjacent memory devices, in at least one embodiment.

FIG. 16C illustrates a cross-section of structure in FIG. 16A following process to etch encapsulation layer to form a spacer, in at least one embodiment.

FIG. 17C illustrates a cross-section of structure in FIG. 17B, following process to deposit one or more materials in plurality of openings, in at least one embodiment.

FIG. 17D illustrates a cross-section of structure in FIG. 17C, following process to planarize to form via electrodes, in at least one embodiment.

FIG. 17E illustrates a cross-section of structure in FIG. 17D, following process to planarize to form a signal electrode, in at least one embodiment.

FIG. 17F illustrates a cross-section of structure in FIG. 17E, following process to form conductive interconnects to couple with via electrodes and signal electrode, in at least one embodiment.

FIG. 19D illustrates a cross-section of structure in FIG. 19C following formation of via openings in memory region and hanging trench openings in non-memory region, in at least one embodiment.

FIG. 19E illustrates a cross-section of structure in FIG. 19D following process to form extend via openings in memory region and form one or more via openings in non-memory region, in at least one embodiment.

FIG. 20A illustrates a cross-section of structure in FIG. 11 following process to pattern multi-layer stack to form memory devices, in at least one embodiment.

FIG. 20B illustrates a cross-section of structure in FIG. 20A following formation of an encapsulation layer on memory devices, in at least one embodiment.

FIG. 20C illustrates a cross-section of structure in FIG. 20B following process to deposit a dielectric on encapsulation layer and following a process to planarize dielectric, in at least one embodiment.

FIG. 20D illustrates a cross-section of structure in FIG. 20C following process to form an opening in dielectric above memory devices, in at least one embodiment.

FIG. 21A illustrates a cross-section of structure in FIG. 20D following process to form a conductive plate that is coupled with a first terminal of individual memory devices, in at least one embodiment.

FIG. 21B is an enhanced cross-sectional illustration of portion of structure in FIG. 21A, where dielectric is recessed compared to an uppermost surface of memory device, in at least one embodiment.

FIG. 21C is an enhanced cross-sectional illustration of portion of structure in FIG. 21A, where encapsulation layer is recessed compared to an uppermost surface of memory device, in at least one embodiment.

FIG. 22A illustrates a cross-section of wafer comprising an opening formed in a dielectric that is formed above a first transistor, in at least one embodiment.

FIG. 22B illustrates a cross-section of structure in FIG. 22A following formation of a conductive plate in opening, in at least one embodiment.

FIG. 24A illustrates a cross-section of structure in FIG. 16A following process to form a mask on encapsulation layer and etch encapsulation layer and conductive layers below encapsulation layer to form a plate electrode, in at least one embodiment.

FIG. 24B illustrates a cross-section of structure in FIG. 24A following process to form a second encapsulation layer.

FIG. 24C illustrates a cross-section of structure in FIG. 24B following process to etch second encapsulation layer to form a spacer adjacent to sidewalls of plate electrode.

FIG. 31A illustrates a 1TnC bit-cell comprising non-linear polar material for its capacitors, where plate-lines are parallel to bit-line, in accordance with at least one embodiment.

FIG. 31B illustrates a 1TnC bit-cell comprising non-linear polar material for its capacitors, where plate-lines are parallel to word-line, in accordance with at least one embodiment.

DETAILED DESCRIPTION

Figure 1A:
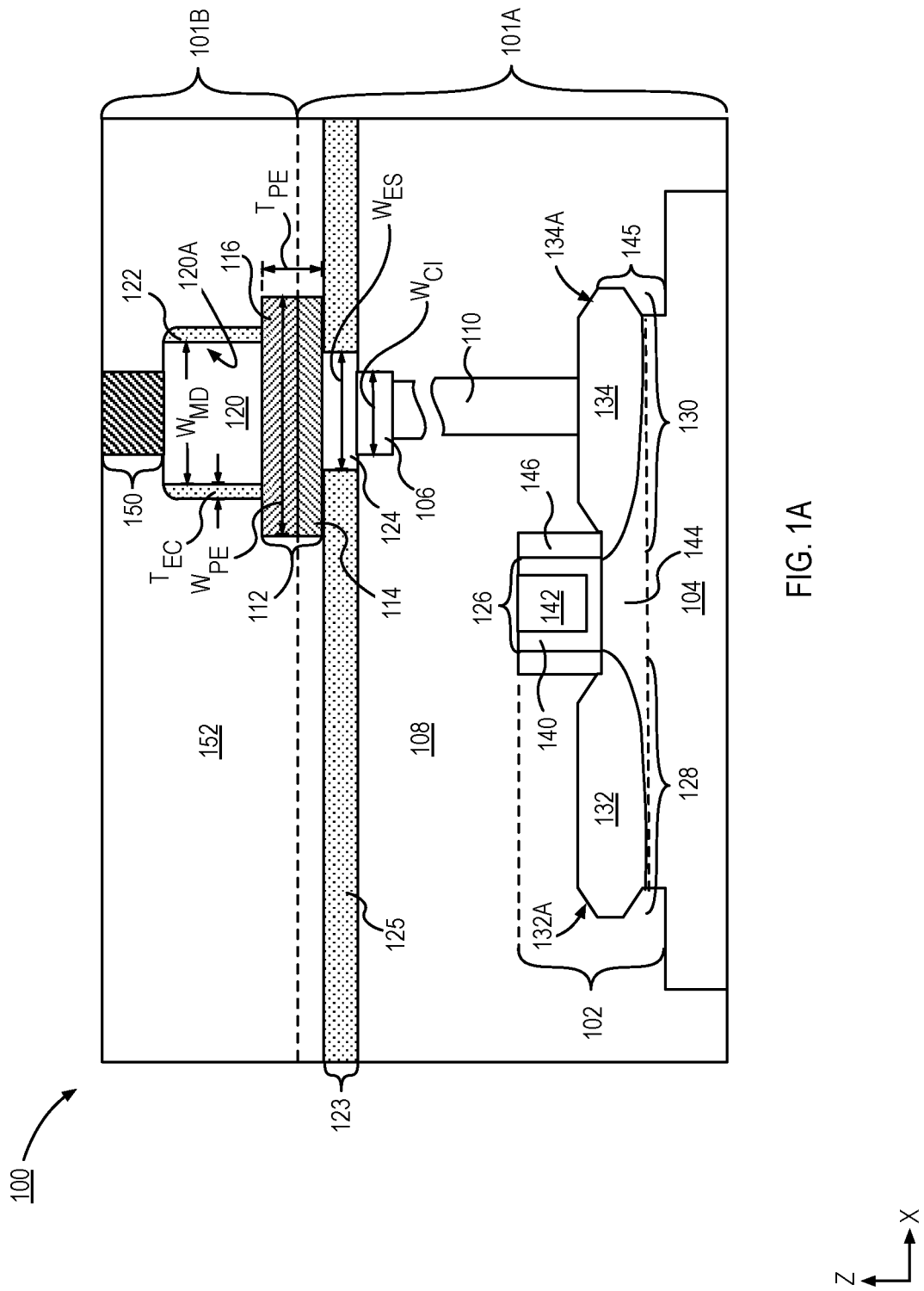
FIG. 1A illustrates a cross-section of a device structure including a memory device of a first substrate coupled with a transistor of a second substrate, in at least one embodiment.

At least one embodiment describes capacitors integrated with transistors. While at least one embodiment is described with reference to FeRAM or paraelectric RAM, capacitive structures formed herein can be used for any application where a capacitor is desired. In at least one embodiment, capacitive structure can be used for fabricating ferroelectric based or paraelectric based majority gate, minority gate, and/or threshold gate. Here, numerous specific details are set forth, such as structural schemes and detailed fabrication methods to provide a thorough understanding of embodiments of present disclosure. It will be apparent to one skilled in art that embodiments of present disclosure may be practiced without these specific details. In other instances, well-known features, such as process equipment and device operations, are described in lesser detail to not unnecessarily obscure embodiments of present disclosure. Furthermore, it is to be understood that embodiments shown in Figures are illustrative representations and are not necessarily drawn to scale.

In some instances, well-known methods and devices are shown in block diagram form, rather than in detail, to avoid obscuring at least one embodiment. Reference throughout this specification to "an embodiment," "one embodiment," "in at least one embodiment," or "some embodiments" means that a particular feature, structure, function, or characteristic described in connection with embodiment is included in at least one embodiment. Thus, appearances of phrase "in an embodiment," "in at least one embodiment," or "in one embodiment" or "some embodiments" in various places throughout this specification are not necessarily referring to same embodiment of disclosure. Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

As used in herein, singular forms "a", "an" and "the" are intended to include plural forms as well, unless context clearly indicates otherwise. It will also be understood that term "and/or" as used herein refers to and encompasses all possible combinations of one or more of associated listed items.

Here, "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that two or more elements co-operate or interact with each other (e.g., as in a cause and effect relationship).

Here, "over," "under," "between," and "on" as used herein refer to a relative position of one component or material with respect to other components or materials where such physical relationships are noteworthy. For example, in context of materials, one material or material disposed over or under another may be directly in contact or may have one or more intervening materials. Moreover, one material disposed between two materials may be directly in contact with two layers or may have one or more intervening layers. In contrast, a first material "on" a second material is in direct contact with that second material/material. Similar distinctions are to be made in context of component assemblies. As used throughout this description, and in claims, a list of items joined by term "at least one of" or "one or more of" can mean any combination of listed terms.

Here, "adjacent" here generally refers to a position of a thing being next to (e.g., immediately next to or close to with one or more things between them) or adjoining another thing (e.g., abutting it).

Here, "signal" may refer to current signal, voltage signal, magnetic signal, or data/clock signal.

Here, "device" may generally refer to an apparatus according to context of usage of that term. For example, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of device may also be plane of an apparatus which comprises device.

Unless otherwise specified in explicit context of their use, terms "substantially equal," "about equal" and "approximately equal" mean that there is no more than incidental variation between two things so described. Such variation is typically no more than +/−10% of a predetermined target value.

Here, "left," "right," "front," "back," "top," "bottom," "over," "under," and similar terms are used for descriptive purposes and not necessarily for describing permanent relative positions. For example, terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within context of a device z-axis and therefore may be relative to an orientation of a device. Hence, a first material "over" a second material in context of a figure provided herein may also be "under" second material if device is oriented upside-down relative to context of figure provided. Similar distinctions are to be made in context of component assemblies.

Here, "between" may be employed in context of z-axis, x-axis or y-axis of a device. A material that is between two other materials may be in contact with one or both of those materials. In another example, a material that is between two or other material may be separated from both of other two materials by one or more intervening materials. A material "between" two other materials may therefore be in contact with either of other two materials. In another example, a material "between" two other materials may be coupled to other two materials through an intervening material. A device that is between two other devices may be directly connected to one or both of those devices. In another example, a device that is between two other devices may be separated from both of other two devices by one or more intervening devices.

Capacitors with a wide variety of materials have been implemented for memory (random-access memory or RAM) applications. Perovskite materials have been implemented in capacitors for high density FeRAM applications owing to their low power consumption and high on/off ratio. Perovskite FeRAM devices (herein FeRAM devices) may be useful over other forms of memory, such as magnetic tunnel junction (MTJ)-based devices, due to relatively low number of layers within a FeRAM device compared to MTJ-based devices. A typical FeRAM device may be fully operational with three layers, where a ferroelectric dielectric is contained between two electrode layers. Electrode layers may also include Perovskite materials to enable lattice matching and reduction in electrical resistance. Introduction of lead-free Perovskite materials may offer additional environmental benefits without sacrificing device performance.

In at least one embodiment, deposition process utilized to form a multi-layer stack for fabricating capacitors can utilize high temperatures to achieve desired crystallinity. In at least one embodiment, temperatures greater than 600 degrees Celsius can be considered high. In at least one embodiment, where capacitors are integrated with transistors, capacitors can be formed after fabrication of transistors, and at a level above transistors. In at least one embodiment, temperatures utilized to deposit multi-layer stack is greater than temperature tolerances for fabrication of transistors. In at least one embodiment, a post stack deposition anneal may be performed to obtain crystallinity of one or more layers that is beneficial to device operation. In at least one embodiment, annealing temperatures can exceed 1100 degrees.

In at least one such embodiment, transistors can suffer from thermal degradation if a multi-layer stack is deposited above transistor on same substrate. In at least one embodiment, high temperatures may be utilized for deposition and annealing multi-layer stack, without affecting transistors. In at least one such embodiment, multi-layer stack may be formed on a first substrate and transistor may be formed on a second substrate.

In at least one embodiment, first and second substrates may be bonded together, and multi-layer stack may be patterned to form memory devices. In at least one embodiment, to provide electrical conductivity between memory device and transistors, upper most layers of first and second substrates may include a highly conductive material. In at least one embodiment, uppermost layers of two substrates come in contact with each other during bonding process. In at least one embodiment, metallic materials are bonded together, and metallic materials can be etched selectively in vicinity of memory devices. In at least one embodiment, metallic materials on first and second substrates may be same or substantially same or be completely different. In at least one embodiment, different metallic materials can be bonded together as long as metallic bonding can be utilized. In at least one embodiment, metallic materials can include a same material having two different crystal or grain structures.

In at least one embodiment, patterning multi-layer stack to fabricate memory devices can roughen and damage sidewalls of memory devices causing charge leakage and memory loss during operation. In at least one embodiment, annealing memory devices can be useful. In at least one embodiment, annealing temperatures can exceed 1100 degrees Celsius depending on materials within multi-layer stack and annealing methods utilized. In at least one such embodiment, multi-layer stack can be patterned into memory devices prior to bonding with second substrate to avoid subjecting transistor to temperatures above approximately 600 degrees Celsius. In at least one embodiment, when memory devices on a first substrate are bonded to one or more transistors on a second substrate, bonding can constitute hybrid bonding where more than two different layers are bonded together. In at least one embodiment, patterning of memory devices prior to bonding can be useful because thickness of an insulator layer under multi-layer stack can be arbitrary and provide over etch margin. In at least one embodiment, portions or all of insulator layer can be removed after bonding process.

Capacitors may be integrated with transistors in a first region of a substrate. In some examples, first region may be a memory region and a second region may be a logic region. In at least one embodiment, capacitors can be ferroelectric capacitors formed, in a memory level, above one or more transistors, in a transistor level, within memory region. In at least one embodiment, there can be one or more layers of conductive interconnects between ferroelectric capacitors (herein ferroelectric devices) and one or more transistors.

To facilitate individual programing of memory devices while connecting to a single transistor, an architecture such as cross point memory has been used elsewhere. In at least one embodiment, cell size in cross point memory is dependent on size of transistors and increase in device density can drive shrinking of transistor size. In at least one embodiment, it is useful to simultaneously couple multiple memory devices in a memory level with a single transistor directly below. In at least one embodiment, coupling two or more memory devices on a single plane with a single transistor below can present challenges. In at least one embodiment, immediate vicinity of transistor is often replete with interconnect circuitry comprising intersecting lines that present tight spaces to route multiple lines to individual memory devices above.

In at least one embodiment, challenge of tight spaces may be overcome by implementing a device structure where two or more memory device are coupled by a plate electrode. In at least one embodiment, two or more memory devices may be coupled through plate electrode to at least a single routing connection to transistor below. In at least one embodiment, fabricating plate electrode at a level directly below two or more memory devices may offer additional flexibility. In at least one embodiment, shape and size of plate electrode can be determined just before or after fabricating memory devices. In at least one embodiment, shape and size of plate electrode can also be adjusted by number of memory devices to be coupled and an arrangement of capacitors. In at least one embodiment, a single electrode structure can be positioned between plate electrode and metal line. In at least one embodiment, multiple electrode structures can be positioned between plate electrode and metal line to reduce resistance, as long as electrode structures do not intersect with neighboring metal lines. In at least one embodiment, to increase total number of programmable capacitors, device structure can further include multiple levels, where each level includes a plate electrode and a plurality of memory devices. In at least one embodiment, to route signal from plate electrodes on different levels, device structure may further include signal electrodes that are placed in electrical contact and vertically between plate electrodes that are on two different levels. Placement of signal electrodes may be determined by spatial and electrical considerations.

In at least one embodiment, a first multi-layer stack can be deposited on a first substrate, and a second multi-layer stack can be deposited on a second substrate. In at least one embodiment, first substrate can be bonded with a third substrate including transistors, and first multi-layer stack can be patterned into a first layer comprising one or more memory devices. In at least one embodiment, second substrate can be bonded to first layer comprising one or more memory devices and patterned into a second layer comprising one or more memory devices to form stacked memory devices.

In at least one embodiment, a single transistor may be coupled with plate electrode. In at least one embodiment, two transistors can be simultaneously coupled to plate electrode. In at least one embodiment, plate electrode may extend over both transistors. In at least one such embodiment, a gate contact of one transistor may be coupled with a drain contact of another transistor, where gate and drain contacts are physically connected by a bridge structure. In at least one embodiment, transistors may be in close proximity, such as side by side and on same horizontal plane to minimize electrical resistance. In at least one embodiment, two transistors can be coupled to as many as 128 capacitors. In at least one embodiment, fewer or more capacitors can be coupled to two transistors than 128 capacitors.

In at least one embodiment, to enable high density FeRAM devices, non-lead-based perovskite materials can be utilized, which are environmentally friendly for mass production. In at least one embodiment, a stack for ferroelectric capacitors can include one or more hardmask materials. In at least one embodiment, one or more hardmask materials can include dielectric materials, metallic materials, or a combination thereof. Implementation of an etch with high selectivity (such as a plasma etch process) between hardmask and device layers can be useful for patterning.

In at least one embodiment, FeRAM devices, including lead-free Perovskite materials, can be prone to damage from reaction with hydrogen during processing. Specifically, damage may be a result of hydrogen atoms traveling along grain boundaries between or along electrodes coupled with two terminals of a FeRAM device. In at least one embodiment, hydrogen can cause reduction when it reacts with one or more materials of FeRAM device, such as electrodes or ferroelectric material itself. In at least one embodiment, FeRAM devices can lose their polarization hysteresis characteristics as a result of hydrogen reduction. During fabrication, sources of hydrogen may arise from anneal operations carried out to eliminate dangling bonds and may be unavoidable.

In at least one embodiment, capacitor devices have a planar structure where individual layers are sequentially layered, one on top of another, and patterned into cylindrical (circular or elliptical) or rectangular shapes. In at least one embodiment, it is useful to protect capacitor sidewalls, top, and bottom surfaces from reacting with hydrogen. In at least one embodiment, solutions against hydrogen diffusion include forming an encapsulation layer that includes an insulating material, such as, silicon nitride, to protect capacitor sidewalls, and top surfaces. In at least one embodiment, encapsulation layer can provide protection against hydrogen and oxygen diffusion into capacitor. In at least one embodiment, contact or via electrode may be formed at a top of FeRAM device by piercing through insulating barrier layer and exposing one or more top electrode materials. In at least one embodiment, barrier layer itself may be further surrounded by additional insulating material such as an interlayer dielectric (ILD). ILD materials such as silicon oxide or silicon oxide doped with carbon in general may not act as a hydrogen diffusion barrier and are less useful when in contact with one or more layers of memory device.

In other examples, hydrogen may diffuse through one or more materials of contact electrode towards FeRAM device stack through a top electrode. To protect against hydrogen diffusion through a top surface of top electrode, noble metals have been implemented as part of contact electrode structure. In at least one embodiment, noble metals can have crystalline structures due to strong metallic bonding, and their amorphous phase is thermodynamically unstable favoring transformation into a crystalline phase.

In at least one embodiment, hydrogen can also diffuse from layers below a bottom electrode of ReRAM device. In at least one embodiment, bottom electrode is physically separated from an electrode structure by a plate electrode that includes metallic materials described above. In at least one embodiment, electrode structure may be laterally surrounded by an insulator layer that can act as a barrier against hydrogen diffusion. In at least one embodiment, plate electrode may be directly adjacent to an ILD. In at least one embodiment, an interface between plate electrode and bottom electrode can be a pathway for hydrogen diffusion.

To provide a barrier against hydrogen diffusion towards a memory device, an encapsulation layer can be implemented. In at least one embodiment, encapsulation layer may be formed on sidewalls of memory device and on surfaces of plate electrode. In at least one embodiment, additional encapsulation can be formed against sidewalls of plate electrode.

FIG. 1A illustrates a cross-section of a device 100, in at least one embodiment. In at least one embodiment, device 100 includes transistor 102 within a die 101A, and a conductive interconnect 106 within a dielectric 108. In at least one embodiment, conductive interconnect 106 is coupled with a terminal such as drain contact 110 of transistor 102. In at least one embodiment, device 100 further comprises plate electrode 112 coupled with transistor 102. In at least one embodiment, plate electrode 112 comprises at least a pair of conductive layers such as conductive layer 114 on conductive layer 116. In at least one embodiment, conductive layer 114 is part of die 101A, and conductive layer 116 is part of die 101B that is different from die 101A.

In at least one embodiment, plate electrode 112 further includes oxygen, and/or trace metallics at an interface 117 between conductive layer 114 and conductive layer 116. In at least one embodiment, device 100 further includes a planar capacitor or memory device 120 comprising a nonpolar material on at least a portion of conductive layer 116.

In at least one embodiment, conductive layer 114 comprises a refractory metal, a nitride of a refractory metal or a noble metal. In at least one embodiment, conductive layer 116 comprises a refractory metal, a nitride of a refractory metal or a noble metal. In at least one embodiment, conductive layer 114 and conductive layer 116 comprise different materials. In at least one embodiment, conductive layer 114 and conductive layer 116 comprise a same or substantially same material.

In at least one embodiment, conductive layer 114 comprises a first grain configuration and conductive layer 116 comprises a second grain configuration. In at least one embodiment, conductive layer 114 comprises a polycrystalline grain configuration with random orientation, or amorphous grains with columnar structure. In at least one embodiment, conductive layer 116 comprises a polycrystalline grain configuration with random orientation, or amorphous grains with columnar structure.

FIG. 1B is an enhanced cross-sectional illustration of a portion 112A of conductive layer 114 and conductive layer 116 in FIG. 1A, in at least one embodiment. In at least one embodiment, conductive layer 114 comprises a first grain configuration with grains 114A and conductive layer 116 comprises a second grain configuration with grains 116A, as shown. In at least one embodiment, grains 114A and grains 116A can be within 20% of each other in volume. In at least one such embodiment, conductive layer 114 comprises columnar grains and conductive layer 116 comprises columnar grains. In at least one embodiment, conductive layer 114 comprises grains 114A that are columnar and have a first average angle $theta_1$ with respect to a normal to surface 114B, and conductive layer 116 comprises grains 116A that are columnar and have a second average angle $theta_2$ with respect to a normal to surface 116B. In at least one embodiment, angle $theta_1$ and angle $theta_2$ are within 10% of each other. In at least one embodiment, angle $theta_1$ and angle $theta_2$ may be in range of 0 to 20 degrees. In at least one embodiment, grains 114A and grains 116A are misaligned, as shown.

In at least one embodiment, where conductive layer 114 and conductive layer 116 comprise a same material, angle $theta_1$ and angle $theta_2$ can be substantially different, as shown in cross-sectional illustration of plate electrode 112B in FIG. 1C. In at least one embodiment, conductive layer 114 and conductive layer 116 comprise TiN or TaN, where angle $theta_1$ is between 0 and 10 degree and angle $theta_2$ is at least 10 degrees.

In at least one embodiment, conductive layer 114 comprises columnar grains with nano-scaled voids 160 at grain boundaries 119. In at least one embodiment, conductive layer 116 comprises columnar grains with nano-scaled voids 161 at grain boundaries 119.

In at least one embodiment, conductive layer 114 comprises different zones across a thickness (for e.g., along z-direction), as shown in cross-sectional illustration of plate electrode 112C in FIG. 2A. In at least one embodiment, conductive layer 114 comprises grains 114C having a first density within zone 200 and grains 114D having a second density within zone 202, where zone 202 is directly adjacent to zone 200. In at least one embodiment, conductive layer 116 comprises grains 116C having a third density within zone 204 and grains 116D having a fourth density within zone 206, where zone 204 is directly adjacent to and above zone 206.

In at least one embodiment, conductive layer 114 and conductive layer 116 are substantially symmetrically positioned about interface 117. In at least one embodiment, zone 202 and zone 206 are directly adjacent to each other and both zones 202 and 206 are collectively between zone 200 and zone 204. In at least one embodiment, zones 200 and 204 represent uppermost and lowermost portions, respectively, of plate electrode 112. In at least one embodiment, interface 117 between zones 202 and 206 is substantially planar. In at least one embodiment, interface 117 can comprise micro voids (to be discussed further below). In at least one embodiment, presence of nano voids is indicative of process utilized to fabricate plate electrode 112.

In at least one embodiment, conductive layer 114 is amorphous and grains 114C and 114D can be both columnar. In at least one embodiment, grains 114D have a greater width than grains 114C. In at least one embodiment, columnar grains 114C are directed vertically away from surface 114B. In at least one embodiment, second density is less than first density, as shown.

In at least one embodiment, conductive layer 116 is amorphous and grains 116C and 116D can be both columnar. In at least one embodiment, grains 116D have a greater width than grains 116C. In at least one embodiment, columnar grains 116C are directed vertically away from surface 116B. In at least one embodiment, fourth density is less than third density, as shown.

In at least one embodiment, zones 200 and 206 include voids 212 at grain boundaries 119, and zones 202 and 204 include voids 214 at grain boundaries 119. In at least one embodiment, density and size of voids 214 is greater than density and size of voids 212.

In at least one embodiment, oxygen is present within a layer 208 at interface 117, as shown in enhanced cross-sectional illustration of portion 112D in FIG. 2B. In at least one embodiment, layer 208 is non-contiguous. In at least one embodiment, layer 208 is non-contiguous and can be insulative and in at least one embodiment, layer 208 can be conductive. In at least one embodiment, layer 208 can be located within a nanovoid within surfaces 114E and 116E, as will be discussed below. In at least one embodiment, presence of nano voids is indicative of process utilized to fabricate plate electrode 112. In at least one embodiment, presence of nano voids at interface 117 can be an artifact of structure of conductive layer 114 and conductive layer 116.

In at least one embodiment, conductive layer 114 and conductive layer 116 include grains 114D and 116D that are nanocrystalline or polycrystalline, as shown in enhanced cross-sectional illustration of portion 112E in FIG. 2C. In at least one embodiment, grains 114D and 116D that are nanocrystalline or polycrystalline do not have a well-defined shape (e.g., random). In at least one embodiment, interface 117 between surfaces 116E and 114E is substantially planar as shown. In at least one embodiment, grains 114D and 116D at interface 117 can have a flat surface, as will be discussed below. In at least one embodiment, interface 117 can have nano-voids.

Referring again to FIG. 1A, in at least one embodiment, memory device 120 has a cylindrical shape. In at least one embodiment, memory device 120 can have a rectangular shape. In at least one embodiment, memory device 120 has a lateral thickness $W_{MD}$ and plate electrode 112 has a lateral thickness $W_{PE}$. In at least one embodiment, memory device 120 and plate electrode 112 have a cylindrical shape. In at least one embodiment, memory device 120 and plate electrode 112 have a rectangular shape. In at least one such embodiment, lateral thicknesses $W_{MD}$ and $W_{PE}$ are respective diameters. In at least one embodiment, device 100 further includes encapsulation layer 122 on sidewall 120A of memory device 120. In at least one embodiment, encapsulation layer 122 is a dielectric that is designed to protect layers within memory device 120 by providing a hermetic seal. In at least one embodiment, encapsulation layer 122 may act as an insulative barrier against hydrogen or oxygen diffusion. In at least one embodiment, depending on lateral thickness $W_{PE}$ and lateral thickness $W_{MD}$, encapsulation layer 122 can extend on a portion of conductive layer 116. Encapsulation layer 122 has a lateral thickness TEC. In at least one embodiment, a sum of lateral thickness $W_{MD}$ and lateral thickness TEC is substantially equal to lateral thickness $W_{PE}$. In at least one embodiment, a sum of lateral thickness $W_{MD}$ and lateral thickness TEC is less than lateral thickness $W_{PE}$, as shown. In at least one embodiment, where lateral thickness $W_{MD}$ is substantially equal to lateral thickness $W_{PE}$, encapsulation layer 122 can also be directly adjacent to sidewalls of plate electrode 112. In at least one embodiment, encapsulation layer 122 includes a combination of metal and oxygen, such as, for example, $Al_xO_y$, $HfO_x$, $ZrO_x$, $TaO_x$, $TiO_x$, $AlSiO_x$, $HfSiO_x$, or $TaSiO_x$, or a mixture including silicon and nitrogen, or silicon, nitrogen, and carbon, where x is equal to 2 and y is equal to 3.

In at least one embodiment, device 100 further includes level 123 between conductive interconnect 106 and plate electrode 112. In at least one embodiment, level 123 includes electrode structure 124 on at least a portion of one of conductive interconnect 106. In at least one embodiment, electrode structure 124 is laterally surrounded by etch stop layer 125. In at least one embodiment, etch stop layer 125 includes a material that is different from a material of dielectric 108. In at least one embodiment, etch stop layer 125 has a substantially same vertical thickness as electrode structure 124. In at least one embodiment, electrode structure 124 has a greater lateral thickness WES than lateral thickness $W_{CI}$ of conductive interconnect 106. In at least one embodiment, a greater lateral thickness WES compared to lateral thickness $W_{CI}$ can provide a barrier against hydrogen or oxygen diffusion from dielectric 108 to plate electrode 112. In at least one embodiment, lateral thickness WES is less than lateral thickness $W_{PE}$. In at least one such embodiment, encapsulation layer 122 can be on a portion of electrode structure 124, and plate electrode 112 may not be in contact with etch stop layer 125. In at least one embodiment, there may be one or more intervening layers of conductive interconnects between drain contact 110 and electrode structure 124.

In at least one embodiment, transistor 102 is an example of a transistor that is non-planar. In at least one embodiment, transistor 102 may be, for example, an NMOS or a PMOS transistor. In at least one embodiment, transistor 102 includes gate structure 126, between source region 128 and drain region 130. In at least one embodiment, source region 128 includes an epitaxial source structure (herein source structure 132) and drain region 130 includes an epitaxial drain structure (herein drain structure 134). In at least one embodiment, source structure 132 and drain structure 134 are separated from gate structure 126 by spacer 146. In at least one embodiment, source structure 132 and drain structure 134 have faceted sidewall surfaces 132A and 134A, respectively. Not all faceted surfaces of source structure 132 and drain structure 134 are shown. In at least one embodiment, a portion of gate electrode 142 is on gate dielectric layer 140 that separates gate electrode 142 from substrate 104. In at least one embodiment, drain contact 110 is coupled to drain structure 134.

In at least one embodiment, channel 144 is part of a fin structure 145 of a non-planar transistor. In at least one embodiment, source structure 132 and drain structure 134 are epitaxial to fin structure that is part of substrate 104.

In at least one embodiment, gate dielectric layer 140 has a base portion on channel 144 and sidewall portions that are adjacent to spacer 146. In at least one embodiment, gate electrode 142 is laterally confined within gate dielectric layer 140.

In at least one embodiment, gate dielectric layer 140 includes a suitable gate dielectric material such as but not limited to an oxide of one or more of Si, Hf, Zr, La, Ti, Ta, Ga; or Al, such as $SiO_2$, $HfO_2$, $ZrO_2$, $HfSiO_x$, $HfZrO_2$, $Ta_2O_5$, $Al_2O_3$, $La_2O_3$, $TaSiO_x$; or $Ga_2O_5$. In at least one embodiment, gate electrode 142 can include one or more of Ti, Al, W, Pt, Co, Ni, or Pd; nitrogen; one or more of Ti, Ta, Al, Hf, or Zr; or carbon and one or more of Ti, Al, Ta, Hf, or Zr. In at least one embodiment, source structure 132 and drain structure 134 can include amorphous Si, SiC, SiGe, or Ge, and depending on mobile charge carrier implemented may be doped with As, P, or B. In at least one embodiment, spacer 146 includes silicon nitride, or silicon nitride doped with carbon. In at least one embodiment, drain contact 110 includes a conductive material such as Ru, Ti, Co, Mo, Co, Ni, W, or Ta; or nitrides of Ti, W, or Ta. In at least one embodiment, drain contact 110 includes a liner layer including TiN, TaN, or WN; and a fill metal including one or more of Ru, Ti, Co, Mo, Co, Ni, W, or Ta.

In at least one embodiment, gate structure 126, drain structure 132, drain structure 132 and spacer 146, are at least laterally surrounded by dielectric 108. In at least one embodiment, dielectric 108 includes silicon and one or more of oxygen, nitrogen, or carbon. In at least one embodiment, dielectric 152 is directly on etch stop layer 125 and laterally surrounds plate electrode 112 and encapsulation layer 122. In at least one embodiment, dielectric 108 and dielectric 152 include a same material. In at least one embodiment, dielectric 152 includes silicon and one or more of oxygen, nitrogen, or carbon.

In at least one embodiment, device 100 further includes via electrode 150, within dielectric 152, where via electrode 150 is coupled to a terminal of memory device 120. In at least one embodiment, via electrode 150 can include different structural arrangements of two or more conductive layers, as will be discussed below.

In at least one embodiment, memory device 120 (e.g., a memory or logic device) can be coupled with a gate terminal of transistor 102 through a gate contact (not shown). In at least one embodiment, a single transistor such as transistor 102 can be coupled with more than one memory device 120.

Figure 3:
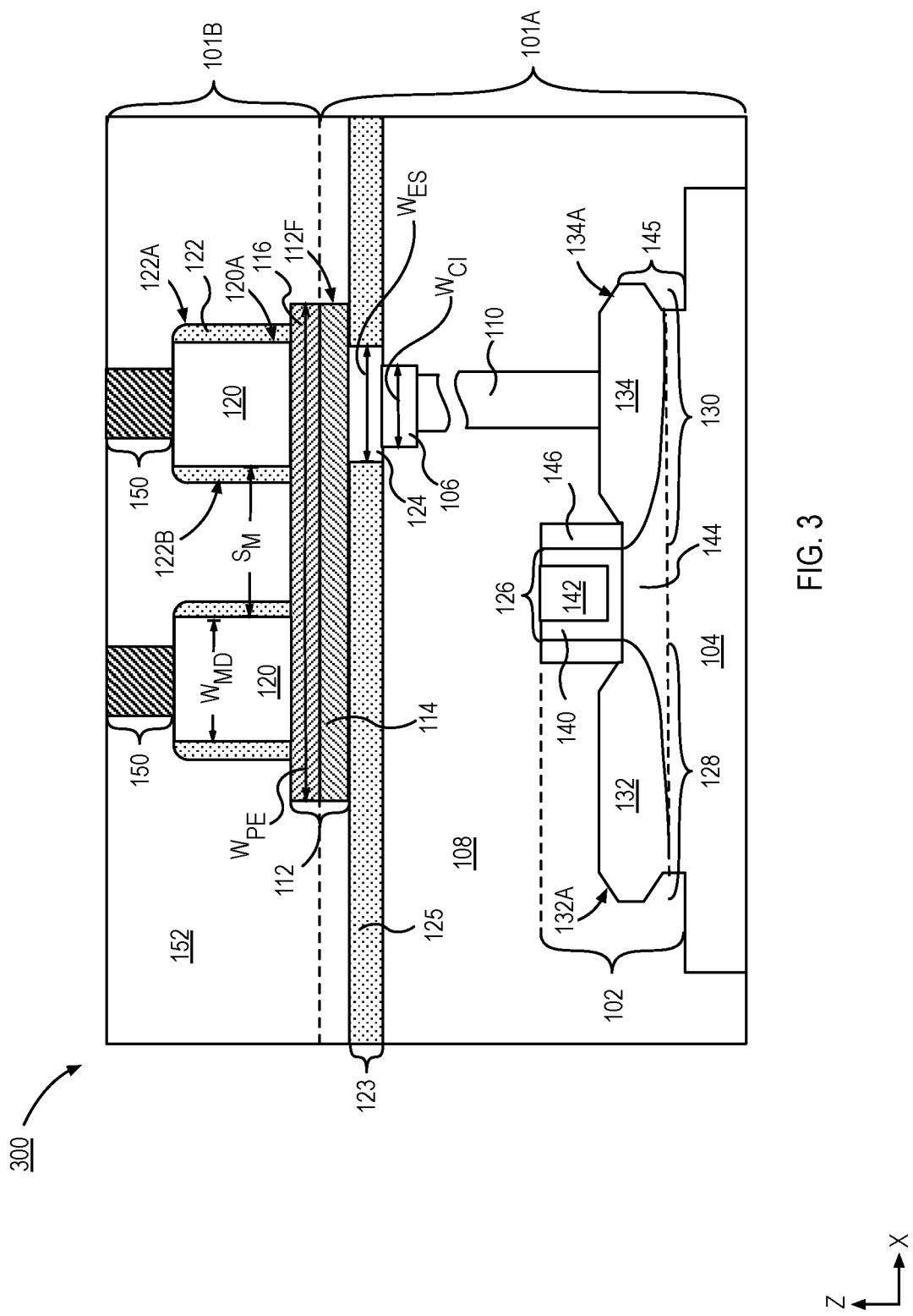
FIG. 3 illustrates a cross-section of a device structure including a pair of memory devices of a first substrate coupled through a plate electrode to a transistor of a second substrate, in at least one embodiment.

FIG. 3 illustrates a cross-section of device 300 including a pair of memory devices 120 within die 101B coupled through plate electrode 112 to transistor 102 of die 101A, in at least one embodiment. In at least one embodiment, device 300 includes many of features of device 100, such as plate electrode 112, transistor 102, drain contact 110, conductive interconnect 106, electrode structure 124, etch stop layer 125, dielectric 108, dielectric 152, via electrode 150, and encapsulation layer 122. In at least one such embodiment, plate electrode 112 is sufficiently large to couple two or more memory devices that are substantially identical to memory device 120.

In at least one embodiment, plate electrode 112 has one or more features of plate electrode 112 (FIGS. 1A-1C and 2A-2C). In at least one embodiment, memory devices 120 and plate electrode 112 have a rectangular shape. In at least one embodiment, memory devices 120 have a cylindrical shape and plate electrode 112 has a rectangular shape. In at least one embodiment, more memory devices may be coupled with plate electrode 112 within a plane of figure.

In at least one embodiment, plate electrode 112 has a lateral thickness $W_{PE}$ that is substantially greater than $W_{MD}$ or $W_{ES}$. In at least one embodiment, $W_{PE}$ is sufficiently wide to accommodate at least two memory devices 120.

In at least one embodiment, plate electrode 112 has a sidewall that extends beyond sidewall 122A of encapsulation layer 122. In at least one embodiment, sidewall 122B of encapsulation layer 122 is confined within a perimeter of plate electrode 112, as shown. In at least one embodiment, sidewall 120A of memory device 120 can align with plate electrode 112. In at least one such embodiment, a portion of encapsulation layer 122 can be directly adjacent to sidewall 112F. In at least one embodiment, encapsulation layer 122 can include portions on memory devices 120, as discussed below.

In at least one embodiment, plate electrode 112 may extend over gate structure 126. In at least one such embodiment, contact to gate electrode 142 may be made on a plane that is into, or out of plane of figure. In at least one embodiment, more than two memory devices 120 may extend along x axis. In at least one embodiment, two or more memory devices such as memory devices 120, may be coupled with a plurality of transistors.

Figure 4:
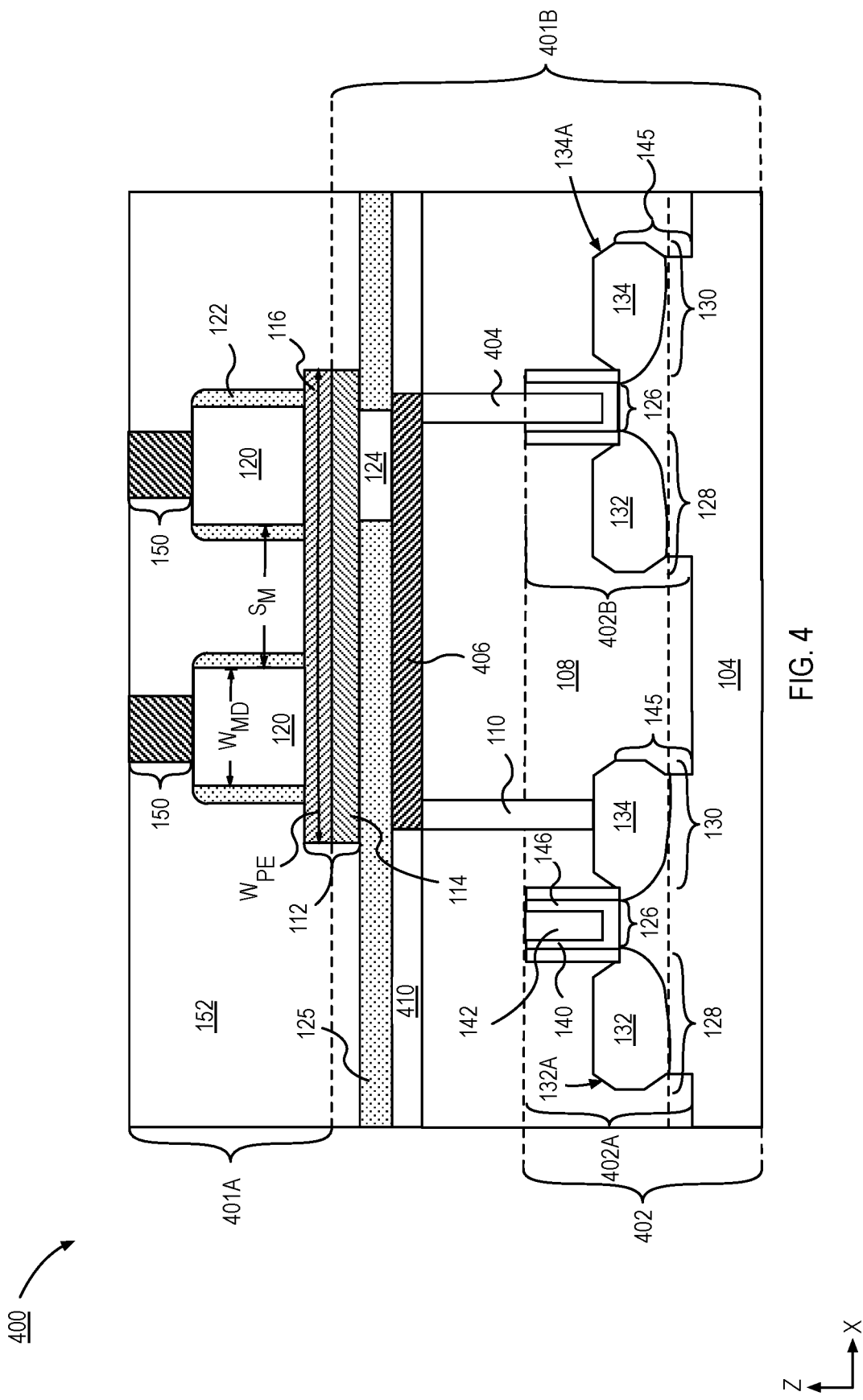
FIG. 4 illustrates a cross-section of a device structure including a pair of memory devices of a first substrate coupled through a plate electrode to a pair of transistors of a second substrate, in at least one embodiment.

FIG. 4 illustrates a cross-section of device 400 including a pair of memory devices of die 401A coupled through plate electrode 112 to a pair of transistors 402 of die 401B, in at least one embodiment. In at least one embodiment, pair of transistors 402 includes transistor 402A and transistor 402B. In at least one embodiment, transistors 402A and 402B may be on a same plane, as shown. In at least one embodiment, transistors 402A and 402B may be arranged side by side along x-direction, as shown, or along y-direction. In at least one embodiment, arrangement of transistors 402A and 402B may depend on structures that are utilized to electrically connect with transistors 402A and 402B. In at least one embodiment, transistor 402A further includes a drain contact 110 on drain structure 134 and transistor 402B includes a gate contact 404 coupled with gate electrode 142 of transistor 402B.

In at least one embodiment, transistors 402A and 402B may be stacked. In at least one embodiment, transistors 402A and 402B are same or substantially same as transistor 102 (FIG. 1A). In at least one embodiment, transistors 402A and 402B share substrate 104. In at least one embodiment, transistors 402A and 402B are examples of non-planar transistors. In at least one embodiment, transistors 402A and 402B may be NMOS or PMOS transistors.

In at least one embodiment, bridge structure 406 is coupled between gate contact 404 of transistor 402B and drain contact 110 of transistor 402A. In at least one embodiment, a gate contact of transistor 402A can be coupled with a drain contact of transistor 402B (not shown). In at least one embodiment, bridge structure 406 includes a material that is same or substantially same as material of conductive interconnect 106 (FIG. 1A).

In at least one embodiment, bridge structure 406 is laterally surrounded by dielectric 410. In at least one embodiment, dielectric 410 includes silicon and one or more of oxygen, nitrogen, or carbon. In at least one embodiment, dielectric 410 and dielectric 108 (FIG. 1A) include a same material.

Figure 5:
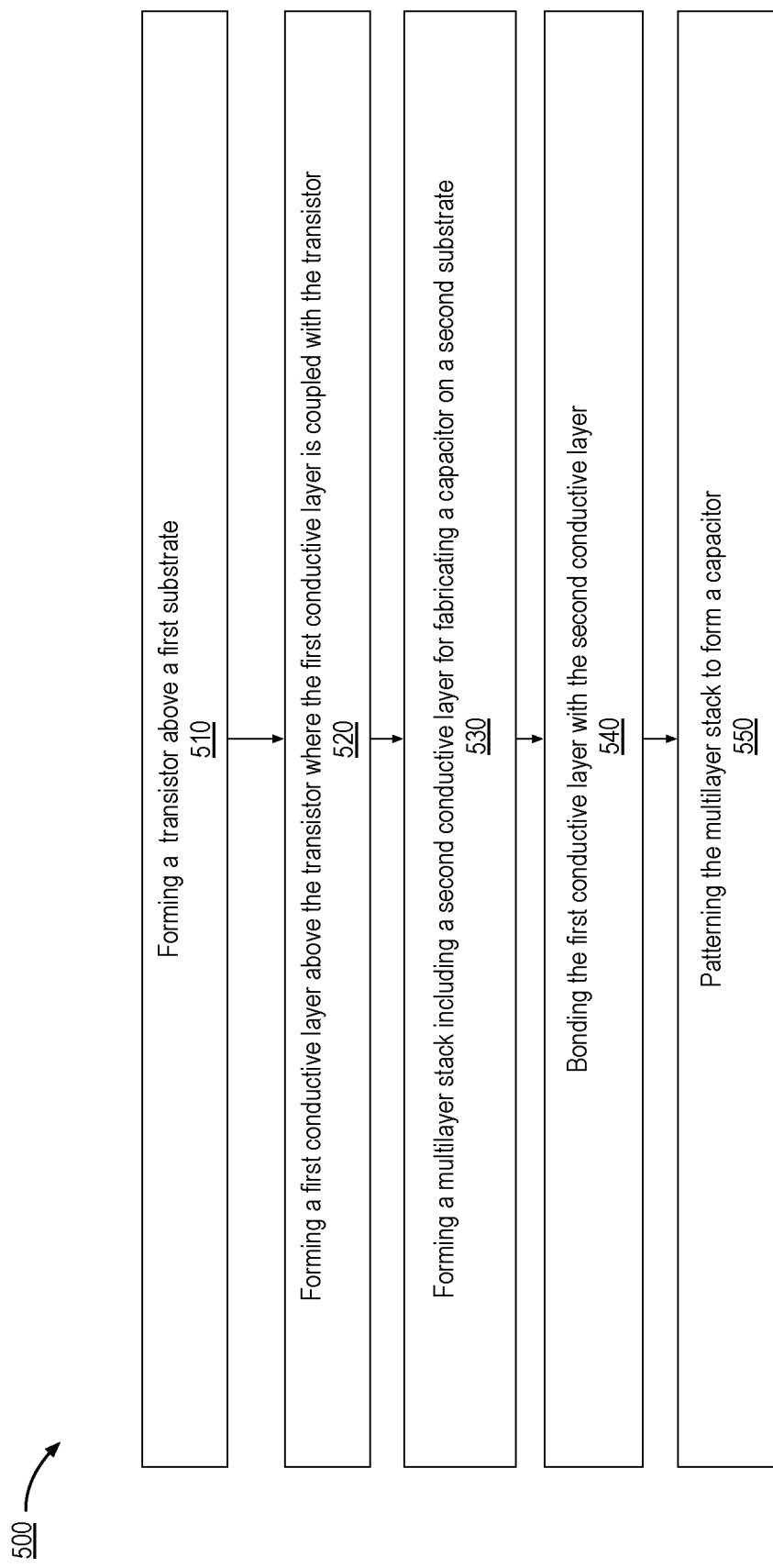
FIG. 5 is an illustration of a flow for fabricating a memory device by bonding a first substrate with a second substrate, in at least one embodiment.

FIG. 5 is a flow diagram for method 500 to fabricate a device structure by bonding a first conductive layer formed above a transistor of a first substrate with a second conductive layer formed above a multi-layer stack of a second substrate, in at least one embodiment. In at least one embodiment, method 500 begins at operation 510 with forming of a transistor above a first substrate. In at least one embodiment, method 500 continues at operation 520 with formation of a first conductive layer above transistor where first conductive layer is coupled with transistor. In at least one embodiment, method 500 continues at operation 530 with formation of a material layer stack including a second conductive layer on a second substrate. In at least one embodiment, method 500 continues at operation 540 by bonding first conductive layer with second conductive layer. In at least one embodiment, method 500 ends at operation 550 by patterning multi-layer stack and first conductive layer and second conductive layer to form a memory device.

FIG. 6A illustrates a cross-section of fin 600, formed on substrate 601, in at least one embodiment. In at least one embodiment, mask 602 is formed on substrate 601. In at least one embodiment, mask 602 includes a dielectric material. In at least one embodiment, mask 602 may be formed by a lithographic pattern on dielectric material. In at least one embodiment, a plasma etch process is utilized to etch material of substrate 601 to form fin 600. In at least one embodiment, fin 600 may be substantially vertical as is shown. In at least one embodiment, substrate 601 includes silicon, silicon germanium, germanium, or a suitable material that can be utilized to pattern and dope to form source and drain structures applicable for a transistor.

FIG. 6B illustrates an isometric view of structure in FIG. 6A following process to form dielectric 603 adjacent to a portion of fin 600, in at least one embodiment. In at least one embodiment, dielectric 603 is blanket deposited on mask 602 (not shown), on sidewalls of fin 600, and on substrate 601. In at least one embodiment, dielectric 603 is planarized post deposition. In at least one embodiment, planarization process includes a chemical mechanical planarization process (CMP). In at least one embodiment, CMP process removes mask 602 from above fin 600. In at least one embodiment, dielectric 603 is then recessed to obtain a desired height of fin 600. Dielectric 603 can provide electrical isolation for portions of a gate electrode to be formed.

FIG. 6C illustrates an isometric view of structure in FIG. 6B following formation of dummy gate 604 on fin 600, in at least one embodiment. In at least one embodiment, dummy gate dielectric layer 606 is deposited on fin 600 and on dielectric 603. In at least one embodiment, dummy gate dielectric layer 606 is grown by a plasma enhanced chemical vapor deposition (PECVD) process, chemical vapor deposition (CVD) or an atomic layer deposition (ALD) process. In at least one embodiment, dummy gate dielectric layer 606 includes a layer of silicon dioxide adjacent to fin 600.

In at least one embodiment, a dummy gate material is blanket deposited on dummy gate dielectric layer 606. In at least one embodiment, dummy gate material includes a chemical vapor deposition process to deposit a material such as polysilicon, amorphous silicon, or silicon germanium. In at least one embodiment, deposition process can take place at temperatures of approximately 600 degrees Celsius or less. In at least one embodiment, such as is shown, a planarization process may be performed to planarize dummy gate material after deposition.

In at least one embodiment, a mask material is deposited on dummy gate material. In at least one embodiment, mask material includes a silicon nitride or a silicon oxynitride. In at least one embodiment, mask material is patterned by a lithographic process and etched by a plasma etch process to form hardmask 608. In at least one embodiment, hardmask 608 is subsequently utilized to etch dummy gate material to form dummy gate 604. In at least one embodiment, dummy gate dielectric layer 606 is removed from surfaces of fin 600 after formation of dummy gate 604.

In at least one embodiment, after formation of dummy gate 604, spacer 146 is formed on sidewalls of dummy gate 604. In at least one embodiment, an encapsulation layer is blanket deposited on fin 600, and on dummy gate 604. In at least one embodiment, encapsulation layer is then etched to form spacer 146 on sidewalls of dummy gate 604. In at least one embodiment, encapsulation layer may be removed from sidewalls of fin 600 by a masking and etching process so that spacer 146 is substantially formed on sidewalls of dummy gate 604 and on a portion of sidewalls of fin 600 adjacent to dummy gate 604. In at least one embodiment, it is useful to remove encapsulation layer from sidewalls 600A of fin 600 to provide effective growth of epitaxial source and drain material in a downstream operation.

Figure 6E:
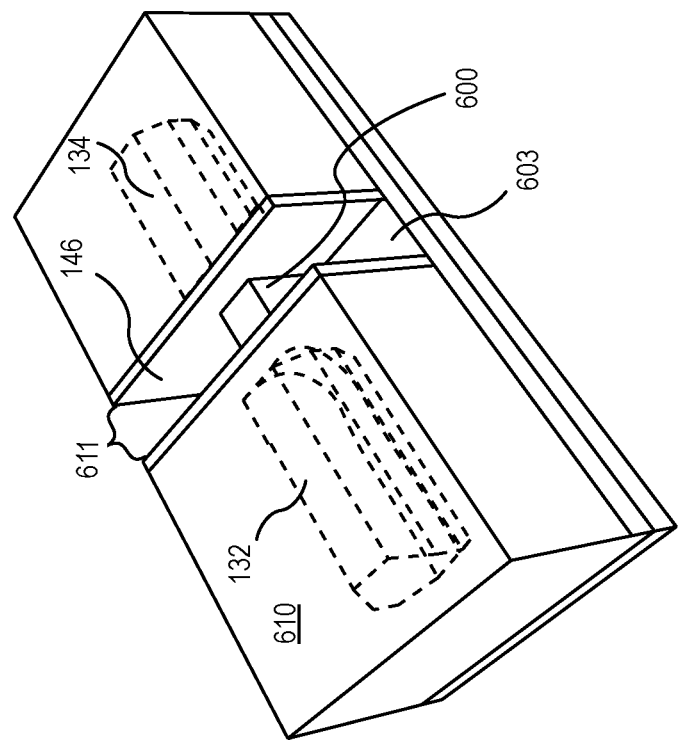
FIG. 6E is an isometric illustration of structure in FIG. 6D following process to remove mask, dummy gate, and dummy gate dielectric to form a gate opening, in at least one embodiment.
Figure 6D:
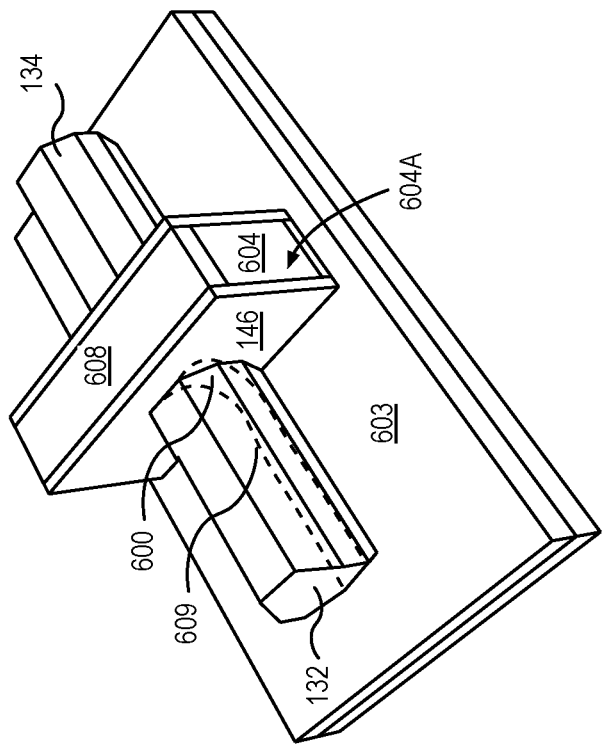
FIG. 6D is an isometric illustration of structure in FIG. 6C following process to form an epitaxial source structure and an epitaxial drain structure, in at least one embodiment.

FIG. 6D illustrates an isometric view of structure in FIG. 6C following process to form source structure 132 and drain structure 134, in at least one embodiment. In at least one embodiment, portions of fin 600 are etched and removed. In at least one embodiment, shape of fin 600 is indicated by dashed lines 609.

In at least one embodiment, an epitaxial growth process is utilized to selectively grow source structure 132 and drain structure 134 on fin 600 as shown. In at least one embodiment, source structure 132 and drain structure 134 are grown to have faceted sidewalls by an epitaxial growth process. In at least one embodiment, dopants may be implanted during epitaxial growth process or implanted at a later operation. In at least one embodiment, spacer 146 and hardmask 608 can prevent epitaxial growth from taking place on dummy gate 604. In at least one embodiment, sidewall 604A of dummy gate 604 is exposed for illustrative purposes only, spacer 146 encapsulates all vertical sidewalls of dummy gate 604. In at least one embodiment, epitaxial growth process may be carried out at temperatures between 200 degrees Celsius and 700 degrees Celsius to grow source structure 132 and drain structure 134 doped with Si, amorphous silicon or SiGe.

FIG. 6E is an isometric illustration of structure in FIG. 6D following process to remove hardmask 608, dummy gate 604, and dummy gate dielectric 610, in at least one embodiment. In at least one embodiment, dummy gate dielectric 610 is blanket deposited on source structure 132 and drain structure 134, on dielectric 603, spacer 146 and hardmask 608 (FIG. 6D). In at least one embodiment, dummy gate dielectric 610 can include silicon and one or more of oxygen, nitrogen, or carbon, and may be deposited by a chemical vapor deposition (CVD), or a plasma enhanced chemical vapor deposition (PECVD) process. In at least one embodiment, dummy gate dielectric 610 is planarized by a CMP process. In at least one embodiment, CMP process may remove hardmask 608. In at least one embodiment, an etch process may be utilized to remove hardmask 608, and portions of dummy gate 604 after partial competition of CMP process. In at least one embodiment, a wet chemical process is utilized to selectively remove dummy gate 604, as well as dummy gate dielectric 610 selective to dielectric 603, spacer 146 and fin 600. In at least one embodiment, process of removing dummy gate 604 forms an opening 611.

FIG. 6F illustrates a cross-section of structure in FIG. 6E following process to form gate structure 126 in opening 611, in accordance with at least one embodiment. In at least one embodiment, a gate dielectric layer 140 is blanket deposited after a high temperature process to grow source structure 132 and drain structure 134. In at least one embodiment, an atomic deposition process is utilized to deposit a gate dielectric layer 140 on fin (not shown), on sidewalls of spacer 146 and on dielectric 603 in opening 611. Depending on a MOS characteristic, in at least one embodiment, a PMOS or an NMOS material is deposited on gate dielectric layer 140 to form gate electrode 142. Depending on material, and desired size of transistor gates, a range of deposition processes can be utilized. In at least one embodiment, deposition process may include a CVD, a physical vapor deposition (PVD), or an atomic layer deposition (ALD) method. In at least one embodiment, after deposition, a planarization process can be performed to remove excess material of gate electrode 142 and gate dielectric layer 140 from above spacer 146 and dielectric 610.

FIG. 7A illustrates a cross-section of structure in FIG. 6F through a line A-A' following process to form drain contact 403 on drain structure 134, in at least one embodiment. Line A-A' corresponds to a line through fin 600 and illustration depicts a portion of gate electrode 142 on fin 600. In at least one embodiment, lines 700 denote extensions of gate electrode 142 on dielectric 603, below dashed line 701. In at least one embodiment, dielectric 702 is blanket deposited on dielectric 610, on spacer 146 and on gate structure 126. In at least one embodiment, dielectric 702 includes a material that is same or substantially same as material of dielectric 610. In at least one embodiment, dielectric 702 may be deposited by a PECVD or a CVD process.

In at least one embodiment, a mask is formed on dielectric 702, and an opening is formed in dielectric 702 and in dielectric 610 to expose drain structure 134. In at least one embodiment, a conductive material is deposited into opening and on uppermost surface 702A of dielectric 702. In at least one embodiment, conductive material is removed via planarization from uppermost surface 702A to fabricate drain contact 110.

In at least one embodiment, gate contact can be formed on gate structure 126 as indicated by dashed lines 703. In at least one embodiment, a gate contact can be formed by etching dielectric 702 and depositing materials that are same or substantially same as materials of drain contact 110. In at least one embodiment, transistor 102 is formed above substrate 601. In at least one embodiment, a plurality of transistors that are identical or substantially identical to transistor 102 can be formed on a same level or plane of transistor 102 within substrate 601.

FIG. 7B illustrates a cross-section of structure in FIG. 7A following process to form conductive interconnect 106, in at least one embodiment. In at least one embodiment, dielectric 704 is deposited on dielectric 702 and on drain contact 110. In at least one embodiment, dielectric 704 includes a material that is same or substantially same as material of dielectric 702. In at least one embodiment, dielectric 704 is deposited by a PVD, PECVD, or an ALD deposition process. In at least one embodiment, an opening is formed in dielectric 704 and one or more conductive materials are deposited into opening 705. In at least one embodiment, conductive materials are deposited in opening 705 and on drain contact 110. In at least one embodiment, conductive material is planarized to form conductive interconnect 106. In at least one embodiment, there can be more than one intervening layers between dielectric 704 and dielectric 702 and corresponding one or more conductive electrodes.

FIG. 8 illustrates a cross-section of structure in FIG. 7B following process to deposit etch stop layer 125. In at least one embodiment, etch stop layer 125 is blanket deposited on dielectric 704 and on conductive interconnect 106. In at least one embodiment, etch stop layer 125 is deposited on dielectric 702 by a PECVD, a PVD, or a CVD process. In at least one embodiment, etch stop layer 125 may be etched by a plasma etch process to form an opening above conductive interconnect 106. In at least one embodiment, an opening can be formed in portion 807 (defined by dashed lines). In at least one embodiment, an opening can be formed above gate structure 126.

FIG. 9A is an enhanced cross-sectional illustration of portion 807 of structure in FIG. 8 following process to etch opening 902 in etch stop layer 125, in at least one embodiment. In at least one embodiment, photoresist mask 903 is formed on etch stop layer 125 by a lithographic process. In at least one embodiment, etch stop layer 125 may be etched by a plasma etch process through an opening in photoresist mask 903. In at least one embodiment, opening 902 has a lateral thickness $W_O$. Lateral thickness $W_O$ may be narrower, equal to or wider than lateral thickness $W_{CI}$. In at least one embodiment, lateral thickness $W_O$ is greater than lateral thickness $W_{CI}$. In at least one embodiment, shape of opening 902 may be circular or rectangular, and conductive interconnect 106 may be discrete islands or a line straddling a drain structure.

FIGS. 9B-9C are cross-sectional illustrations depicting a method to fabricate an electrode structure having a conductive hydrogen barrier above a fill metal, in accordance with at least one embodiment.

FIG. 9B illustrates a cross-section of structure in FIG. 9A following deposition of conductive fill material 904 within opening 902, in at least one embodiment. In at least one embodiment, conductive fill material 904 is blanket deposited into opening 902, on conductive interconnect 106 and on sidewalls and upper most surface of etch stop layer 125. In at least one embodiment, conductive fill material 904 includes tantalum, titanium, ruthenium, or tungsten, and can be deposited by a PVD, a PECVD or an ALD process. In at least one embodiment, conductive fill material 904 includes copper and can be deposited by an electroplating process.

FIG. 9C illustrates a cross-section of structure in FIG. 9B following process to recess conductive fill material 904 within a portion of opening 902, in at least one embodiment. In at least one embodiment, portions of conductive fill material 904 that are deposited on uppermost surface 125A, in a prior operation, are removed by a planarization process. In at least one embodiment, planarization process leaves conductive fill material 904 within opening 902. In at least one embodiment, surface 904A of conductive fill material 904 is substantially planar with uppermost surface 125A of etch stop layer 125.

In at least one embodiment, a wet chemical process is utilized to recess conductive fill material 904 below uppermost surface 125A. In at least one embodiment, level of recess of conductive fill material 904 relative to uppermost surface 125A will depend on thickness $T_L$ and on a desired thickness of a conductive hydrogen barrier to be formed. In at least one embodiment, conductive fill material 904 is recessed relative to uppermost surface 125A by up to half of thickness $T_L$.

FIG. 9D illustrates a cross-section of structure in FIG. 9C following process to form conductive hydrogen barrier 906 on conductive fill material 904. In at least one embodiment, a conductive hydrogen barrier layer is blanket deposited on conductive fill material 904 and on etch stop layer 125. In at least one embodiment, a planarization process may be utilized to remove excess conductive hydrogen barrier material layer deposited on uppermost surface 125A. In at least one embodiment, planarization process includes a chemical mechanical polish (CMP) process. In at least one embodiment, CMP process forms conductive hydrogen barrier 906.

FIG. 9E illustrates a cross-section of structure in FIG. 9A following process to form electrode structure 124, in at least one embodiment. In at least one embodiment, a conductive hydrogen barrier layer is blanket deposited in opening 902 on conductive interconnect 106 and on etch stop layer 125. In at least one embodiment, a conductive fill material 904 is blanket deposited on conductive hydrogen barrier layer. In at least one embodiment, portions of conductive fill material 904 that are deposited on uppermost surface 125A, and conductive hydrogen barrier layer are removed by a planarization process. In at least one embodiment, planarization process forms a liner of conductive hydrogen barrier layer or conductive hydrogen barrier 906 on sidewalls of etch stop layer 125 and on portions of conductive interconnect 106. In at least one embodiment, planarization also confines conductive fill material within conductive hydrogen barrier 906.

FIG. 10A illustrates a cross-section of structure in FIG. 9A following process to deposit conductive layer 114 on electrode structure 124 and prepare conductive layer 114 for bonding, in at least one embodiment. In an embodiment, conductive layer 114 is deposited by a PVD, an ALD, or a plasma enhanced atomic layer deposition (PEALD) process. In at least one embodiment, conductive layer 114 includes a polycrystalline, or an amorphous material. In at least one embodiment, small amorphous grains coalesce and grow in z-direction, perpendicular to substrate 601, resulting in columnar grain formation such as is illustrated in FIGS. 1B-1C, or in FIGS. 2A-2B. In at least one embodiment, conductive layer 114 is deposited to a thickness that is conducive to promote columnar grain growth. In at least one embodiment, conductive layer 114 includes a refractory metal. In at least one embodiment, conductive layer 114 includes a nitride of a refractory metal.

In at least one embodiment, collectively structure in FIG. 10A may be referred to as wafer 1000. In at least one embodiment, wafer 1000 can be bonded with a second wafer comprising a multi-layer stack to fabricate at least one capacitor coupled with transistor 102.

In an embodiment, conductive layer 114 is deposited to a thickness that is sufficient to be planarized. In at least one embodiment, enhanced cross-sectional illustrations of portion 1001 of conductive layer 114 as deposited and after processing are described in FIGS. 10B-10D.

In at least one embodiment, columnar grain growth or amorphous grain growth can form surface 114E with substantial non-uniformities, as shown in structure 1001A in FIG. 10B. In at least one embodiment, a planarization process may be implemented to reduce as deposited non-uniformities. In at least one embodiment, these non-uniformities can be at least greater than 0.5 nm, and as much as 5 nm. In at least one embodiment, non-uniformities in surface 114E can make it difficult to bond with a conductive layer formed on a second substrate. In at least one embodiment, where bonds can be formed with a conductive layer formed on a second substrate, large non-uniformities (for e.g., non-uniformities equal to or greater than 1 nm) can lead to gaps or voids at interface between bonded surfaces. In at least one embodiment, voids may lead to an increase in electrical resistance and implementation of high voltage (for example voltages above 1.5V) for operating memory devices.

In at least one embodiment, one or more methods can be implemented to reduce non-uniformities. FIG. 10C illustrates a cross-section of structure 1001B. In at least one embodiment, structure 1001B is obtained after a planarization process is performed to reduce non-uniformities in surface 114E of conductive layer 114 in FIG. 10B. In at least one embodiment, planarization process includes a chemical mechanical planarization (CMP). In at least one embodiment, CMP process reduces non-uniformities to a level that is acceptable for bonding with another conductive layer. In at least one embodiment, non-uniformity in surface 114E after planarization is approximately 1 nm or less. In at least one embodiment, non-uniformity in overall thickness of conductive layer 114 may be greater than 1 nm. In at least one embodiment, a wet chemical treatment can be performed to smoothen surface and/or remove residue generated from planarization process.

In at least one embodiment, surface 114E can be atomically smooth with non-uniformities that are less than 0.3 Angstrom, as illustrated in structure 1001C in FIG. 10D.

Referring again to FIG. 10A, after smoothing surface 114E of conductive layer 114, in at least one embodiment, an implantation process (denoted by arrows 1002) can be performed in preparation for bonding with a second wafer.

FIG. 11 illustrates a cross-section of wafer 1100 that includes a multi-layer stack 1102 formed on substrate 1103, followed by formation of conductive layer 116 on multi-layer stack 1102. In at least one embodiment, process to form multi-layer stack 1102 includes blanket deposition of at least three material layers. In at least one embodiment, number of layers can depend on a type of memory device to be fabricated. In at least one embodiment, multi-layer stack 1102 includes deposition of layers for a ferroelectric memory device. In at least one embodiment, multi-layer stack 1102 includes deposition of layers for a paraelectric memory device. In at least one embodiment, deposition process includes depositing at least four layers as shown. In at least one embodiment, at least four layers may be required because multi-layer stack 1102 is designed to be inverted to bond with structure in FIG. 10A, and layer 1104 may be sacrificial. In at least one embodiment, layer 1104 may be composed of two or more sub layers.

In an embodiment, individual layers of multi-layer stack 1102 (for a ferroelectric memory device) are deposited in situ, i.e., without breaking vacuum. Multi-layer stack 1102 may be deposited by an ALD, a PECVD, a CVD, a PVD process or a combination thereof. In embodiments, ALD process may be performed at a process temperature between 160 degrees Celsius and 400 degrees Celsius, PVD process may be performed at a process temperature between 23 degrees Celsius (room temperature) and 400 degrees Celsius, and CVD process may be performed at a process temperature between 160 degrees Celsius and 800 degrees Celsius.

In at least one embodiment, formation of multi-layer stack 1102 begins by blanket deposition of layer 1104 on substrate 1103. In at least one embodiment, deposition temperatures will depend on material of layer 1104. In at least one embodiment, layer 1104 is a conductive layer, where conductive layer may be advantageously utilized for planarization as well as a hardmask for patterning and forming memory devices. In at least one embodiment, layer 1104 is an insulative layer that may be advantageously utilized for planarization and as a hardmask for patterning multi-layer stack 1102. In at least one embodiment, layer 1104 includes a material, for example, $SiO_2$, $Si_3N_4$, DLC (Diamond Like Carbon), or $Al_2O_3$. In at least one embodiment, portions of layer 1104 are designed to be planarized and removed. In at least one embodiment, layer 1104 is designed to be removed after completing patterning of multi-layer stack 1102.

In at least one embodiment, layer 1104 is a bilayer stack, where a lower level is an insulator, and an upper layer is a conducive material. In at least one embodiment, bilayer stack may be useful to pattern memory devices, where insulator is first patterned to form a patterned insulator, and patterned insulator is used to pattern conductive material.

In at least one embodiment, in absence of layer 1104, formation of multi-layer stack 1102 can begin by blanket deposition of conductive layer 1105 on substrate 1103. In at least one embodiment, deposition process is continued with deposition of conductive layer 1105 on layer 1104, as shown.

In at least one embodiment, conductive layer 1105 includes a conductive ferroelectric oxide. In at least one embodiment, conductive ferroelectric oxide includes one of a non-Pb perovskite metal oxides, such as but not limited to, $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$ or $CaRuO_3$. In at least one embodiment, conductive layer 1105 includes Ir, $Ir_2O_x$, Ru, $RuO_x$, Mo, $MoO_x$, W or $WO_x$. In at least one embodiment, conductive layer 1105 includes hexagonal compounds including one or more of $PtCoO_2$, $PdCoO_2$, delafossite structured hexagonal conductive oxides including Al-doped ZnO, spinels including one or more of $Fe_3O_4$, $LiV_2O_4$ or cubic oxides including Indium tin oxide or Sn-doped $In_2O_3$.

In at least one embodiment, conductive layer 1105 includes a material that is different from a material of layer 1104.

In at least one embodiment, conductive layer 1105 is deposited to thickness $T_1$, that is suitable for minimizing electrical resistance as well as reducing taper of sidewalls during patterning to form memory devices. In at least one embodiment, conductive layer 1105 has a thickness that ranges between 3 nm and 30 nm. In at least one embodiment, a thickness of less than 30 nm can be useful to prevent significant tapering of sidewalls formed during patterning process.

In at least one embodiment, deposition process is continued with deposition of dielectric layer 1106. In at least one embodiment, dielectric layer 1106 is blanket deposited on conductive layer 1105. In at least one embodiment, dielectric layer 1106 has a thickness, $T_2$, between (and inclusive of) 1 nm and 30 nm.

In at least one embodiment, dielectric layer 1106 includes a non-Pb Perovskite material in form $ABO_3$, where A and B are two cations of different sizes and O is Oxygen. A is generally larger than B in size. In at least one embodiment, non-Pb perovskites can also be doped, e.g., by La or Lanthanides. Non-Pb perovskite material can include one or more of La, Sr, Co, Cr, K, Nb, Na, Sr, Ru, Y, Fe, Ba, Hf, Zr, Cu, Ta, Bi, Ca, Ti, or Ni. In at least one embodiment, non-Pb Perovskite material includes one of: $BaTiO_3$, $KNbO_3$, or $NaTaO_3$.

In at least one embodiment, dielectric layer 1106 is of form $ABO_3$, where A and B are two cations of different sizes and O is Oxygen. In at least one embodiment, perovskite can be doped, e.g., by one or more elements from lanthanide series of periodic table, or one or more elements of 3d, 4d, 5d, 6d, 4f, or 5f series of periodic table. In at least one embodiment, perovskites can be suitably doped to achieve a spontaneous distortion in a range of 0.3% to 2%. In at least one embodiment, in chemically substituted lead titanate such as Zr in Ti site or La or Nb in Ti site, concentration of these substitutes is such that it achieves spontaneous distortion in range of 0.3% to 2%. In at least one embodiment, lead-based perovskite material includes lead zirconium titanate (PZT) or PZT with a first doping material, wherein the first doping material is one of La or Nb.

In at least one embodiment, dielectric layer 1106 includes a low voltage ferroelectric material. Low voltage FE materials can be of form $AA'BB'O_3$, where A' is a dopant for atomic site A and can be an element from lanthanides series, and B' is a dopant for atomic site B and can be an element from transition metal elements such as Sc, Ti, V, Cr, Mn, Fe, Co, Ni, Cu, or Zn. A' may have same valency of site A, with a different polarizability. Voltage below 3 volts is sufficiently low to be characterized as low voltage.

In at least one embodiment, dielectric layer 1106 includes bismuth ferrite (BFO) with a first doping material, wherein the first doping material is one of lanthanum, elements from lanthanide series of a periodic table, or elements of 3d, 4d, 5d, 6d, 4f, or 5f series of periodic table. In at least one embodiment, BFO is doped with Mn or Sc, wherein Mn or Sc achieve a spontaneous distortion in BFO in a range of 0.3% to 2%.

In at least one embodiment, dielectric layer 1106 includes a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST).

In at least one embodiment, dielectric layer 1106 includes hexagonal ferroelectrics of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides. In at least one embodiment, dielectric layer 1106 includes a hexagonal ferroelectric which includes one of: $YMnO_3$ or $LuFeO_3$. In at least one embodiment, dielectric layer 1106 includes a hafnium oxide of form $Hf_{1-x}E_xO_z$, where 'x' denotes a fraction, and E includes one of Al, Ca, Ce, Dy, Er, Gd, Ge, La, Sc, Si, Sr, Sn, Zr, or Y.

In at least one embodiment, dielectric layer 1106 includes $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, where a, b, and c are respective compositional fractions. In at least one embodiment, dielectric layer 1106 includes niobate type compounds such as $LiNbO_3$, $LiTaO_3$, $LiTaO_2F_2$, or $Sr_xBa1-xNb_2O_6$ where $0.32 \leq x \leq 0.8$, or $KSr_2Nb_5O_{15}$.

In at least one embodiment, dielectric layer 1106 comprises multiple layers, for example, alternating layers of $[Bi_2O_2]2+$, and pseudo-perovskite blocks ($Bi_4Ti_3O_{12}$ and related Aurivillius phases), with perovskite layers that are 'n' octahedral layers. In at least one embodiment, examples of multiple layers include improper ferroelectric material. An improper ferroelectric is a ferroelectric where primary order parameter is an order mechanism such as strain or buckling of atomic order. In at least one embodiment, improper ferroelectric material includes an epitaxial bilayer stack including one of: [barium titanate/strontium titanate]n or [lanthanum aluminate/strontium titanate]n, wherein 'n' represents a number of bilayers, and wherein 'n' is between 1 and 100.

While various embodiments here are described with reference to ferroelectric material for storing charge state, at least one embodiment may also be applicable for paraelectric material, anti-ferroelectric material, or a combination of them.

In at least one embodiment, dielectric layer 1106 includes $LuFeO_3$ class of materials or super lattice of ferroelectric and paraelectric materials. In at least one embodiment, f-orbital materials (e.g., lanthanides) are doped to ferroelectric material of dielectric layer 1106 to make a paraelectric material.

In at least one embodiment, room temperature paraelectric materials include: $SrTiO_3$, $Ba_xSr_yTiO_3$, $HfZrO_2$, Hf—Si—O. In at least one embodiment, dielectric layer 1106 includes an anti-ferroelectric material. In at least one embodiment, antiferroelectric material may include one of: $HfSiO_2$ and $HfZrO_x$ with >30% Si and >30% Zr doping, $ZrO_2$, $NaNbO_3$, or >5% K doped $NaNbO_3$. In an embodiment, dielectric layer 1106 includes a PMN-PT based relaxor ferroelectric. In some embodiments, multi-layer stack 1102 including paraelectric materials can range from 5 nm to 100 nm in total thickness.

In at least one embodiment, process is continued with blanket deposition of conductive layer 1107 on dielectric layer 1106. In at least one embodiment, conductive layer 1107 includes a conductive ferroelectric oxide. In at least one embodiment, conductive ferroelectric oxide includes one of a non-Pb perovskite metal oxides, such as but not limited to, $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, SrNbO$_3$, LaNiO$_3$, YBa$_2$Cu$_3$O$_7$, Bi$_2$Sr$_2$CaCuO$_8$, or CaRuO$_3$. In at least one embodiment, conductive layer 1105 includes Ir, Ir$_2$O$_x$, Ru, RuO$_x$, Mo, MoO$_x$, W, or WO$_x$. In at least one embodiment, conductive layer 1107 includes a material that is same or substantially same as material of conductive layer 1105. In at least one embodiment, when conductive layers 1105 and 1107 include same material, multi-layer stack can be substantially symmetric in device voltage/current characteristics. In at least one embodiment, conductive layer 1107 is deposited to thickness T$_3$. In at least one embodiment, it is useful for conductive layer 1107 to be as thin as possible to facilitate fabrication. In at least one embodiment, thickness T$_3$ is between 3 nm and 30 nm. In at least one embodiment, conductive layer 1107 can have a different thickness than conductive layer 1105. In at least one embodiment, thickness T$_3$ is substantially equal to thickness T$_1$.

In at least one embodiment, when conductive layer 1105 and conductive layer 1107 include a same material, multi-layer stack 1102 is symmetric. In at least one embodiment, conductive layer 1107 can have a different thickness than conductive layer 1105. In embodiments, conductive layer 1107 is deposited to a thickness, T$_3$, between 3 nm and 30 nm. In at least one embodiment, conductive layer 1107 between 3 nm and 30 nm can facilitate patterning process.

In at least one embodiment, as-deposited grain size of conductive layers 1105 and 1107 and in dielectric layer 1106 is less than 15 nm. Grain size refers to an average length of longest dimension of a grain within conductive layers 1105 and 1107.

In at least one embodiment, deposition process to form multi-layer stack 1102 continues with formation of conductive layer 116 on conductive layer 1107. In at least one embodiment, conductive layer 116 is blanket deposited by a CVD or PVD process. In at least one embodiment, conductive layer 116 includes a material that has a favorable bond adhesion affinity to material of conductive layer 114 (FIG. 10A). In at least one embodiment, conductive layer 116 includes a refractory metal or a nitride of a refractory metal. In at least one embodiment, a refractory or a nitride of a refractory metal is useful for relative ease of patterning.

In at least one embodiment, conductive layer 116 is deposited on conductive layer 1107 by a PVD, an ALD, or a plasma enhanced atomic layer deposition (PEALD) process. In at least one embodiment, conductive layer 116 includes a polycrystalline, or an amorphous material. In at least one embodiment, small amorphous grains coalesce and grow in z-direction, perpendicular to substrate 1103, resulting in columnar grain formation. In at least one embodiment, conductive layer 116 includes a refractory metal. In at least one embodiment, conductive layer 116 includes a nitride of a refractory metal. In at least one embodiment, conductive layer 116 is deposited to a thickness that is conducive to promote columnar grain growth (such as is illustrated in FIGS. 1B-1C, or in FIGS. 2A-2B). In at least one embodiment, conductive layer 116 and conductive layer 114 (FIG. 10A) include a same material. In at least one embodiment, a same material can facilitate bonding process.

In at least one embodiment, deposition process also includes formation of a capping layer on conductive layer 1107 prior to deposition of conductive layer 116. In at least one embodiment, capping layer is blanket deposited by a CVD or, a PVD process. In at least one embodiment, capping layer includes a material that has a favorable etch selectivity compared to ferroelectric materials in multi-layer stack 1102. In at least one embodiment, capping layer includes a conductive material that is different from conductive material of ferroelectric material.

In at least one embodiment, point defects in dielectric layer 1106, and in conductive layers 1105 and 1107 post deposition but prior to anneal can be greater than 1e22 atoms/cm$^3$. In at least one embodiment, a post deposition anneal can reduce point defects by at least an order of magnitude. In at least one embodiment, point defects in dielectric layer 1106, conductive layers 1105 and 1107, post anneal, can have a defect density of less than 1e20 atoms/cm$^3$.

In at least one embodiment, a post deposition anneal process is formed after deposition of multi-layer stack 1102. A post deposition anneal (PDA) may be characterized by an anneal after deposition process, in contrast to an in-situ anneal which takes place during deposition. In at least one embodiment, PDA can take place after deposition of all layers in multi-layer stack 1102, or at least after dielectric layer has been deposited. In illustrative embodiment, a PDA is performed after completing deposition of multi-layer stack 1102.

In at least one embodiment, anneal temperatures can be as high as 1300 degrees Celsius, where anneal durations are limited to less than or equal to 60 seconds. In at least one embodiment, specific temperature, and time duration are dependent on annealing technique utilized. Because multi-layer stack 1102 is deposited on a separate substrate 104 in absence of any transistors, metallurgical reaction between gate dielectric layer and gate electrode can be prevented, in at least one embodiment.

In at least one embodiment, PDA anneal at temperatures less than or equal to 1300 degrees Celsius has an effect of increasing grain size of dielectric layer 1106, and/or conductive layers 1105 and 1107 due to coalescence of smaller grain sizes. In at least one embodiment, net growth in grain size can be a function of as-deposited thickness of dielectric layer 1106 and conductive layers 1105 and 1107. In at least one embodiment, when deposited thickness of layers in multi-layer stack 1102 are less than 30 nm thick, PDA at temperatures less than 1300 degrees Celsius can increase grain size to a peak value of approximately 50 nm. In at least one embodiment, grain size refers to an average length of a grain. In at least one embodiment, PDA does not increase thickness of as-deposited layers.

In at least one embodiment, post deposition anneal can include an RTP/RTA process that can be performed at temperatures above >1000 degrees Celsius. In at least one embodiment, duration of anneal is on order of a minimum of a few seconds.

In at least one embodiment PDA includes a flash anneal process. In at least one embodiment, flash and laser anneal is performed at h temperatures above 1001 C. In at least one embodiment, flash and laser anneal can include spot heating or beam rastering for increased throughput. In at least one embodiment, processing pressures range from 1 Torr to 760 Torr while flowing in O$_2$, N$_2$, or Argon gases, or in air. In at least one embodiment, flash anneal processes are carried out in vacuum at pressures less than 1 Torr. In at least one embodiment, processing temperatures range from 500° to 1300 degrees Celsius, where heating and cooling rate is approximately 10$^6$ degrees C./s. In at least one embodiment, processing times/cycle is 10 ms or less, where number of cycles can be up 100.

Referring collectively to FIG. 10A and FIG. 11, in at least one embodiment, conductive layer 116 is deposited to a thickness that is sufficient to be planarized. In at least one embodiment, a planarization process may be implemented because columnar grain growth or amorphous grain growth can form surface 116E with substantial non-uniformities like non-uniformities in surface 114E. In at least one embodiment, non-uniformities in surface 116E can be at least greater than 0.3 nm, and as much as 3 nm. In at least one embodiment, non-uniformities in surface 116E can create voids while bonding with conductive layer 114. In at least one embodiment, conductive layer 116 and conductive layer 114 include a same material. In at least one embodiment, a same material can produce substantially similar surfaces 116E and 114E.

In at least one embodiment, one or more process (described in association FIG. 10B) can be implemented to reduce non-uniformities in surface 116E. In at least one embodiment, a wet chemical treatment can be performed to smoothen surface 116E and/or remove residue generated from planarization process.

In at least one embodiment, surface 116E can be prepared for bonding after planarization. In at least one embodiment, preparation includes performing hydrogen implantation. In at least one embodiment, process conditions for hydrogen implantation depends on material of conductive layer 116, thickness and desired dopant penetration depth. In at least one embodiment, process is performed at room temperature. In at least one embodiment, surface 116E may be treated with an adhesion promoter followed by application of a polymer adhesive to surface 116E.

In at least one embodiment, one or more methods of surface preparation can also be applied to prepare surface 114E for bonding. In at least one embodiment, methods of surface can be identical if conductive layers 114 and 116 are identical.

In at least one embodiment, bonding process includes solder bonding. In at least one embodiment, preparation process includes applying metal solders on surfaces 114E and 116E. In at least one embodiment, metal solders can be applied by process such as but not limited to evaporation, CVD, electroless-plating or electroplating. In at least one embodiment, materials used in solder bonding include lead-tin or gold-tin. In at least one embodiment, solder bonding can also include copper-tin, where layers above transistor 102 are formed.

FIG. 12A illustrates a cross-section of structures in FIG. 10A and FIG. 11 following process to bond conductive layer 114 and conductive layer 116, in at least one embodiment. In at least one embodiment, because of bonding process, surfaces 114E and 116E are brought into contact to form interface 117. In at least one embodiment, process of bonding wafers 1000 and 1100 can be useful because wafer 1000 has features that have different temperature tolerances from wafer 1100. In at least one embodiment, wafers 1000 and 1100 can separately undergo thermal treatment at vastly different temperatures prior to bonding process.

In at least one embodiment, process of bonding includes solder bonding, eutectic bonding, thermocompression bonding or ultrasonic bonding. In at least one embodiment, one or more materials utilized in bonding process may be present at interface 117 interface between conductive layer 114 and conductive layer 116. In at least one embodiment, such one or more materials may be present between two surfaces that are not substantially planar as illustrated in FIG. 12B. FIG. 12B is an enhanced cross-sectional illustration of a portion of structure in FIG. 12A, in at least one embodiment. In at least one embodiment, surface 114E and 116E are not sufficiently planar and form voids 1202. In at least one embodiment, void 1202 can be filled by a material utilized in a solder bonding process. In at least one embodiment, voids 1202 can have a thickness that is less than 1 nm.

In at least one embodiment, process of bonding conductive layers 114 and 116 can result in grains from being non-contiguous across interface 117. In at least one embodiment, non-contiguous nature of grains across interface 117 arises from relative randomness of grains in conductive layers 114 and 116, when surfaces 114E and 116E are bonded, as illustrated in FIGS. 1B-1C and FIGS. 2A-2C.

In at least one embodiment, process of bonding conductive layers 114 and 116 can result in structure illustrated in FIG. 2A. Referring again to FIG. 2A, zones 206 and 200 are on opposite sides of interface 117 and zones 206 and 200 are separated from each other by zones 202 and 204. In at least one embodiment, process of bonding two metallic surfaces can provide uniform bonding throughout interface 117. In at least one embodiment, conductive layers 114 and 116 have a combined electrical resistivity of less than 1 mOhm/sq.

Figure 13A:
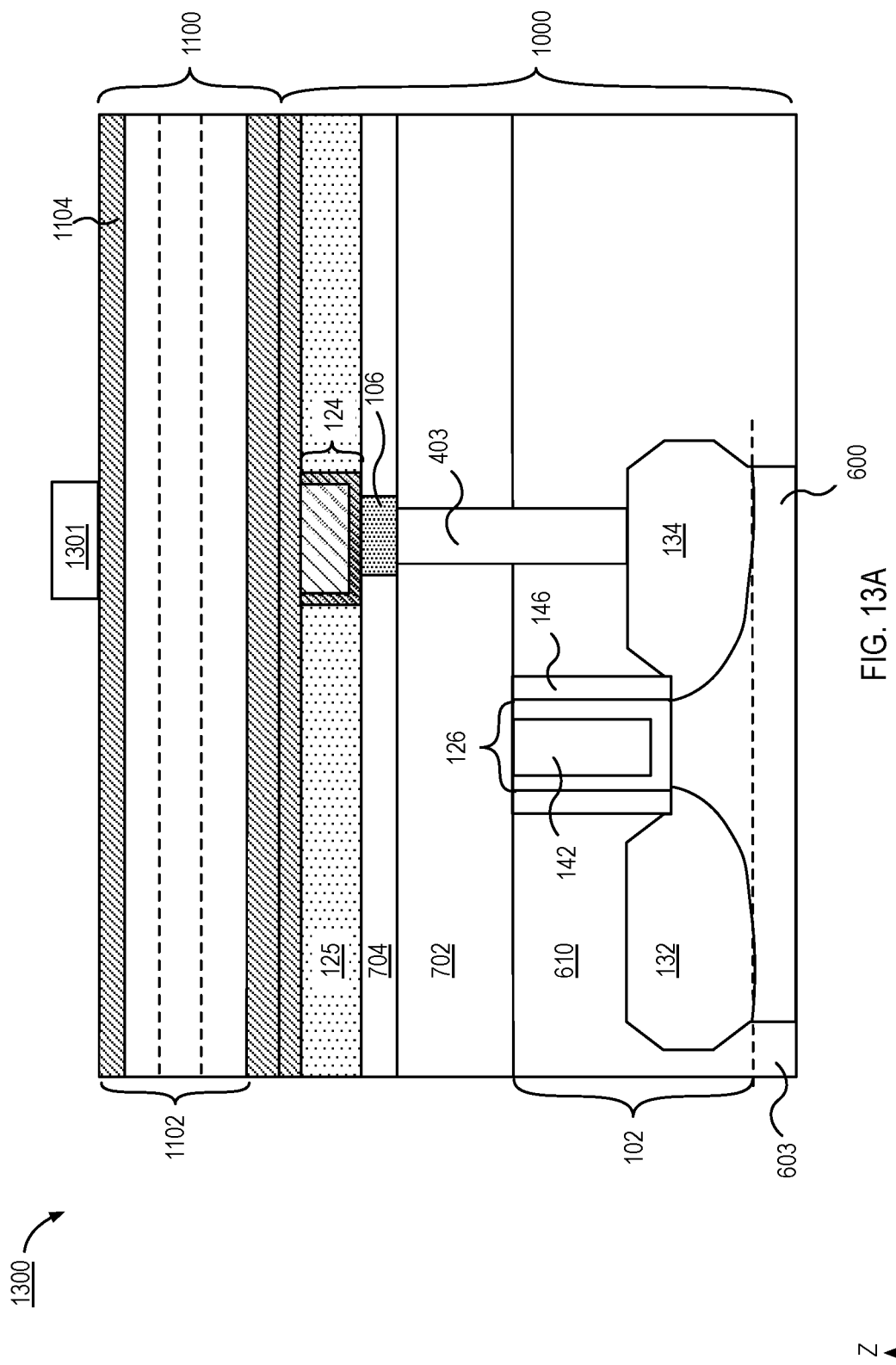
FIG. 13A illustrates a cross-section of structure in FIG. 12A, following process to form a mask by aligning mask with features in first substrate, in at least one embodiment.

FIG. 13A illustrates a cross-section of structure 1300. Structure 1300 illustrates a cross-section of structure in FIG. 12A, following process to form mask 1301, in at least one embodiment. In at least one embodiment, substrate 1103 (FIG. 12A) is removed prior to formation of mask 1301. In at least one embodiment, substrate 1103 is removed by an implant and cleaving process.

In at least one embodiment, multi-layer stack 1102 further includes a release layer between substrate 1103 and layer 1104. In at least one embodiment, $H_2$/He is implanted to target release layer that will separate from substrate 1103 upon annealing. In an embodiment, debonding process is designed to release substrate 1103. In an embodiment, a CMP process may be utilized to planarize and remove release layer and portions of layer 1104, in preparation for masking and etching multi-layer stack 1102.

In at least one embodiment, after cleaving process, portions of multi-layer stack 1102 may be removed by a CMP operation. In at least one embodiment, a portion of layer 1104 is removed by CMP operation after complete removal of substrate 1103 (FIG. 12A). In at least one embodiment, layer 1104 has a sufficient thickness for a hardmask to etch multi-layer stack 1102.

In at least one embodiment, layer 1104 is a bilayer as discussed previously, where upper layer is a dielectric or insulator, and lower layer includes a conductive material. In at least one embodiment, CMP process removes insulator and leaves conductive material. In at least one embodiment, mask 1301 is formed directly on conductive material. In at least one embodiment, mask 1301 is designed to pattern and form a memory device. In at least one such embodiment, mask 1301 is aligned with electrode structure 124.

FIG. 13B illustrates a cross-section of structure in FIG. 13A, following process to etch multi-layer stack 1102 (FIG. 13A) and form memory device 120, in at least one embodiment. In at least one embodiment, a plasma etch process is utilized. In at least one embodiment, plasma etch process may include a discharge produced by a magnetic enhanced reactive ion etching mechanism, an electron cyclotron resonance discharge or an inductively coupled plasma discharge.

Referring collectively to FIGS. 13A and 13B, in at least one embodiment, plasma etch process etches layer 1104 to form mask 1301. In at least one embodiment, mask 1301 may be consumed during plasma etch process or can be removed after forming mask 1301. In at least one embodiment, plasma etch process utilizes mask 1301 to mask and etch conductive layer 1105 to form top electrode 1304. In at least one embodiment, dielectric layer 1106 is etched to form a patterned dielectric layer or dielectric layer 1306, and conductive layer 1107 is etched to form bottom electrode 1308.

In at least one embodiment, process utilized to etch conductive layer to form bottom electrode 1308 may be substantially same as etch process utilized to form top electrode 1304. In at least one embodiment, sidewalls 120A of memory device 120 are substantially vertical with respect to uppermost surface 116F, as shown. In at least one embodiment, sidewalls 120A are tapered as indicated by dashed lines 1309. In at least one embodiment, hardmask 1302 can have a curve upper surface 1303.

In at least one embodiment, an over etch can be performed during plasma etch process to adequately expose conductive layer 116. In at least one embodiment, plasma etch process utilized to form bottom electrode 1308 may be selective to conductive layer 116. In at least one such embodiment, conductive layer 116 may be un-etched.

In at least one embodiment, plasma etch process utilized to form bottom electrode 1308 is not selective to conductive layer 116. In at least one such embodiment, portions of conductive layer 116 may be etched, as shown in FIG. 14A. In least one such embodiment, portions of conductive layer 116 may be etched to from surfaces 116G that are substantially vertical and aligned with sidewalls 120A. In at least one embodiment, plasma etch process can create surfaces 116G that are tapered, as illustrated in FIG. 14B.

In at least one embodiment, depth to which conductive layer 114 and conductive layer 116 can be etched can depend on individual thicknesses of conductive layers 114 and 116. FIG. 14C illustrates a cross-section of a portion of structure in FIG. 13B, where all conductive layer 114 and a portion of conductive layer 116 are etched during process to etch and form memory device 120, in at least one embodiment. In at least one embodiment, etch produces surfaces 116H and 114F that are gradually slanted, as shown. In at least one embodiment, surfaces 116H and 114F can have shape or profile that is like profile of surface 116G, illustrated in FIG. 14A or FIG. 14B.

In at least one embodiment, memory device 120 has a slanted profile (not shown) and conductive layer 114 has a shape as illustrated in FIGS. 14A-14C. In at least one embodiment, memory device 120 has a slanted profile not shown) and conductive layer 116 has a shape as illustrated in FIG. 14C.

FIG. 13C illustrates a cross-section of structure in FIG. 13B following process to form spacer 1312 and plate electrode 112, in at least one embodiment. In at least one embodiment, a plasma etch process may be utilized to etch and form plate electrode 112. In at least one embodiment, after forming bottom electrode 1308, conductive layers 116 and 114 can have one of profiles shown in FIG. 13B, or 14A-14C.

Referring again to FIG. 13C, in at least one embodiment, an encapsulation layer is blanket deposited. In at least one embodiment, thickness of encapsulation layer depends on material utilized, on a height of memory device 120. In at least one embodiment, encapsulation layer is formed on sidewall 120A and on plate electrode 112.

In at least one embodiment, deposition process utilized to deposit encapsulation layer does not include hydrogen or ammonia containing chemicals to prevent hydrogen exposure to layers within memory device 120. In at least one embodiment, depending on a deposition process, encapsulation layer can be deposited by non-hydrogen or ammonia containing chemicals. In at least one embodiment, encapsulation layer can be deposited by a CVD, a PVD, or an ALD process. In at least one embodiment, different deposition processes can have different deposition rates and deposition conformality.

In at least one embodiment, encapsulation layer includes a metal containing insulator material. In at least one embodiment, encapsulation layer includes a metal and oxygen, such as, but not limited to $Al_xO_y$, $HfO_x$, $AlSiO_x$, $ZrO_x$, or $TiO_x$. In at least one embodiment, encapsulation layer can include a metal and nitrogen such as, but not limited to, AlN, ZrN, or HfN. In at least one embodiment, encapsulation layer can include a metal, and both Si and O, such as $AlSiO_x$, $HfSiO_x$, or $TaSiO_x$.

In at least one embodiment, encapsulation layer can be deposited by an ALD process to a thickness in range of 0.5 nm to 10 nm. In at least one embodiment, encapsulation layer can be deposited to a thickness of less than 5 nm. In at least one embodiment, an approximately 2 nm thickness of encapsulation layer comprising a material density of at least 90% can be sufficient to prevent hydrogen diffusion.

After spacer deposition process, in at least one embodiment, encapsulation layer can be etched from surface of conductive layer 116 and from above memory device 120 to form spacer 1312. In at least one embodiment, a plasma etch process is utilized to etch encapsulation layer to form spacer 1312.

In at least one embodiment, conductive layer 114 and conductive layer 116 are preserved after forming bottom electrode 1308. In at least one such embodiment, spacer 1312 may be used as a mask to etch and form plate electrode 112.

In at least one embodiment, sidewall 1312A of spacer 1312 is substantially aligned with sidewalls 112F of plate electrode 112. In at least one embodiment, spacer 1312 is used as a mask to etch conductive layer 114 and conductive layer 116. In at least one embodiment, lateral thickness $W_{PEL}$ of plate electrode 112 is substantially equal to sum of lateral thickness $W_{MD}$ of memory device 120 and two times lateral thickness TEC of spacer 1312.

In at least one embodiment, encapsulation layer may not be etched. In at least one such embodiment, patterning of spacer and conductive layers 114 and 116 may be performed after deposition of a dielectric on encapsulation layer, as will be discussed in FIG. 17A.

In at least one such embodiment, encapsulation layer 1400 (illustrated by dashed lines) can have one or more profiles depicted in FIGS. 14A-14C. In at least one embodiment, encapsulation layer 1400 has a profile that is substantially conformal with sidewalls 120A, and surface 116G, as shown in FIG. 14A. In at least one embodiment, encapsulation layer 1400 has a profile that is substantially conformal with sidewall 120A, and with surface 116G, as shown in FIG. 14B. In at least one embodiment, encapsulation layer 1400 has a profile that is substantially conformal with sidewall 120A, and with surfaces 116G and 114F that are gradually sloped, as shown in FIG. 14C. In at least one embodiment, encapsulation layer 1400 may be etched as discussed above, or can be patterned while etching conductive layers 114 and 116 to form plate electrode, as will be discussed below.

Figure 15A:
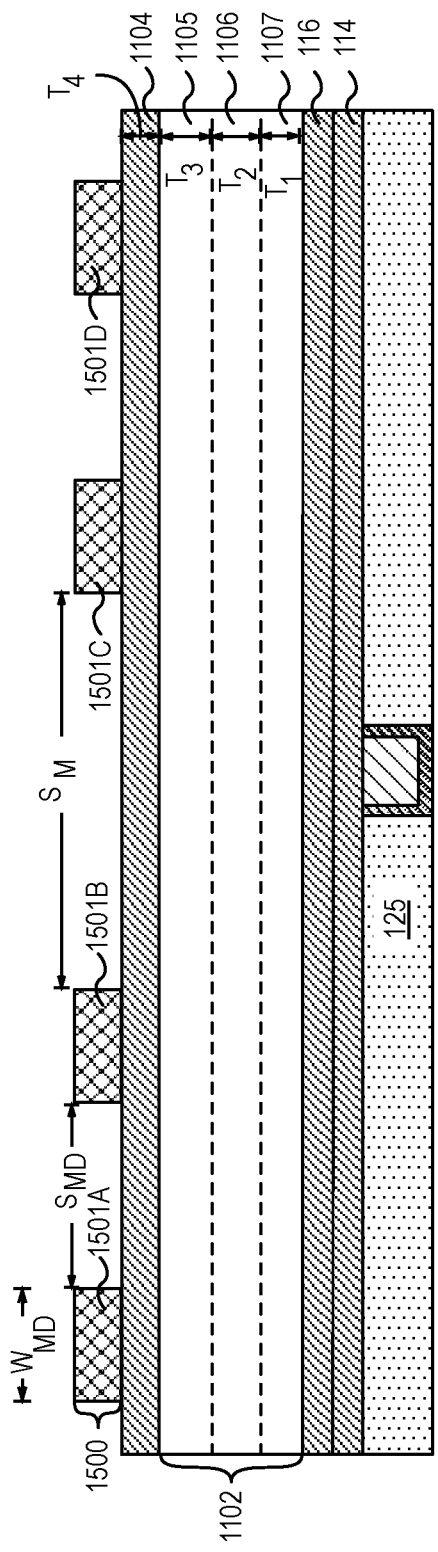
FIG. 15A illustrates a cross-section of a plurality of masks formed above a multi-layer stack formed above an electrode structure, in at least one embodiment.

FIG. 15A illustrates a cross-section of structure 1300 in FIG. 13A following formation of mask 1500, in at least one embodiment. In at least one embodiment, mask 1500 includes a pattern that defines locations for fabricating a plurality memory devices.

In at least one embodiment, mask 1500 is formed by a lithographic technique. In at least one embodiment, mask 1500 includes mask structures 1501A, 1501B, 1501C, and 1501D. In at least one embodiment, mask structures 1501A and 1501B are laterally spaced apart by a distance $S_{MD}$ and mask structures 1501C and 1501D are laterally spaced apart by a distance $S_{MD}$. In at least one embodiment, mask structures 1501B and 1501C are separated by a distance $S_M$. In at least one embodiment, distance $S_M$ is greater than distance $S_{MD}$. In at least one embodiment, distance $S_M$ is less than distance $S_{MD}$. In at least one embodiment, distance $S_M$ is sufficient to form a via electrode on conductive layer 116.

Figure 15B:
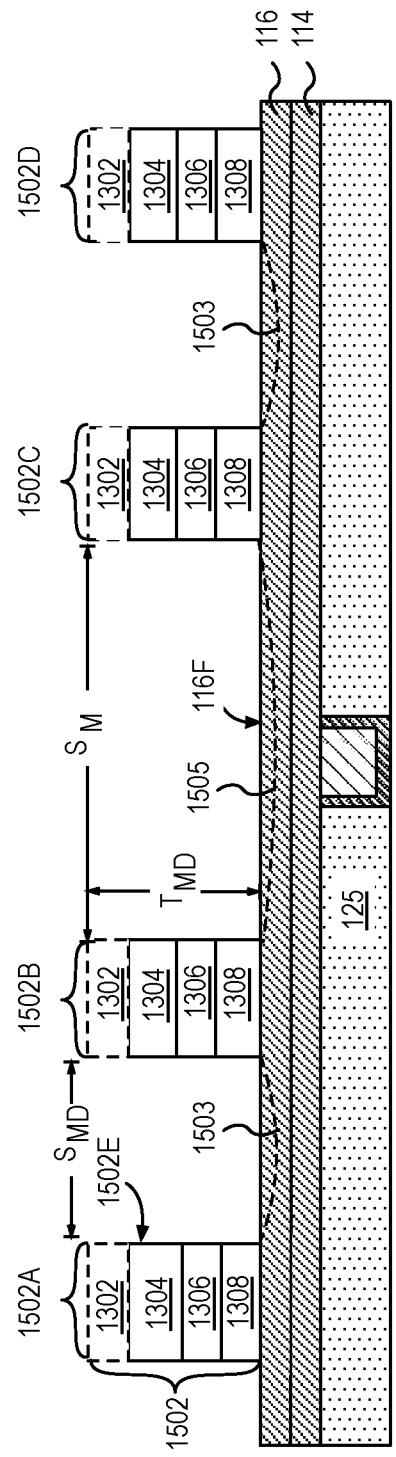
FIG. 15B illustrates a cross-section of structure in FIG. 15A following process to etch multi-layer stack to form a plurality of memory devices, in at least one embodiment.

FIG. 15B illustrates a cross-section of structure in FIG. 15A following process to etch multi-layer stack to form a plurality of memory devices 1502, in at least one embodiment. In at least one embodiment, process to etch multi-layer stack is same or substantially same as process utilized to etch and form memory device 120 in FIG. 13B.

Referring again to FIG. 15B, in at least one embodiment, a plasma etch process is utilized to etch conductive layer to form top electrode 1304, etch dielectric layer to form dielectric layer 1306, conductive layer to form bottom electrode 1308 of individual memory devices 1502A, 1502B, 1502C, and 1502D. In at least one embodiment, hardmask 1302 is formed on top electrode 1304 (dashed lines). In at least one embodiment, when hardmask 1302 includes only a dielectric material, hardmask 1302 may be removed during plasma etch process as indicated by dashed lines.

In at least one embodiment, process of forming memory devices 1502A-D can recess conductive layer 114 as discussed above (FIG. 14A-C). In at least one embodiment, conductive layer 114 is recessed (indicated by dashed lines 1503 and 1505). In at least one embodiment, recess (indicated by dashed lines 1503) between adjacent memory devices 1502A and 1502B or 1502C and 1502D may be greater than recess (indicated by dashed lines 1505) between adjacent memory devices 1502B and 1502C, when $S_{MD}$ is less than $S_M$. In at least one embodiment, sidewall 1502E is substantially vertical, as shown. In at least one embodiment, sidewall 1502E can be tapered relative to uppermost surface 116F.

FIG. 16A illustrates a cross-section of structure in FIG. 15B following process to form encapsulation layer 1600 on memory devices 1502A, 1502B, 1502C, and 1502D, in at least one embodiment. In at least one embodiment, process utilized to deposit encapsulation layer 1600 depends on material utilized, on height of memory devices 1502A-1502D, and on relative spacing between adjacent memory devices 1502. In at least one embodiment, deposition process utilized to deposit encapsulation layer 1600 does not include hydrogen or ammonia containing chemicals to prevent hydrogen exposure to layers within memory devices 1502A-1502D. In at least one embodiment, encapsulation layer 1600 can be deposited by a method utilized to deposit encapsulation layer (FIG. 13C). In general, a combination of ALD, PVD, or CVD processes may be utilized depending on spacing $S_M$ between adjacent memory devices 1502A and 1502B, or between memory devices 1502C and 1502D.

In at least one embodiment, encapsulation layer 1600 is blanket deposited and includes a same or substantially same material as material of encapsulation layer (FIG. 13C). In at least one embodiment, a PVD process may not provide a substantially conformal deposition. In at least one such embodiment, portions of encapsulation layer 1600 adjacent to uppermost surface of memory devices 1502A-1502D can be wider (illustrated by dashed lines 1601) than portions adjacent to lower-most surface of memory devices 1502A-1502D.

A PVD process may not provide a substantially conformal deposition. In at least one embodiment, encapsulation layer 1600 is not deposited with a uniform thickness TEC and portions of encapsulation layer 1600 adjacent to uppermost surface of memory device 1502 are wider (illustrated by dashed lines 1601) than portions adjacent to lowermost surface of memory device 1502.

In at least one embodiment, Sm is approximately equal to two times TEC, as shown in FIG. 16B. In at least one such embodiment, encapsulation layer 1600 formed on sidewalls 1502E of two adjacent memory devices, such as memory devices 1502A and 1502B, can merge. In at least one embodiment, sidewalls 1502E face each other and encapsulation layer 1600 formed on sidewalls 1502E are substantially conformal with sidewalls 1502E and merged portion includes no defects or voids. In at least one such embodiment, an ALD deposition process can be used to provide uniform coverage.

In at least one embodiment, encapsulation layer 1600 is etched to form a spacer, as illustrated in FIG. 16C. In at least one such embodiment, encapsulation layer 1600 is removed from uppermost surface 1502F and from uppermost surface 116F of conductive layer 116.

Figure 17A:
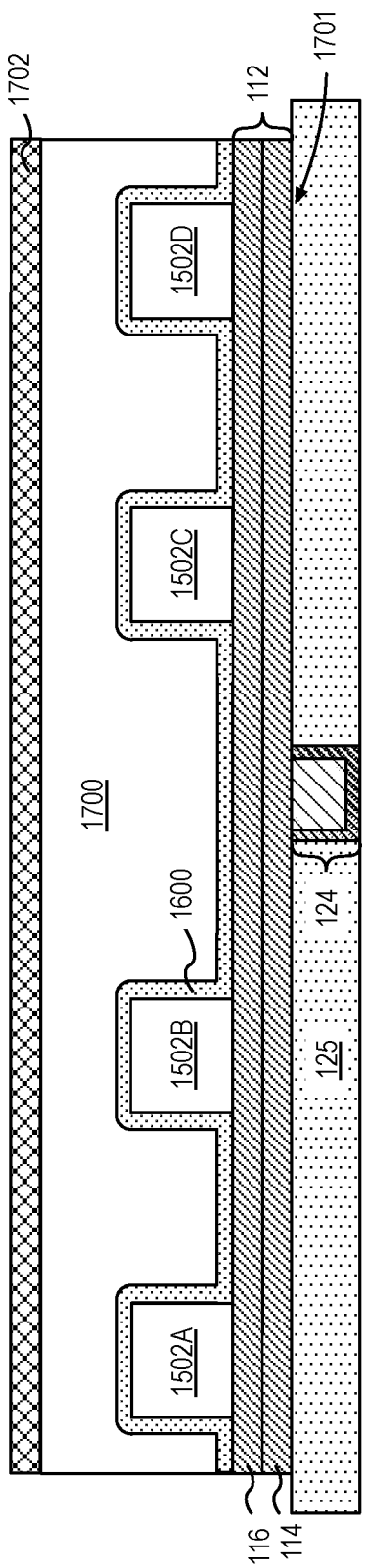
FIG. 17A illustrates a cross-section of structure in FIG. 16A, following process to etch first conductive layer and second conductive layer to form a plate electrode, in at least one embodiment.

FIG. 17A illustrates a cross-section of structure in FIG. 16A, following process to etch conductive layers 114 and 116 to form plate electrode 112, in at least one embodiment. In an embodiment, dielectric 1700 is deposited on surface of encapsulation layer 1600. In at least one embodiment, dielectric includes silicon and one or more of oxygen, nitrogen, or carbon. In at least one embodiment, dielectric 1700 includes a material that is different from material of encapsulation layer 1600. In at least one embodiment, a planarization process is performed after deposition of dielectric 1700. In at least one embodiment, mask 1702 is formed on dielectric 1700. In at least one embodiment, dielectric 1700 and encapsulation layer 1600 are sequentially etched by a plasma etch process.

In at least one embodiment, mask 1702 can be removed prior to etching conductive layer 116 and conductive layer 114. In at least one such embodiment, dielectric 1700 and encapsulation layer 1600 act as a mask to etch conductive layers 114 and 116 to form plate electrode 112. In at least one embodiment, mask 1702 defines a shape of plate electrode 112.

In at least one embodiment, etching of plate electrode 112 exposes etch stop layer 125. In at least one embodiment, plasma etch does not recess etch stop layer 125. In at least one embodiment, portions of etch stop layer 125 can be recessed relative to interface 1701 between conductive layer 114 and etch stop layer 125.

Figure 17B:
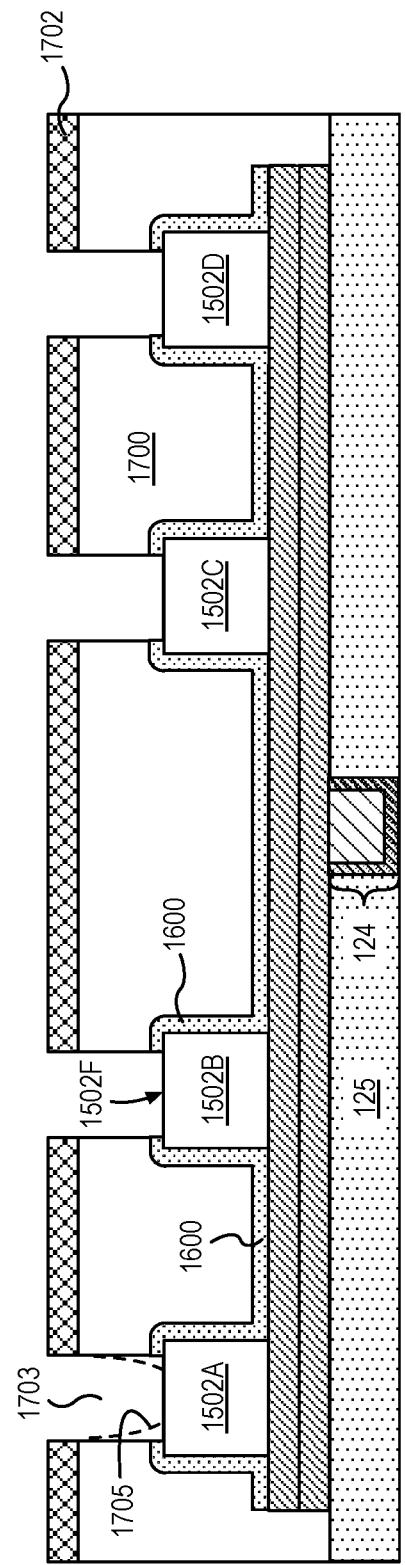
FIG. 17B illustrates a cross-section of structure in FIG. 17A, following process to form openings above a respective memory device, in at least one embodiment.

FIG. 17B illustrates a cross-section of structure in FIG. 17C, following process to form opening 1703 in dielectric 1700 above individual memory devices 1502A-D, in at least one embodiment. In at least one embodiment, a mask 1702 is formed above dielectric 1700 and a plasma etch process is utilized to etch opening 1703 in dielectric 1700. In at least one embodiment, plasma etch process etches portions of encapsulation layer 1600 after etching dielectric 1700 and exposes uppermost surface 1502F of memory devices 1502A-D.

In at least one embodiment, openings are substantially vertical as shown. In at least one embodiment, walls of dielectric 1700 in opening 1703 are slanted as indicated by dashed lines 1705.

FIG. 17C illustrates a cross-section of structure in FIG. 17B, following process to deposit one or more materials in opening 1703, in at least one embodiment. In at least one embodiment, conductive hydrogen barrier material 1704 is blanket-deposited into opening 1703, on memory devices 1502A-D and on sidewall of dielectric 1700 in opening 1703. In at least one embodiment, conductive hydrogen barrier material 1704 includes a material that is chemically compatible with dielectric 1700 so that interface 1709 between conductive hydrogen barrier material 1704 and dielectric 1700 is not a source of dislocations.

In at least one embodiment, liner layer material 1706 is blanket deposited in opening 1703, and on conductive hydrogen barrier material 1704. In at least one embodiment, a layer of conductive fill material 1708 is deposited into remaining portions of opening 1703 on liner layer material 1706. In at least one embodiment, conductive hydrogen barrier material 1704, liner layer material 1706, and layer of conductive fill material 1708 are deposited by an ALD, a PVD, or a sputter deposition process.

In at least one embodiment, conductive hydrogen barrier material 1704 includes a material that is amorphous. In at least one embodiment, amorphous materials lack defined grain boundaries that can facilitate hydrogen diffusion and may be useful to form a via electrode. In at least one embodiment, conductive hydrogen barrier material 1704 includes materials such as, but not limited to: TiAlN, with >30 atomic percent AlN; TaN, with >30 atomic percent $N_2$; TiSiN, with >20 atomic percent SiN; tantalum carbide (TaC), titanium carbide (TiC); tungsten carbide (WC); tungsten nitride (WN); carbonitrides of Ta, Ti, W, TaCN, TiCN, WCN; titanium monoxide (TiO or $Ti_2O$); tungsten oxide ($WO_3$); tin oxide ($SnO_2$); indium tin oxide (ITO); iridium oxide ($IrO_2$); indium gallium zinc oxide (IGZO); and zinc oxide or METGLAS series of alloys, e.g., $Fe_{40}Ni_{40}P_{14}B_6$. In at least one embodiment, conductive hydrogen barrier material 1704 is deposited to a thickness that is less than 2 nm. In at least one embodiment, liner layer material 1706 includes Ti, Ta, TiN, TaN, Ru, or any other conductive material that can provide adhesion for conductive fill material 1708. In an embodiment, conductive fill material 1708 includes tantalum, titanium, ruthenium, tungsten, molybdenum, or copper.

In at least one embodiment, liner layer material 1706 may not be deposited. In at least one such embodiment, layer of conductive fill material 1708 is directly deposited onto conductive hydrogen barrier material 1704.

FIG. 17D illustrates a cross-section of structure in FIG. 17C following a process to form via electrode 1710 on respective memory devices 1502A-D, in at least one embodiment. In at least one embodiment, a planarization process is utilized. In at least one embodiment, planarization process includes a chemical mechanical planarization (CMP) process.

Collectively referring to FIGS. 17C and 17D, in at least one embodiment, CMP process removes layer of conductive fill material 1708, liner layer material 1706, and conductive hydrogen barrier material 1704 from uppermost surface 1700A of dielectric 1700. In at least one embodiment, CMP process isolates conductive hydrogen barrier material 1704 to form conductive hydrogen barrier 1712, CMP process isolates liner layer material 1706 to form liner layer 1714 and CMP process isolates layer of conductive fill material 1708 to form conductive fill 1716. In at least one embodiment, CMP process may also reduce as-deposited thickness of dielectric 1700.

FIG. 17E illustrates a cross-section of structure in FIG. 17D, following process to form a signal electrode 1718, in at least one embodiment. In at least one embodiment, opening 1719 is formed in dielectric 1700 by forming a mask above dielectric 1700 and via electrode 1710. In at least one embodiment, opening 1719 also extends through encapsulation layer 1600 and can be formed by a plasma etch process.

In at least one embodiment, two or more materials are deposited into opening 1719, on dielectric 1700 and on via electrode 1710. In at least one embodiment, liner layer 1721 is deposited on plate electrode 112 and conductive fill material 1722 is deposited on liner layer 1721. In at least one embodiment, liner layer 1721 includes a material that is same or substantially same as material of liner layer 1714. In at least one embodiment, conductive fill material includes a material that is same or substantially same as material of conductive fill 1716.

In at least one embodiment, a planarization process includes a chemical mechanical planarization (CMP) process. In at least one embodiment, CMP process removes portions of conductive fill material 1722 and liner layer 1721 from uppermost surface 1700A to form signal electrode 1718.

FIG. 17F illustrates a cross-section of structure 1720, in at least one embodiment. In at least one embodiment, structure 1720 illustrates a cross-section of structure in FIG. 17E, following process to form routing structure 1724 on individual via electrodes 1710 and routing structure 1726 on signal electrode 1718, in at least one embodiment. In at least one embodiment, dielectric 1728 is deposited on uppermost surface 1700A and on via electrodes 1710. In at least one embodiment, dielectric 1728 can include a material that is same or substantially same as material of dielectric 1700. In at least one embodiment, a plurality of openings is formed in dielectric 1728 by a process of masking and etching (as described above). In at least one embodiment, an etch process forms openings that exposes uppermost surfaces of via electrodes 1710 and signal electrode 1718. In at least one embodiment, etch process exposes uppermost surfaces 1718A of signal electrode 1718 and uppermost surface 1710A of via electrode 1710 simultaneously.

In at least one embodiment, a conductive material is deposited on via electrodes 1710 and on signal electrode 1718. In at least one embodiment, conductive material is also deposited on uppermost surface 1728A.

In at least one embodiment, a planarization process can be performed to planarize and remove conductive material from above uppermost surface 1728A. In at least one embodiment, planarization process includes a chemical mechanical planarization process. In at least one embodiment, routing structures 1724 and 1726 have a vertical thickness that depends on vertical thickness $T_{1730}$ of level 1730.

In at least one embodiment, routing structures 1724 above individual memory devices 1502A-D are coupled with separate circuit elements. In at least one such embodiment, coupling with separate circuit elements can enable separate programming of individual memory devices 1502A-D.

Figure 18A:
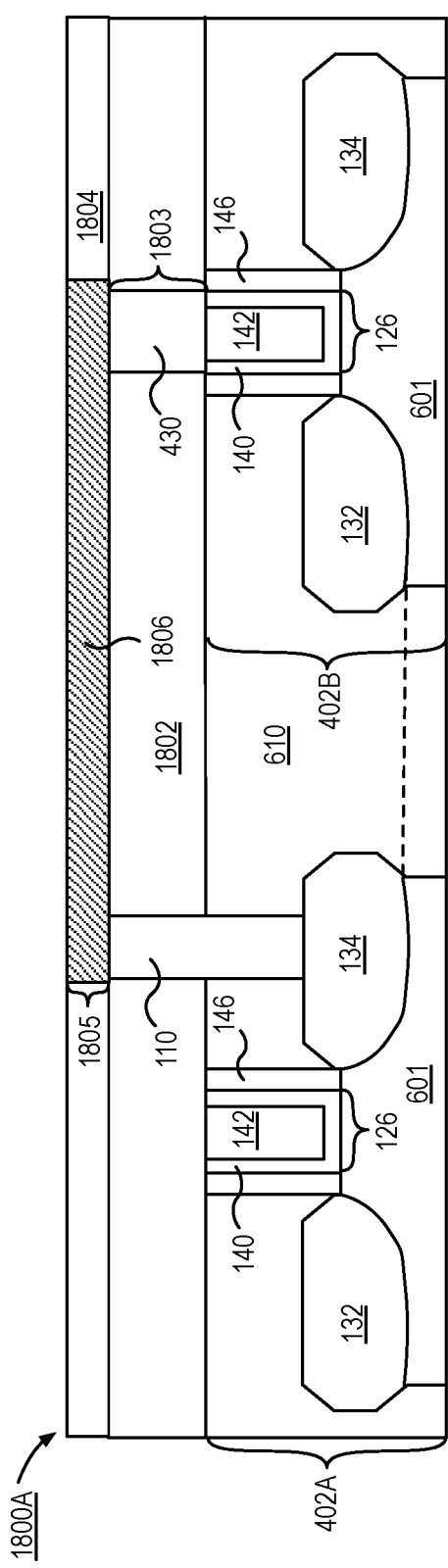
FIG. 18A illustrates a cross-section of pair of transistors formed above a first substrate, and a bridge structure formed above pair of transistors, in at least one embodiment.

FIG. 18A illustrates a cross-section of wafer 1800A, including a plurality of transistors such as transistors 402A and 402B. In at least one embodiment, transistors 402A and 402B are formed above substrate 601. In at least one embodiment, transistors 402A and 402B include properties described above (FIG. 4). In at least one embodiment, transistors 402A and 402B are formed adjacent to each other and separated by dielectric 610. In at least one embodiment, transistors 402A and 402B are co-fabricated on substrate 601 by a method like that described in association with FIGS. 6A-7A.

Referring again to FIG. 18A, in at least one embodiment, after fabrication of transistors 402A and 402B and deposition of dielectric 1802, gate contact 430 is fabricated on gate electrode 142 of transistor 402B. In at least one embodiment, gate contact 430 can be fabricated by a process that is like process utilized to fabricate drain contact 110 described above (in association with FIG. 7A). In at least one embodiment, a mask is formed on dielectric 1802 and opening 1803 is etched in dielectric 1802, above gate electrode 142. In at least one embodiment, gate contact material is deposited into opening 1803, on gate electrode 142 and on dielectric 1802. In at least one embodiment, gate contact material is also deposited on a portion of gate dielectric layer 140. In at least one embodiment, excess gate contact material is removed from above dielectric 1802 by a planarization process such as CMP to form gate contact 430. In at least one embodiment, gate contact includes a same material as material of drain contact 110.

In at least one embodiment, bridge structure 1806 is fabricated above transistors 402A and 402B, as shown. In at least one embodiment, dielectric 1804 is blanket deposited on dielectric 1802, on gate contact 430 and on drain contact 110. In at least one embodiment, dielectric 1804 includes a material that is same or substantially same as material of dielectric 1802 or dielectric 410 (FIG. 4).

In at least one embodiment, a mask is formed on dielectric 1804 and opening 1805 is etched in dielectric 1804. In at least one embodiment, opening 1805 extends above gate contact 430 and drain contact 110 and exposes portions of dielectric 1802. In at least one embodiment, conductive material is deposited into opening 1805, on gate contact 430, drain contact 110, on dielectric 1802 and on sidewalls and upper surfaces of dielectric 1804. In at least one embodiment, a CMP process is utilized to remove excess conductive material from above dielectric 1804 and forms bridge structure 1806. In at least one embodiment, conductive material includes a material that is same or substantially same as material of gate contact 430 and/or drain contact 110. In at least one embodiment, bridge structure 1806 extends partially above transistors 402A and 402B.

Figure 18B:
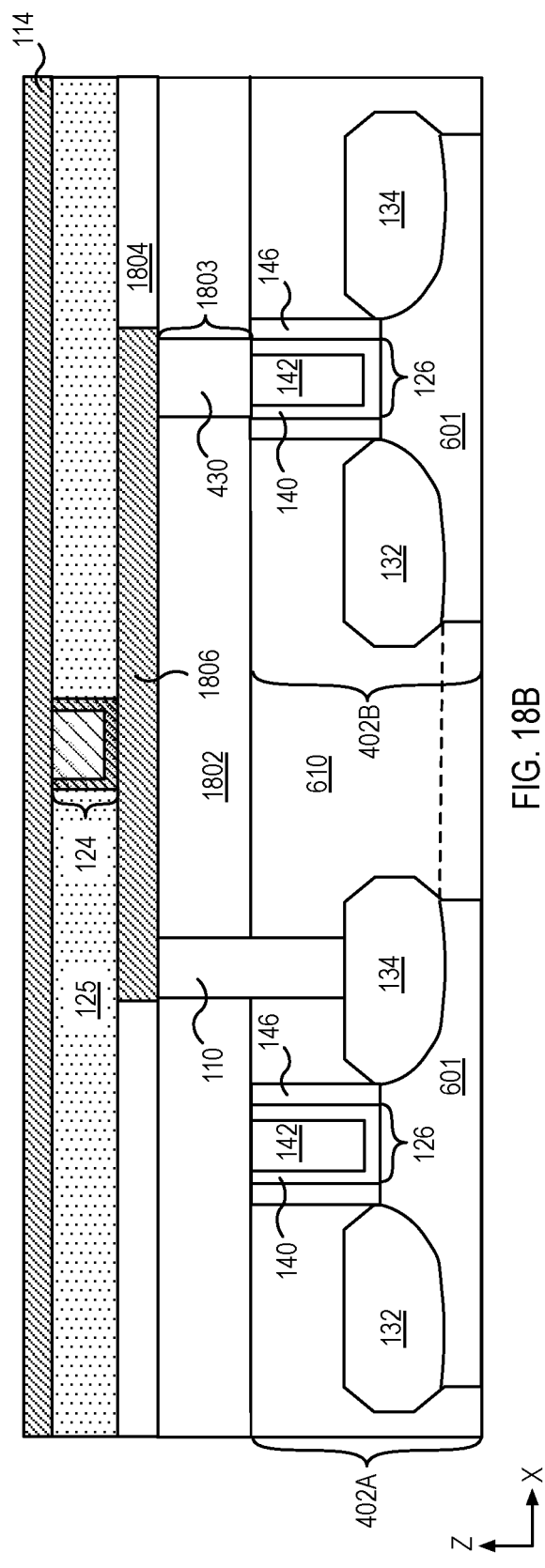
FIG. 18B illustrates a cross-section of structure in FIG. 18A following formation of at least one electrode structure coupled with bridge structure, in at least one embodiment.

FIG. 18B illustrates a cross-section of wafer 1800B, in accordance with at least one embodiment. In at least one embodiment, wafer 1800B illustrates a cross-section of structure in FIG. 18A following formation of electrode structure 124. In at least one embodiment, etch stop layer 125 is blanket deposited on dielectric 1804 and on bridge structure 1806. In at least one embodiment, materials and methods utilized to deposit etch stop layer 125 are described above (FIG. 8).

In at least one embodiment, electrode structure 124 is formed within etch stop layer 1810 by one or more methods described above (FIGS. 9A-D). In at least one embodiment, conductive layer 114 is blanket deposited on electrode structure 124 by a PVD, CVD, ALD, or PEALD process.

Figure 18C:
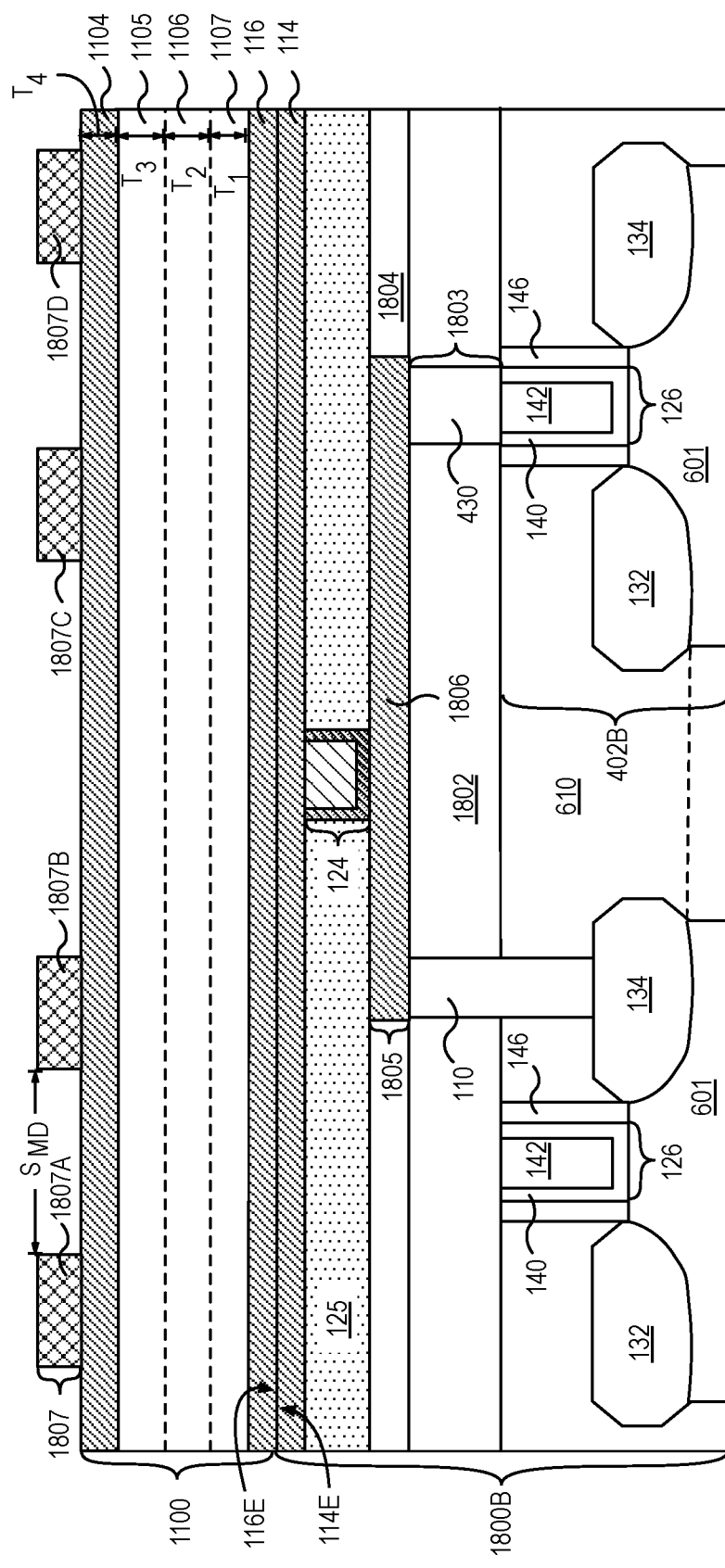
FIG. 18C illustrates a cross-section of structure in FIG. 18B following process to bond a first conductive layer formed above first substrate with a second conductive layer formed above a first multi-layer stack, where first multi-layer stack is formed above a second substrate, in at least one embodiment.

FIG. 18C illustrates a cross-section of structure in FIG. 18B following process to bond conductive layer 114 with conductive layer 116, in at least one embodiment. In at least one embodiment, wafer 1800B is bonded with wafer 1100 (FIG. 11). In an embodiment, bonding process brings into contact surface 114E of conductive layer 114 (wafer 1800B) with surface 116E of conductive layer 116 (wafer 1100). In at least one embodiment, conductive layer 114 and conductive layer 116 are prepared and bonded together by a method described above (FIGS. 10A, 11, and 12A). In at least one embodiment, interface 117 formed between conductive layer 114 and conductive layer 116 has one or more properties described above (FIGS. 1B-C, and FIGS. 2A-C).

After bonding, substrate 1103 is removed and mask 1807 is formed on layer 1104, in at least one embodiment. In at least one embodiment, mask 1807 is formed by a lithographic process. In at least one embodiment, mask 1807 includes mask portions 1807A, 1807B, 1807C and 1807D which are utilized to define a shape, size, and location of memory devices to be formed relative to transistors 402A and 402B. In at least one embodiment, mask portion 1807A is separated from mask portion 1807B by distance $S_{MD}$. In at least one embodiment, mask portion 1807C is separated from mask portion 1807D by distance $S_{MD}$. In at least one embodiment, distance $S_{MD}$ is sufficient to form an encapsulation layer or a spacer adjacent to sidewall of memory devices.

Figure 18D:
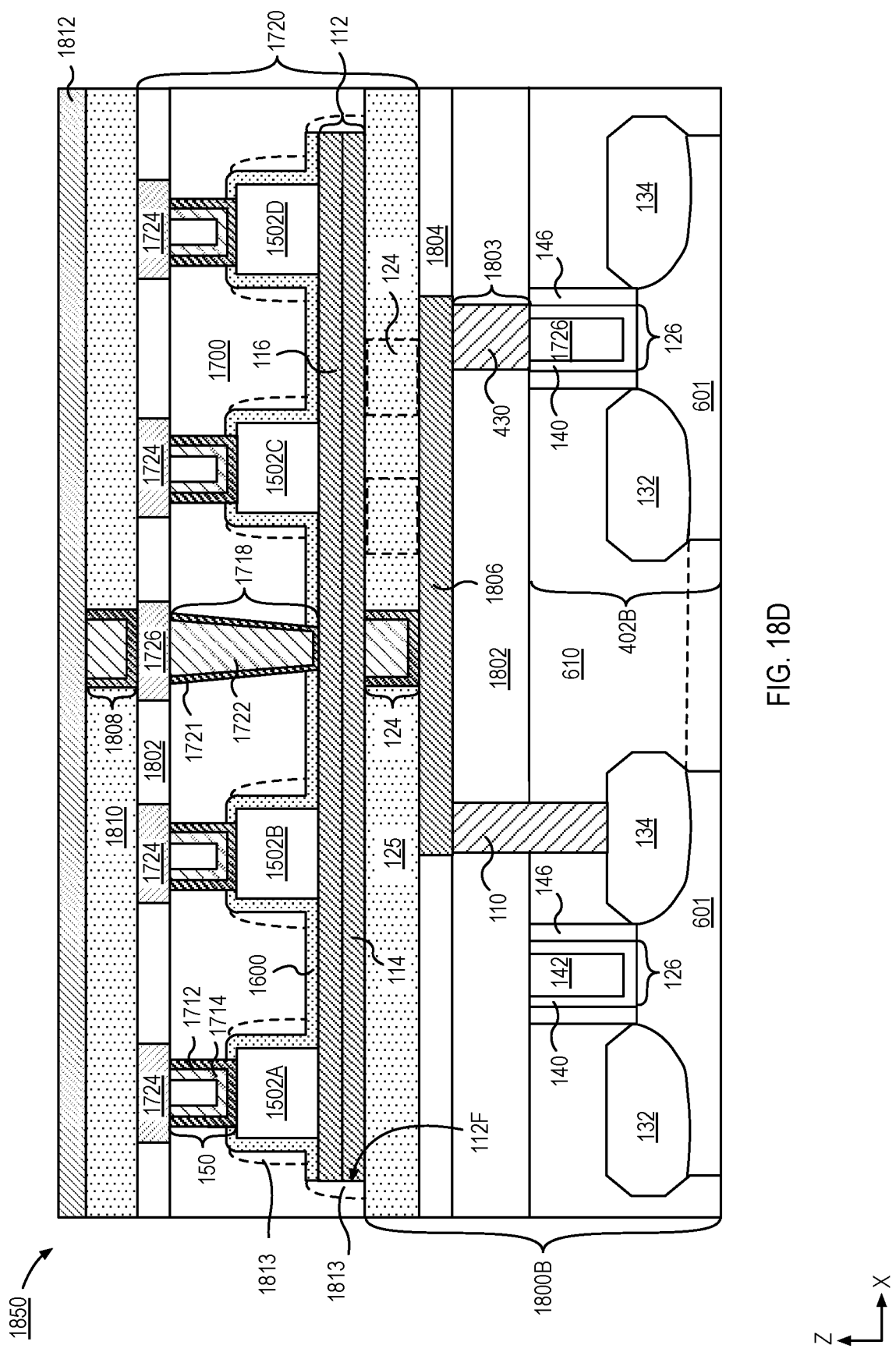
FIG. 18D illustrates a cross-section of structure in FIG. 18C following process to pattern first multi-layer stack to fabricate a first layer of memory devices above pair of transistors, in at least one embodiment.

FIG. 18D illustrates a cross-section of structure in FIG. 18C following process to fabricate memory devices 1502A-D, via electrode 150, routing structures 1724 and 1726, and electrode structure 1808, in at least one embodiment. In at least one embodiment, multi-layer stack 1102 (FIG. 18C) is patterned to form memory devices 1502A, 1502B, 1502C, and 1502D by one or more methods described above. In at least one embodiment, encapsulation layer 1600 is deposited on memory devices 1502A, 1502B, 1502C, and 1502D. In at least one embodiment, conductive layer 114 and conductive layer 116 are patterned to form plate electrode 112. In at least one embodiment, via electrode 150 is formed above individual memory devices 1502A, 1502B, 1502C, and 1502D. In at least one embodiment, signal electrode 1718 is formed on plate electrode 112. In at least one embodiment, routing structures 1724 and 1726 are formed on via electrode 150 and on signal electrode 1718, respectively. In at least one embodiment, process to fabricate components of structure 1720 are described above (FIGS. 15B-17F).

In at least one embodiment, a single electrode structure such as electrode structure 124 is coupled between bridge structure 1806 and plate electrode 112. In at least one embodiment, a plurality of electrode structures can be coupled between bridge structure 1806 and plate electrode 112, indicated by dashed lines. In at least one embodiment, a plurality of electrode structures can increase electrical conductivity between plate electrode 112 and bridge structure 1806. In at least one embodiment, electrode structures coupled between bridge structure 1806 and plate electrode 112 can include a same material composition. In at least one embodiment, electrode structure can include materials that are different from material of bridge structure 1806 (e.g., copper).

In at least one embodiment, electrode structure 1808 is formed on a level above routing structures 1724 and 1726. In at least one embodiment, etch stop layer 1810 is deposited on routing structures 1724 and 1726, and on dielectric 1802. In at least one embodiment, electrode structure 1808 is fabricated within etch stop layer 1810 by a method that is like method utilized to fabricate electrode structure 124. In at least one embodiment, electrode structure 1808 is coupled with routing structure 1726. In at least one embodiment, a single electrode structure, such as electrode structure 1808 is fabricated.

In at least one embodiment, electrode structure 1808 is coupled between routing structure 1726 and conductive layer 1812. In at least one embodiment, routing structures 1724 can be electrically coupled with separate circuit elements, though individual electrode structures, in a plane that is in front or behind plane of figure.

In at least one embodiment, to prepare for a bonding process, conductive layer 1812 is deposited on electrode structure 1808 and on etch stop layer 1810. In at least one embodiment, deposition of conductive layer 1812 includes depositing a material that is same or substantially same as conductive layer 114. In at least one embodiment, after deposition, one or more methods of preparing conductive layer 1812 for bonding with a conductive layer on a separate wafer can be performed (as described in FIGS. 10A-D). In at least one embodiment, conductive layer 1812 can be planarized by a CMP process.

In at least one embodiment, one or more layers of memory devices can be formed above memory devices 1502A-D. In at least one embodiment, one or more layers of memory devices can be formed by forming a multi-layer stack on a separate substrate and then bonding with structure 1850. In at least one embodiment, it is useful to form a multi-layer stack on a separate substrate to prevent exposure of transistors 402A and 402B to high temperature multi-layer stack deposition process.

In at least one embodiment, after patterning to form plate electrode 112 and prior to deposition of dielectric 1700, spacer 1813 (indicated by dashed lines) can be formed adjacent to sidewalls 112F and adjacent to encapsulation layer 1600. In at least one embodiment, an encapsulation layer may be blanket deposited on encapsulation layer 1600 and then etched to form spacer 1813 In at least one embodiment, portions 1600A of encapsulation layer 1600 that is formed on conductive layer 116 can be recessed while forming spacer 1813.

Figure 18E:
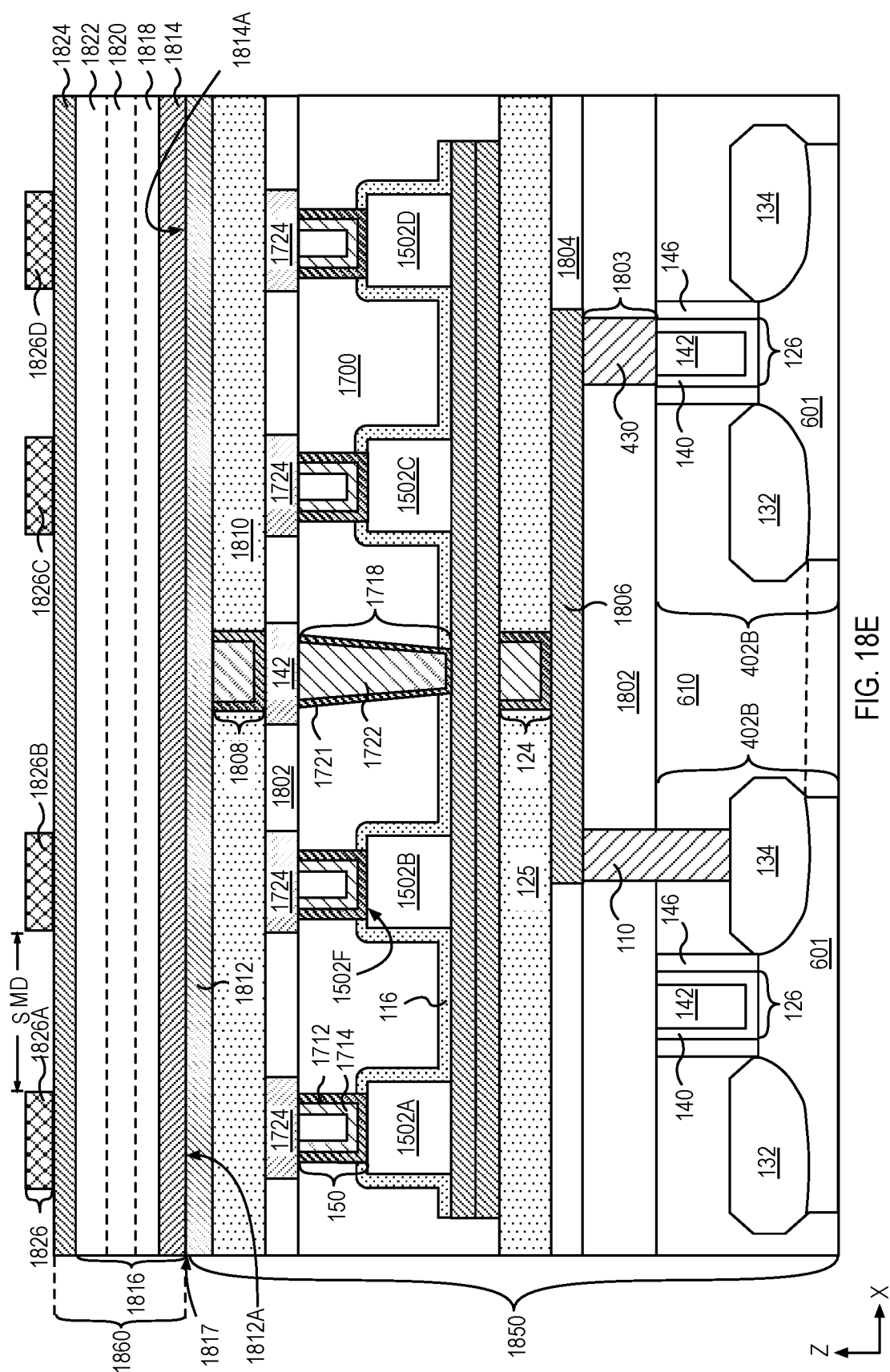
FIG. 18E illustrates a cross-section of structure in FIG. 18D following process to bond a third conductive layer formed above memory devices with a fourth conductive layer formed above a second multi-layer stack, where second multi-layer stack is formed above a third substrate, in at least one embodiment.

FIG. 18E illustrates a cross-section of structure in FIG. 18D following process to bond conductive layer 1812, formed above transistors 402A and 402B, with conductive layer 1814 of wafer 1860, in at least one embodiment. In at least one embodiment, wafer 1860 can be fabricated identically or substantially identically to wafer 1100 (FIG. 11). In at least one embodiment, multi-layer stack 1816 includes one or more layers that are same or substantially same as layers of multi-layer stack 1102 (FIG. 11 or 18C). In at least one embodiment, conductive layer 1818 includes a material that is same or substantially same as material of conductive layer 1107. In at least one embodiment, conductive layer 1822 includes a material that is same or substantially same as material of conductive layer 1105. In at least one embodiment, dielectric layer 1820 includes a material that is same or substantially same as material of dielectric layer 1106. In at least one embodiment, layer 1824 includes a material that is same or substantially same as material of layer 1104.

In at least one embodiment, conductive layer 1812 and conductive layer 1814 are prepared and bonded together by one or more methods described above (FIGS. 10A, 11, and 12A). In an embodiment, bonding process brings surface 1814A of conductive layer 1814 into contact with surface 1812A of conductive layer 1812.

In at least one embodiment, interface 1817 formed between conductive layers 1812 and 1814 has one or more properties described above (FIGS. 1B-C and FIGS. 2A-C). In at least one embodiment, bonding process is performed at temperatures lower than those required to form transistors 402A and 402B. In at least one embodiment, after bonding process, substrate of wafer 1860 is removed and layer 1824 can be planarized before further processing.

In at least one embodiment, mask 1826 is formed on layer 1824. In at least one embodiment, mask 1826 is formed by a lithographic process and includes mask portions 1826A, 1826B, 1826C, and 1826D which are utilized to define a shape, size, and location of memory devices to be formed relative to memory devices 1502A-D. In at least one embodiment, mask portions 1826A, 1826B, 1826C, and 1826D are aligned in x and y directions with memory devices 1502A, 1502B, 1502C, and 1502D, respectively. In at least one embodiment, mask portions 1826A and 1826B are separated by distance $S_{MD}$. In at least one embodiment, distance $S_{MD}$ is utilized to form spacer adjacent to sidewall of memory devices to be formed.

Figure 18F:
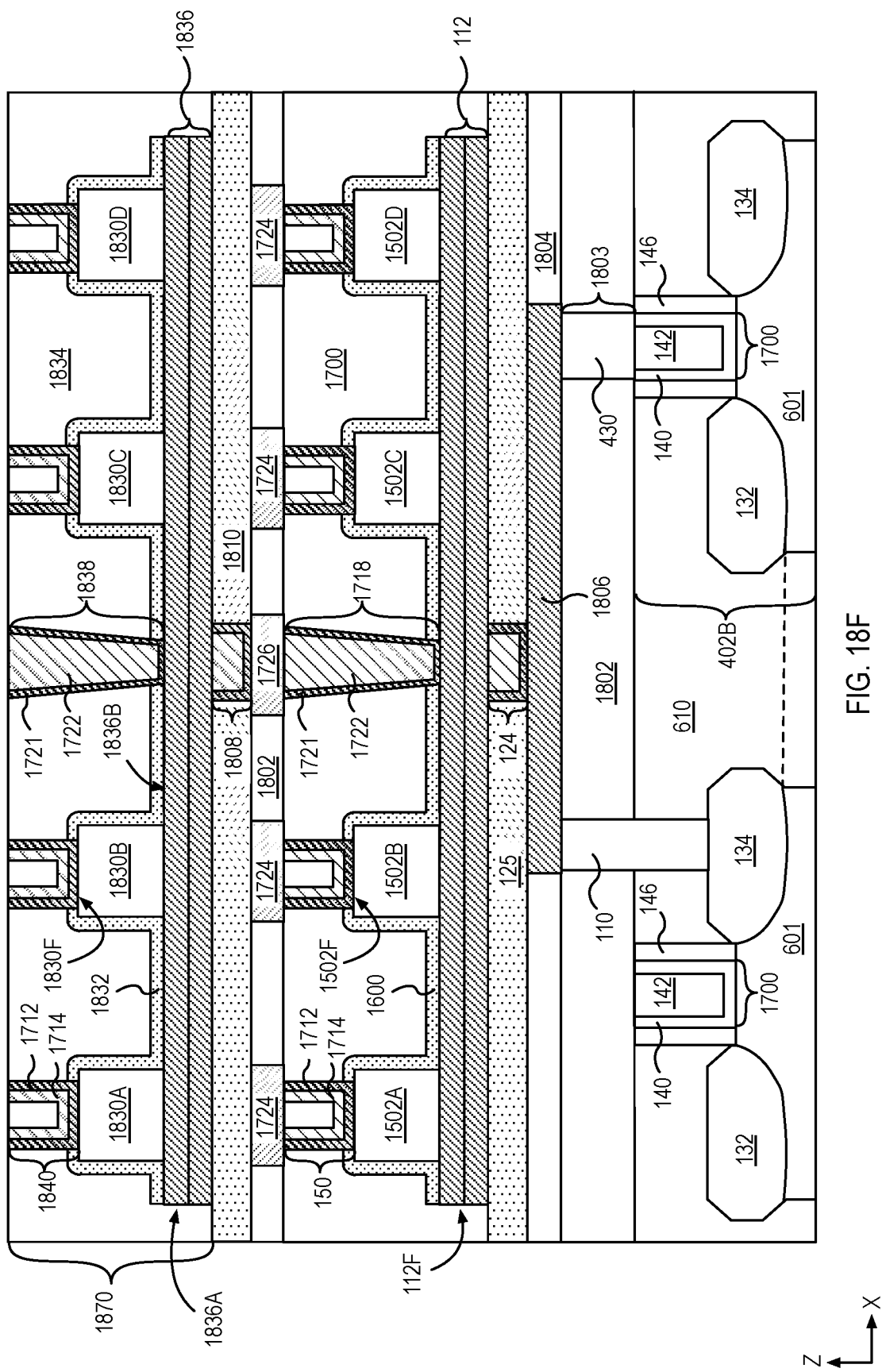
FIG. 18F illustrates a cross-section of structure in FIG. 18E following process to form a second layer of memory devices coupled with a second plate electrode above first layer of memory devices, in at least one embodiment.

FIG. 18F illustrates a cross-section of structure in FIG. 18E following process to fabricate structure 1870 above memory devices 1502A-D, respectively, in accordance with at least one embodiment. In at least one embodiment, method utilized to fabricate structure 1870 is same or substantially same as method utilized to fabricate components of structure 1720 (FIG. 17F).

In at least one embodiment, multi-layer stack 1816 (FIG. 18E) is etched to form memory devices 1830A, 1830B, 1830C, and 1830D. In at least one embodiment, memory devices 1830A, 1830B, 1830C, and 1830D are aligned with respective memory device 1502A, 1502B, 1502C, and 1502D.

In at least one embodiment, encapsulation layer 1832 is deposited on memory devices 1830A-D. In at least one embodiment, encapsulation layer 1832 includes a material that is same or substantially same as material of encapsulation layer 1600. In at least one embodiment, dielectric 1834 is deposited on encapsulation layer 1832. In at least one embodiment, a mask is utilized to etch dielectric 1834 and encapsulation layer 1832, and conductive layers 1812 and 1814. In at least one embodiment, conductive layers 1812 and 1814 are patterned to form plate electrode 1836 that has a same shape as plate electrode 112. In at least one embodiment, sidewall 1836A is aligned with sidewall 112F. In at least one embodiment, plate electrode 1836 comprises of a plurality of portions, where individual portions are formed under individual memory devices 1830A-D. In at least one such embodiment, one or more memory devices 1830A-D can be uncoupled from transistors 402A and 402B.

In at least one embodiment, signal electrode 1838 is formed on plate electrode 1836. In at least one embodiment, signal electrode 1838 is formed by a method that is same or substantially same as method utilized to form signal electrode 1718. In at least one embodiment, signal electrode 1838 is coupled with bridge structure 1806 through plate electrodes 1836 and 112 and through electrode structures 1808 and 124.

In at least one embodiment, individual via electrodes 1840 are formed above individual memory devices 1830A-D. In at least one embodiment, via electrodes 1840 are formed by a method that is same or substantially same as method utilized to form via electrode 150. In at least one such embodiment, encapsulation layer 1832 is etched and removed from uppermost surface 1830F and from uppermost surface 1836B of plate electrode 1836. In at least one embodiment, after forming routing structures above via electrodes 1840 and signal electrode 1838, process described above can be repeated to stack further one or more levels of memory devices to increase memory density.

In at least one embodiment, memory regions can be separated from logic regions for device operation. In at least one embodiment, method to form memory devices and plate electrode described in association with FIGS. 15A-18C can be adopted, after bonding process, to create a multi-layer stack coupled with one or more transistors.

In at least one embodiment, after patterning to form plate electrode 1836, but prior to deposition of dielectric 1834, a spacer can be formed on sidewalls of plate electrode 1836 and on portions of encapsulation layer 1832 by a method similar to formation of spacer 1813 in FIG. 18D.

Figure 19A:
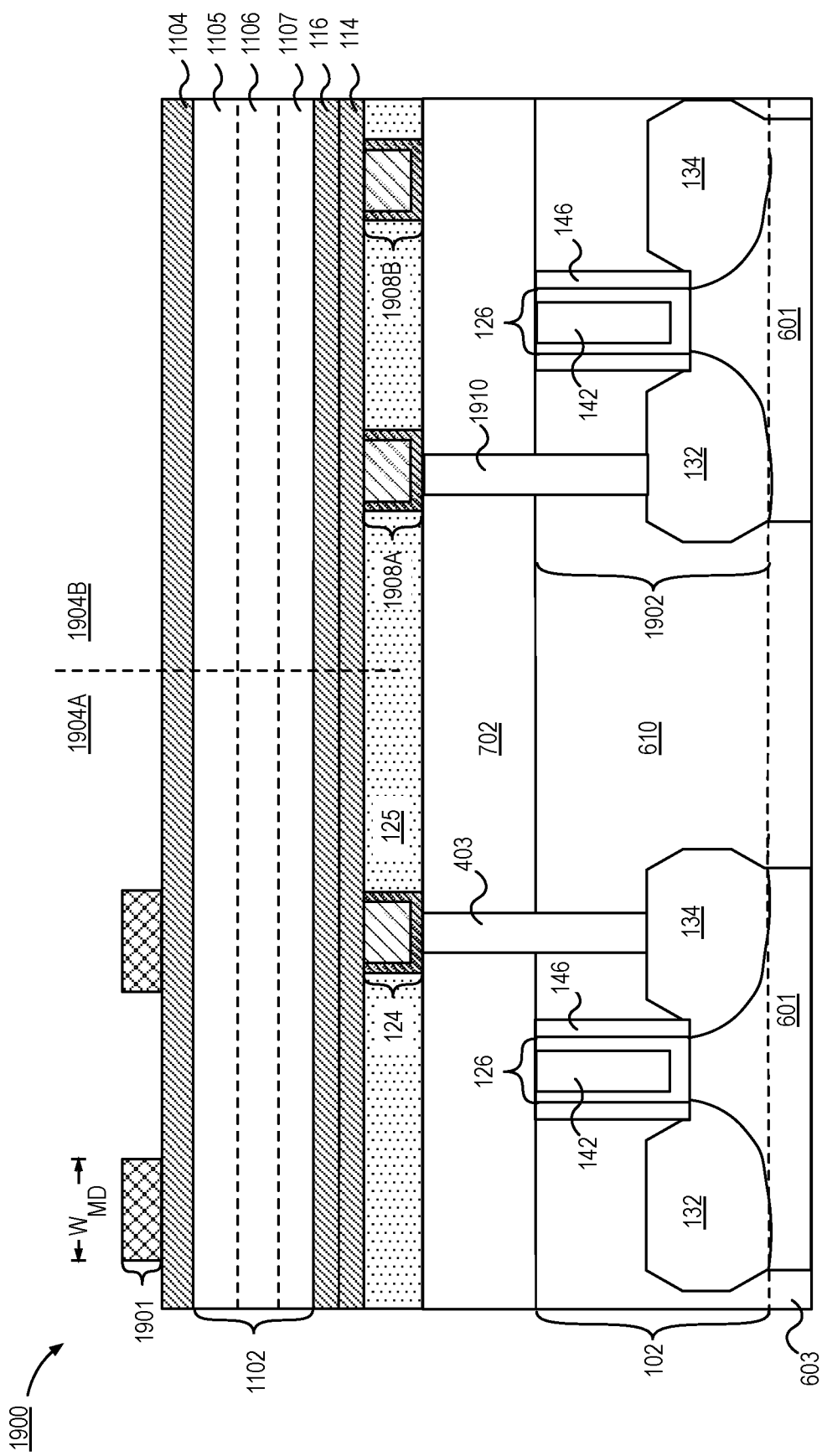
FIG. 19A illustrates a cross-section of structure in FIG. 12A following process to form a mask to define two memory devices in a memory region, in at least one embodiment.

FIG. 19A illustrates a cross-section of structure 1900, in accordance with at least one embodiment. In at least one embodiment, structure 1900 illustrates structure of FIG. 12A following process to form mask 1901 to form memory devices in memory region 1904A, in at least one embodiment.

In at least one embodiment, structure 1900 further includes logic region 1904B directly adjacent to memory region 1904A. In at least one embodiment, logic region 1904B includes transistor 1902. In at least one embodiment, transistors 102 and 1902 are co-fabricated and are identical or substantially identical. In at least one embodiment, transistors 102 and 1902 are co-fabricated but may not be identical.

In at least one embodiment, structure 1900 includes a plurality of electrode structures, e.g., electrode structure 1908A and electrode structure 1908B in logic region 1904B. In at least one embodiment, electrode structure 1908A and 1908B are identical or substantially identical to electrode structure 124. In at least one embodiment, electrode structure 1908B is coupled with a source contact 1910 of transistor 1902.

Figure 19B:
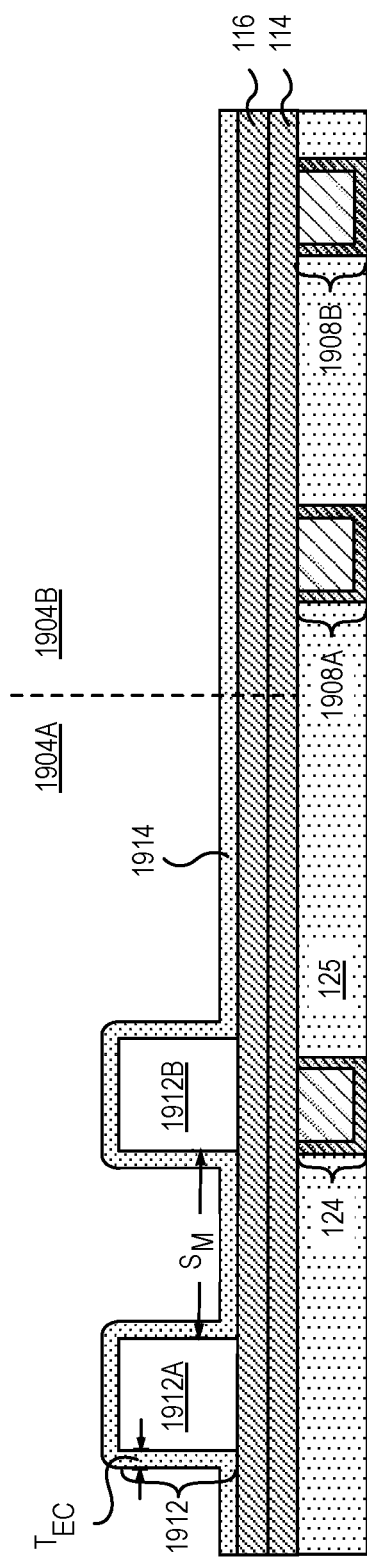
FIG. 19B illustrates a cross-section of structure in FIG. 19A following process to etch a pair of memory devices, in at least one embodiment.

FIG. 19B illustrates a cross-section of structure in FIG. 19A following process to etch and form a plurality of memory devices 1912 (memory devices 1912A and 1912B), in at least one embodiment. In at least one embodiment, a method to etch multi-layer stack to form memory devices 1912A and 1912B is same or substantially same as method described above to form plurality of memory devices 1502 (FIG. 15B). In at least one embodiment, memory devices 1912A and 1912B are formed in memory region 1904A but not in logic region 1904B.

In at least one embodiment, encapsulation layer 1914 is blanket deposited on memory devices 1912A and 1912B, and on conductive layer 116. In at least one embodiment, encapsulation layer 1914 includes a material that is same or substantially same as material of encapsulation layer 1600 (FIG. 16A). In at least one embodiment, encapsulation layer 1914 is deposited by one or methods utilized to deposit encapsulation layer 1600 (FIG. 16A).

Figure 19C:
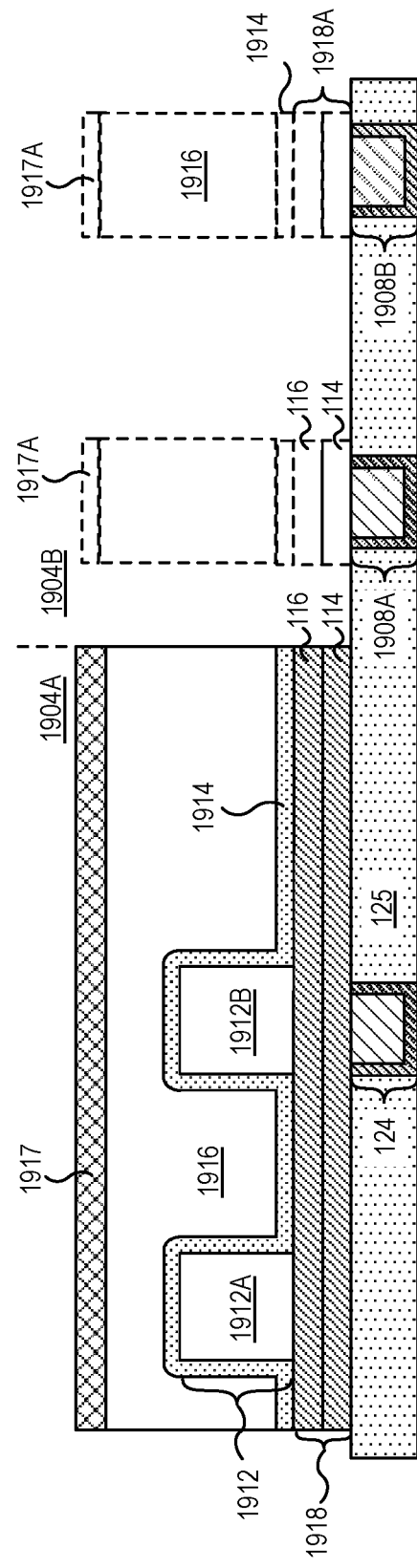
FIG. 19C illustrates a cross-section of structure in FIG. 19B following process to form an encapsulation layer on plurality of memory devices, pattern encapsulation layer and first and second conductive layers to form a plate electrode in memory region, in at least one embodiment.

FIG. 19C illustrates a cross-section of structure in FIG. 19D following process to pattern encapsulation layer 1914 and conductive layers 114 and 116 to form plate electrode 112 in memory region, in at least one embodiment. In at least one embodiment, dielectric 1916 is blanket deposited in memory region 1904A and in logic region 1904B and planarized. In at least one embodiment, dielectric 1916 includes a material that is same or substantially same as material of dielectric 1700 (FIG. 17A). In at least one embodiment, mask 1917 is formed on dielectric 1916 by a lithographic process. In at least one embodiment, a plasma etch is utilized to etch and remove dielectric 1916 and encapsulation layer 1914 from logic region 1904B. In an embodiment, dielectric 1916 and encapsulation layer 1914 are used as a mask to etch conductive layer 114 and conductive layer 116 to form plate electrode 1918. In at least one embodiment, plate electrode 1918 extends to a boundary between memory region 1904A and logic region 1904B, as shown. In at least one embodiment, lateral thickness of plate electrode 1918 can be designed to provide space to couple with one or more signal electrodes.

In at least one embodiment, etching of conductive layer 114 exposes electrode structures 1908A and 1908B in logic region 1904B. In at least one embodiment, a plasma etch process is utilized to remove conductive layer 114 selectively without sputtering material of electrode structures 1908A and 1908B. In at least one embodiment, some portions of etch stop layer 125 may be recessed while removing conductive layer 116 from logic region 1904B.

In at least one embodiment, dummification masks 1917A can also be utilized to form dummy structures in vast open areas in logic region 1904B. In at least one embodiment, dummy structures can help to maintain patterning density to prevent etch loading and preserve CMP over polishing. In at least one embodiment, dummy masks 1917A can etch and form dummy plate electrodes 1918A on electrode structures 1908A and 1908B. In at least one embodiment, dummy plate electrodes 1918A are wider than electrode structures 1908A and 1908B to prevent recessing materials of electrode structures 1908A and 1908B. In at least one embodiment, portions of encapsulation layer 1914 also remain above dummy plate electrodes 1918A, as shown. In at least one embodiment, portions of dielectric 1916 and encapsulation layer 1914 above dummy plate electrodes 1918A can be etched through to form via electrodes.

FIG. 19D illustrates a cross-section of structure in FIG. 19C following formation of via openings 1919 and hanging trench 1921 in memory region 1904A and hanging trenches 1922 and 1923 in logic region 1904B, in at least one embodiment. In at least one embodiment, dielectric 1924 is deposited on dielectric 1916 and within open regions of memory region 1904A and logic region 1904B. In an embodiment, dielectric 1924 is planarized. In at least one embodiment, dielectric 1924 and dielectric 1916 include a same material.

In at least one embodiment, prior to depositing dielectric 1924, spacer 1925 (indicated by dashed lines) can be formed on sidewall 1918B of plate electrode 1918. In at least one embodiment, spacer 1925 can provide a barrier against oxygen or hydrogen diffusion through plate electrode 1918. In at least one embodiment, a material of encapsulation layer 1600 is blanket deposited and a plasma etch process can be utilized to etch and form spacer 1925. In at least one embodiment, spacer 1925 can be formed against encapsulation layer 1600 that is formed on sidewalls of memory devices 1912A and 1912B.

In at least one embodiment, mask 1927 is formed on dielectric 1916 and 1924. In at least one embodiment, mask 1927 is utilized to etch dielectric 1916 and 1924. In at least one embodiment, a plasma etch process is utilized to etch dielectric 1916 to form openings 1919 above memory devices 1912A and 1912B, hanging trench 1921 above plate electrode 1918, and hanging trenches 1922 and 1923 in dielectric 1924. In at least one embodiment, forming openings 1919 further includes etching encapsulation layer 1914. In at least one embodiment, dielectric 1916 and 1924 can be etched at a slower rate compared to encapsulation layer 1914.

In at least one embodiment, where memory region 1904A and logic region 1904B are implemented, combined thickness $T_{PEL}$ of conductive layers 114 and 116 can be tuned to control height $T_{1920}$ of level 1920 above etch stop layer 125. In at least one embodiment, combined thickness $T_{PEL}$, height $T_{MD}$ of memory devices 1912A and 1912B and depth $T_{VE}$ of opening 1919 is equal to a height of a via to be formed in logic region 1904B.

FIG. 19E illustrates a cross-section of structure in FIG. 19D following process to form openings within hanging trenches 1921, 1922, in at least one embodiment. In at least one embodiment, mask 1929 is formed on dielectrics 1916 and 1924. In at least one embodiment, mask 1929 may be formed by a lithographic pattern. In at least one embodiment, mask 1929 fully covers openings 1919 and hanging trench 1923, and partially covers hanging trench 1921.

In at least one embodiment, a plasma etch process is utilized to etch dielectrics 1916 and 1924. In at least one embodiment, hanging trench 1921 is extended by etching portions of dielectric 1916 and encapsulation layer 1914, where hanging trench 1921 exposes portion of plate electrode 1918. In at least one embodiment, plasma etch process also etches opening 1931 within hanging trench 1921. In at least one embodiment, opening 1931 exposes electrode structure 1908A.

Figure 19F:
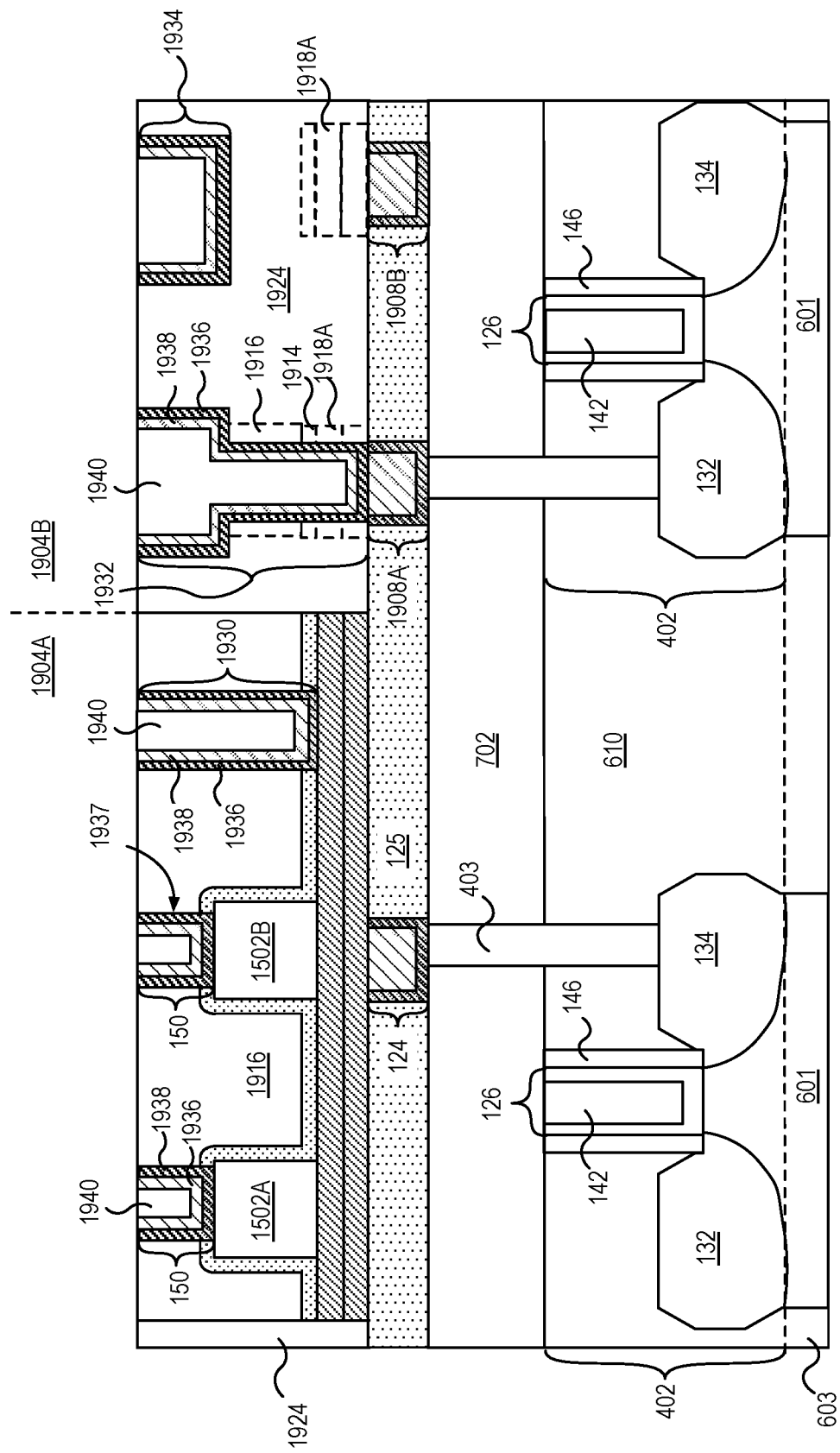
FIG. 19F illustrates a cross-section of structure in FIG. 19E following process to form via electrodes in openings formed in memory and non-memory regions, in at least one embodiment.

FIG. 19F illustrates a cross-section of structure in FIG. 19E following process to form via electrodes 150 and signal electrode 1930 in memory region 1904A and via electrodes 1932 and 1934 in logic region 1904B, in accordance with at least one embodiment. In at least one embodiment, a conductive hydrogen barrier material 1936 is blanket-deposited into openings and trenches, on memory devices 1502A-D and on sidewalls of dielectrics 1916 and 1924. In at least one embodiment, conductive hydrogen barrier material 1936 includes a material that is chemically compatible with dielectric 1916 so that interface 1937 between conductive hydrogen barrier material 1936 and dielectric 1916 is not a source of dislocations.

In at least one embodiment, liner layer material 1938 is blanket deposited on conductive hydrogen barrier material 1936. In at least one embodiment, a layer of conductive fill material 1940 is deposited into remaining portions of openings on liner layer material 1938. In embodiments, conductive hydrogen barrier material 1936, liner layer material 1938, and layer of conductive fill material 1940 are deposited by an ALD, a PVD, or a sputter deposition process.

In at least one embodiment, after deposition process, conductive fill material 1940, liner layer material 1938 and conductive hydrogen barrier material 1936 are removed from uppermost surfaces of dielectrics 1916 and 1924 by a planarization process. In at least one embodiment, planarization process includes a CMP process. In at least one embodiment, CMP process isolates conductive hydrogen barrier material 1936, liner layer material 1938 and conductive fill material 1940 to form via electrodes 150, signal electrode 1930, and via electrodes 1932 and 1934.

In at least one embodiment, dummy structures illustrated in FIG. 19D may be present in logic region 1904B in structure of FIG. 19F. In at least one embodiment, portions of dielectric 1916 and encapsulation layer 1914 above dummy plate electrodes 1918A can be etched through to form via electrode 1932. In at least one embodiment, portions of dummy plate electrode 1918A can also be etched. In at least one embodiment, via electrode 1932 is formed on dummy plate electrode 1918A.

In at least one embodiment, electrode structure 124 can be coupled to a bridge structure and an additional transistor such as bridge structure 1806 and transistor 402B illustrated in FIG. 18D.

In at least one embodiment, memory devices can be fabricated by patterning, prior to bonding process described above (FIG. 12A). In at least one embodiment, it is useful to form memory devices prior to bonding because it is useful to anneal memory devices post fabrication. In an embodiment, post fabrication anneal can passivate dangling bonds that can be cause of charge loss in memory devices. In at least one embodiment, post fabrication anneal temperatures can be similar to anneal temperatures post stack deposition. In at least one embodiment, post fabrication anneal can be performed at temperatures that can cause thermal degradation of transistors. In at least one embodiment, temperatures above 800 degrees Celsius, for time periods of several minutes or more, can cause thermal degradation of transistors.

FIG. 20A illustrates a cross-section of structure in FIG. 11 following process to pattern multi-layer stack to form memory devices 2000A and 2000B and following formation of encapsulation layer 2002 on memory devices 2000A, in at least one embodiment.

In at least one embodiment, memory devices 2000A and 2000B include top electrode 1304, dielectric layer 1306, and bottom electrode 1308. In at least one embodiment, memory devices 2000A and 2000B further includes hardmask 1302 on top electrode 1304, as shown. In at least one embodiment, a plasma etch process is utilized to pattern and form memory devices 2000A and 2000B. In at least one embodiment, sidewalls 2000C of memory devices 2000A and 2000B are tapered, as shown. In at least one embodiment, sidewalls 2000C of memory devices 2000A and 2000B are substantially vertical.

In at least one embodiment, layer 1104 can have an arbitrary thickness because a portion of thickness can be removed after bonding. In at least one such embodiment, layer 1104 having an arbitrary thickness is useful because memory devices 2000A and 2000B can be patterned with greater flexibility compared to when patterning above electrode structures or conductive layers. In at least one embodiment, patterning to form memory devices 2000A and 2000B above electrode structures or conductive layers can lead to damage of underlying structures during an over etch process. In at least one embodiment, damage can result when there is loss of etch selectivity between material of bottom electrode 1308 and material of electrode structures or conductive layers. In at least one embodiment, formation of memory devices 2000A and 2000B prior to wafer bonding can enable greater flexibility choices of materials implemented and size in electrode structures.

In at least one embodiment, after fabrication of memory devices 2000A and 2000B a thermal anneal can be performed. In at least one embodiment, thermal anneal can be performed in $O_2$ atmosphere. In at least one embodiment, thermal anneal in $O_2$ atmosphere can be utilized to passivate dangling bonds. In at least one embodiment, thermal anneal can also move point defects from interior of memory devices 2000A and 2000B to surface 2000C to lower roughness within. In at least one embodiment, one or more thermal anneal can include methods that are described in association with FIG. 11.

FIG. 20B illustrates a cross-section of structure in FIG. 20A following formation of encapsulation layer 2002 on memory device 2000A and 2000B, in at least one embodiment. In at least one embodiment, materials and methods of formation of encapsulation layer 2002 is same or substantially same as and materials and methods of formation of encapsulation layer 1600 (FIG. 16A). In at least one embodiment, encapsulation layer 2002 is etched and removed from uppermost surface 2000D and from uppermost surface 1104A to form a spacer adjacent to sidewalls 2000C.

FIG. 20C illustrates a cross-section of structure in FIG. 20B following process to deposit dielectric 2004 on encapsulation layer 2002 and following a process to planarize dielectric 2004, in at least one embodiment. In at least one embodiment, dielectric 2004 includes a material that is same or substantially same as material of dielectric 1700 (FIG. 17A). In at least one embodiment, after deposition, dielectric 2004 is planarized by a CMP process. In at least one embodiment, CMP process is utilized to remove encapsulation layer 2002 from above memory devices 2000A and 2000B and expose uppermost surface 2000D. In at least one embodiment, when uppermost surface 2000D is curved, CMP process can make uppermost surface 2000D substantially co-planar with uppermost surface 2004A of dielectric 2004.

FIG. 20D illustrates a cross-section of structure in FIG. 20C following process to form opening 2005 in dielectric 2006, in at least one embodiment. In at least one embodiment, dielectric 2006 is blanket deposited on memory devices 2000A and 2000B and on dielectric 2004. In at least one embodiment, dielectric 2006 includes silicon and one or more of nitrogen, oxygen, or carbon. In at least one embodiment, dielectric 2006 includes a same material as material of dielectric 2004. In at least one embodiment, dielectric 2006 includes a material that is same or substantially same as material of encapsulation layer 2002. In at least one embodiment, mask 2007 is formed on dielectric 2006. In at least one embodiment, a plasma etch process is utilized to etch dielectric 2006 and form opening 2005. In at least one embodiment, depending on material of dielectric 2006, dielectric 2004 may be recessed or encapsulation layer 2002 may be recessed relative to uppermost surface 2000D of memory devices 2000A and 2000B. In at least one embodiment, depending on material of dielectric 2006, surface of dielectric 2004 may be recessed relative to uppermost surface 2000D. In at least one embodiment, depending on material of dielectric 2006, top portion of encapsulation layer 2002 can also be recessed relative to uppermost surface 2000D. In at least one embodiment, encapsulation layer 2002 can also be recessed relative to dielectric 2006. In at least one embodiment, a recess is indicated by dashed lines 2009.

In at least one embodiment, opening 2005 is designed to expose at least one memory device, such as memory devices 2000A or 2000B and has a width $W_{C1}$. In at least one embodiment, opening 2005 exposes memory devices 2000A and 2000B, as shown. In at least one embodiment, opening can extend into plane of figure and further expose one or more memory devices. In at least one embodiment, opening 2005 has a depth that can range between 5 nm and 50 nm.

In at least one embodiment, opening 2005 is designed to form a portion of a plate electrode to be formed after wafer 2001 is bonded with a second wafer. In at least one embodiment, mask 2007 is removed after etching opening 2005.

FIG. 21A illustrates a cross-section of structure 2100, in at least one embodiment. In at least one embodiment, structure 2100 illustrates a cross-section of structure in FIG. 20D following process to form conductive plate 2102 in opening 2005. In at least one embodiment, a conductive material is blanket deposited into opening 2005 and on dielectric 2006. In at least one embodiment, conductive material is same or substantially same as material of conductive layer 114 (FIG. 1A). In at least one embodiment, conductive material can include materials that can provide barrier against hydrogen and oxygen but are substantially difficult to etch selective to insulator materials, for example noble metals such as gold, platinum, palladium, silver or rhodium. In at least one embodiment, conductive material can also include silver.

In at least one embodiment, portions of conductive material above uppermost surface 2006A is removed by a planarization process. In at least one embodiment, planarization process includes a CMP process. In at least one embodiment, remaining conductive material is isolated in opening 2005 to form conductive plate 2102. In at least one embodiment, conductive plate 2102 has a lateral thickness $W_{C1}$ and couples memory devices 2000A and 2000B, as shown.

In at least one embodiment, dielectric 2006 and/or encapsulation layer 2002 can be recessed. FIG. 21B is an enhanced cross-sectional illustration of portion 2104 in FIG. 21A. In at least one embodiment, where dielectric 2004 is recessed relative to uppermost surface 2000D, portions of conductive plate 2102 are adjacent to sidewalls of encapsulation layer 2002, as shown. In at least one embodiment, encapsulation layer 2002 is not recessed relative to dielectric 2004.

FIG. 21C is an enhanced cross-sectional illustration of portion 2104 in FIG. 21A, where encapsulation layer 2002 is recessed relative to uppermost surface 2000D. In at least one such embodiment, portions of conductive plate 2102 are adjacent to sidewalls of top portion of memory device 2000B. In at least one such embodiment, conductive plate 2102 can be present adjacent to sidewalls of hardmask 1302.

FIG. 22A illustrates a cross-section of wafer 2200A, in at least one embodiment. In at least one embodiment, wafer 2200A includes one or more features of structure 1900, such as transistors 102 and 1902, electrode structures 124, 1908A, and 1908B, and etch stop layer 125, formed above substrate 601.

In at least one embodiment, dielectric 2202 is blanket deposited on etch stop layer 125 and on electrode structures 124, 1908A and 1908B. In at least one embodiment, dielectric 2202 includes a material that is same or substantially same as material of dielectric 2006 (FIG. 20D). In at least one embodiment, dielectric 2202 includes a material that is different from material of dielectric 2006. In at least one embodiment, dielectric 2202 and 2006 that include a same material can be useful for bonding process.

In at least one embodiment, opening 2203 is formed above electrode structure 124. In at least one embodiment, opening has a lateral thickness $W_{C2}$ that is same or substantially same as lateral thickness $W_{C1}$ (FIG. 20D) to provide conductor to conductor bonding and dielectric to dielectric bonding.

In at least one embodiment, mask 2205 is formed on dielectric 2202 by a lithographic process. In at least one embodiment, a plasma etch process is utilized to etch dielectric 2202 to form opening 2203. In at least one embodiment, where material of dielectric 2202 is same or substantially same as material of etch stop layer 125, plasma etch process can recess portions of etch stop layer 125. In at least one embodiment, mask 2205 is removed after forming opening 2203.

FIG. 22B illustrates a cross-section of structure in FIG. 22A following process to form conductive plate 2206, in at least one embodiment.

In at least one embodiment, a conductive material is blanket deposited into opening 2203 and on dielectric 2202. In at least one embodiment, conductive material is same or substantially same as material of conductive layer 116 (FIG. 1A). In at least one embodiment, portions of conductive material above uppermost surface 2202A are removed and remaining conductive material is isolated in opening 2203 to form conductive plate 2206. Conductive plate 2206 has a lateral thickness $W_{C2}$.

In at least one embodiment, conductive plates 2206 and 2102 include a same material. In at least one embodiment, a same material can facilitate bonding between conductive plates 2206 and 2102 in a subsequent process operation. In at least one embodiment, conductive plates 2206 and 2102 can include materials that can provide barrier against hydrogen and oxygen but are substantially difficult to etch selective to insulator materials, such as for example platinum or palladium.

Figure 23A:
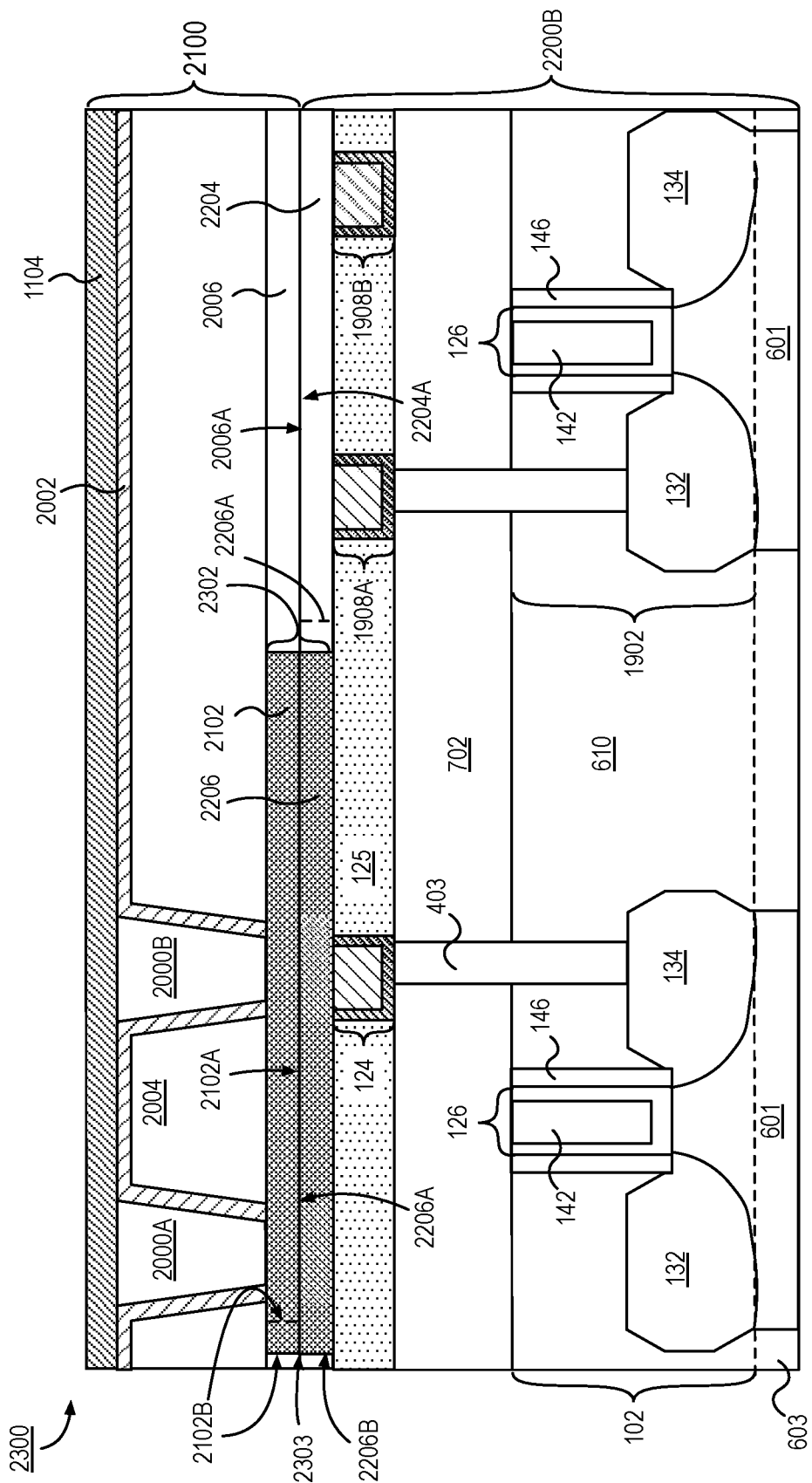
FIG. 23A illustrates a cross-section of structure in FIG. 21A bonded with structure in FIG. 22B and following process to remove sacrificial layers in structure of FIG. 21A, in at least one embodiment.

FIG. 23A illustrates a cross-section of structure 2300. In at least one embodiment, structure 2300 illustrates a cross-section of structure 2200B in FIG. 22B bonded with structure 2100 in FIG. 21A. In at least one embodiment, a bonding process that is substantially same as bonding process described in association with FIG. 18C is utilized. In at least one embodiment, bonding process includes bringing surface 2102A of conductive plate 2102 and surface 2206A of conductive plate 2206 into contact and bringing surfaces 2204A of dielectric 2204 and uppermost surface 2006A of dielectric 2006 into contact. In at least one embodiment, bonding process forms plate electrode 2302. In at least one embodiment, interface 2303 between conductive plate 2102 and conductive plate 2206 can include trace elements of tin, copper, or aluminum.

In at least one embodiment, sidewalls 2206B and 2102B are substantially aligned. In at least one embodiment, there can be misalignment between sidewalls 2206B and 2102B by at least 1 nm. In at least one such embodiment, a portion of dielectric 2204 is in contact with conductive plate 2102, and a portion of dielectric 2006 is in contact with conductive plate 2206. In at least one embodiment, where a portion of dielectric 2204 and dielectric 2006 are in contact with conductive plate 2102 and conductive plate 2206, respectively bonding process involves hybrid bonding.

In at least one embodiment, where memory devices 2000A and 2000B are fabricated and then bonded to structure 2200B that includes transistors 102 and 1902, bonding process results in inverting memory devices 2000A and 2000B relative to transistors 102 and 1902. In at least one such embodiment, sidewall profiles of memory devices 2000A and 2000B can have a re-entrant shape relative to uppermost surface of gate structure 126. In at least one embodiment, re-entrant shape can result in a gradual reduction in spacing between portions of memory devices 2000A and 2000B away from plate electrode 2302. In at least one such embodiment, spacing between memory devices 2000A and 2000B, height of memory devices 2000A and 2000B, and extent of taper can determine a maximum density of memory devices 2000A and 2000B that can be formed.

In at least one embodiment, after bonding process, substrate 1103 (FIG. 20D) is removed from above layer 1104. In at least one embodiment, layer 1104 is planarized and thickness of layer 1104 can be tuned as desired.

Figure 23B:
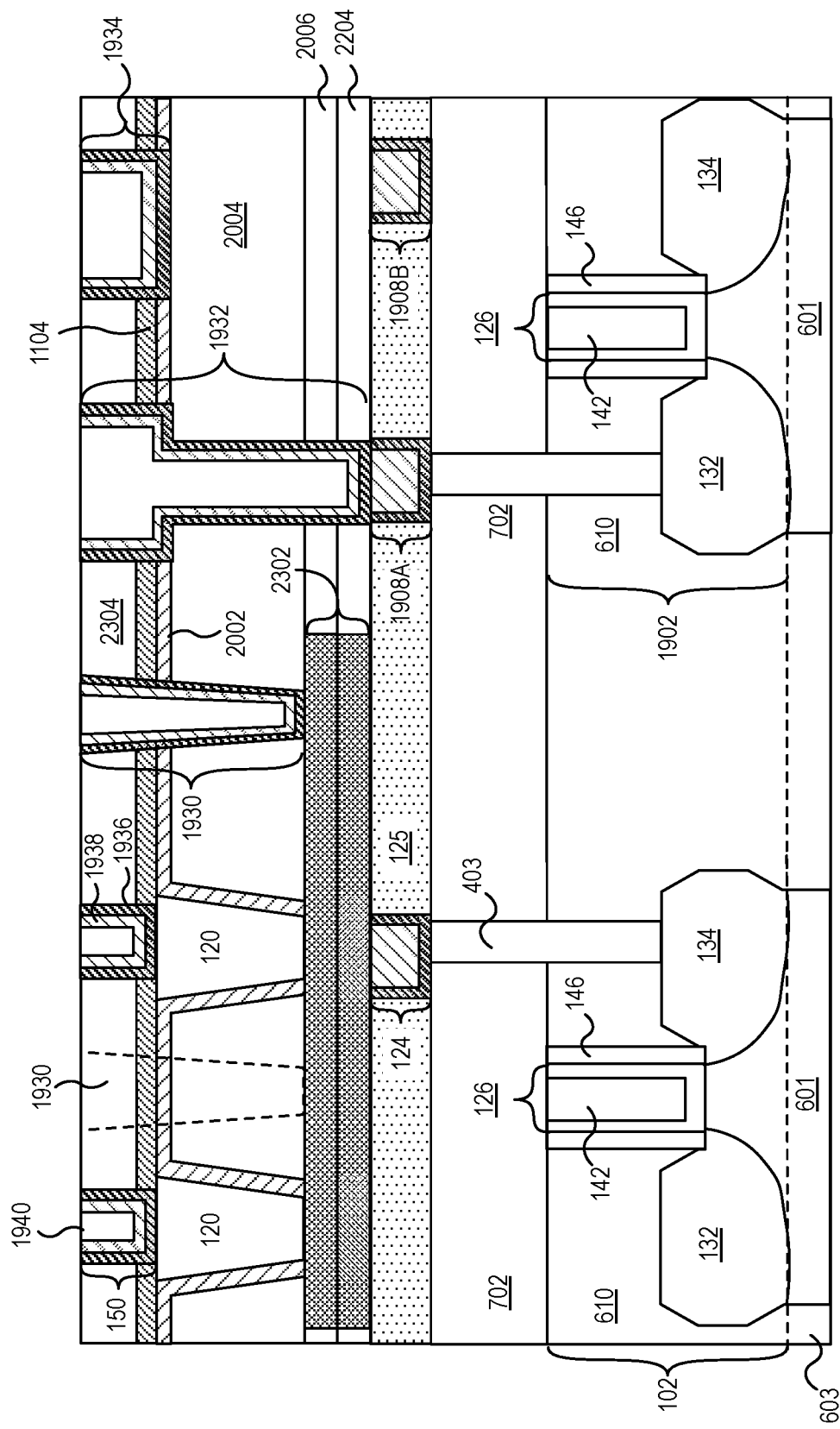
FIG. 23B illustrates a cross-section of structure in FIG. 23A following process to form via electrodes coupled with memory devices, in at least one embodiment.

In at least one embodiment, conductive plate 2102 can be divided into discrete portions where discrete portions extend over memory devices 2000A and 2000B. In at least one such embodiment, conductive plate 2206 can also be divided into discrete portions. In at least one embodiment, conductive plate 2102 and conductive plate 2206 have shapes and size that are substantially matched to each other to enable metal to metal bonding and dielectric to dielectric bonding. FIG. 23B illustrates a cross-section of structure in FIG. 23A following process to form via electrodes 150, signal electrode 1930 in memory region 1904A, and form via electrodes 1932 and 1934 in logic region 1904B, in at least one embodiment.

In at least one embodiment, process to form via electrodes 150, 1932, and 1934, and signal electrode 1930 is like method described in association with FIGS. 19D-F. Referring again to FIG. 23B, method includes depositing dielectric 2304 on layer 1104, masking and forming openings above memory devices 2000A and 2000B, above plate electrode 2302, and above electrode structures 1908A and 1908B. In at least one embodiment, forming openings comprises etching dielectric 2304, layer 1104, encapsulation layer 2002 and dielectric 2004.

In at least one embodiment, after forming openings, at least one conductive material is deposited in openings and on dielectric 2304. In at least one embodiment, a planarization process such as a CMP is utilized to remove conductive material. In at least one embodiment, a conductive hydrogen barrier material is deposited into opening, a liner layer is deposited on conductive hydrogen barrier material and a conductive fill material is deposited on liner layer. In at least one embodiment, CMP process removes excess conductive hydrogen barrier material, liner layer and conductive fill material from above dielectric 2304 and forms via electrodes 150, 1932, and 1934, and signal electrode 1930.

In at least one embodiment, electrode structure 124 can be coupled to a bridge structure and an additional transistor such as bridge structure 1806 and transistor 402B illustrated in FIG. 18D. In at least one embodiment, patterned memory devices 2000A and 2000B (FIG. 23B) can also be coupled with a structure such as structure 1720 in FIG. 18D to form stacked memory devices.

Referring again to FIG. 23B, in at least one embodiment, encapsulation layer 2002 is etched to form a spacer on sidewalls of memory devices 2000A and 2000B. In at least one embodiment, encapsulation layer 2002 is removed from surface of layer 1104.

FIG. 24A illustrates a cross-section of structure in FIG. 19B following process to form mask 2400 on encapsulation layer 1600 and etch encapsulation layer 1600 and conductive layers 116 and 114. In at least one embodiment, mask 2400 is fabricated by a lithographic process. In an embodiment, a plasma etch process is utilized to etch encapsulation layer 1600 and conductive layers 116 and 114 to from plate electrode 112. In at least one embodiment, mask 2400 is a sacrificial layer that has been formed by a mask and etch process.

FIG. 24B illustrates a cross-section of structure in FIG. 24A following process to form a second encapsulation layer. In at least one embodiment, mask is removed from encapsulation layer 1600. In at least one embodiment, encapsulation layer 2402 is deposited on surface of encapsulation layer 1600. In at least one embodiment, encapsulation layer 2402 includes a same or substantially same material as encapsulation layer 1600. In at least one embodiment, carbon content of encapsulation layer 2402 may be tuned relative to encapsulation layer 1600 to enable etch selectivity.

FIG. 24C illustrates a cross-section of structure in FIG. 24B following process to etch second encapsulation layer 2402 to form a spacer 2402A and 2402B. In at least one embodiment, a plasma etch process is utilized to etch encapsulation layer 2402 (FIG. 24B) to from spacer 2402A and 2402B. In at least one embodiment, spacer 2402A is formed adjacent to sidewall 112F and spacer 2402B is formed adjacent to encapsulation layer 1600 that is formed on sidewall 1502E of memory device 1502A-D. In at least one embodiment, spacer 2402A can prevent hydrogen or oxygen from diffusing towards memory devices 1502A-D. In at least one embodiment, formation of spacer 2402A and 2402B can be extended to other configurations described herein.

Figure 25:
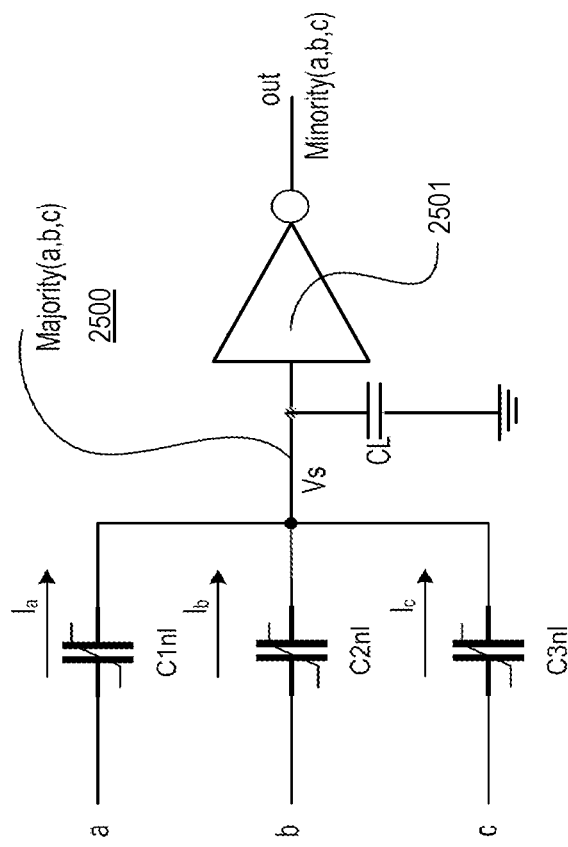
FIG. 25 illustrates a 3-input majority gate using non-linear input capacitors, in accordance with at least one embodiment.

FIG. 25 illustrates 3-input majority gate 2500 using non-linear input capacitors, in accordance with at least one embodiment. In at least one embodiment, 3-input majority gate 2500 comprises non-linear input capacitors C1$nl$, C2$nl$, and C3$nl$ that receive digital signals a, b, and c, respectively. Here, signal names and node names are interchangeably used. For example, 'a' refers to node 'a' or signal 'a' depending on context of sentence. In at least one embodiment, one end or terminal of capacitor C1$nl$ is coupled to node a while other end of capacitor C1$nl$ is coupled to summing node Vs. Same is true for other non-linear capacitors C2$nl$ and C3$nl$, as shown. In at least one embodiment, 3-input majority gate 2500 comprises driver circuitry 2501. In at least one embodiment, driver circuitry 2501 is an inverter. In at least one embodiment, other types of driver circuitries can be used, such as NAND gate, NOR gate, multiplexer, buffer, or other logic gates. In at least one embodiment, majority function is performed at summing node Vs as Majority (a,b,c). In at least one embodiment, driver circuitry 2501 is an inverter, minority function is performed at output "out" as Minority (a,b,c).

In at least one embodiment, in addition to gate capacitance of driver circuitry 2501, an additional linear capacitor CL is coupled to summing node Vs and ground as shown. In at least one embodiment, linear capacitor CL is a non-ferroelectric capacitor. In at least one embodiment, non-ferroelectric capacitor includes one of: dielectric capacitor, paraelectric capacitor, or non-linear dielectric capacitor. In at least one embodiment, a dielectric capacitor comprises a first metal plate and a second metal plate with a dielectric between them. In at least one embodiment, dielectric includes one or more of: $HfO_x$, $ABO_3$ perovskites, nitrides, oxy-fluorides, oxides, etc. In at least one embodiment, a paraelectric capacitor comprises a first metal plate and a second metal plate with paraelectric material between them. In at least one embodiment, f-orbital materials (e.g., lanthanides) are doped to ferroelectric materials to make paraelectric material. Examples of room temperature paraelectric material include: SrTiO3, Ba(x)Sr(y)TiO3, $HfZrO_2$, Hf—Si—O, La-substituted $PbTiO_3$, or PMN-PT based relaxor ferroelectrics. In at least one embodiment, a dielectric capacitor comprises a first metal plate and a second metal plate with a non-linear dielectric capacitor between them. In at least one embodiment, range for dielectric constant is 1.2 to 10000. In at least one embodiment, capacitor CL can be implemented as MIM (metal-insulator-metal) capacitor technology, transistor gate capacitor, hybrid of metal capacitors, or transistor capacitor. In at least one embodiment, capacitor CL can be implemented as MIM (metal-insulator-metal) capacitor technology, transistor gate capacitor, hybrid of metal capacitors, or transistor capacitor.

In at least one embodiment, non-linear input capacitors C1*nl*, C2*nl*, and C3*nl* comprise non-linear polar material. In at least one embodiment, non-linear polar material includes one of: a ferroelectric (FE) material, a paraelectric material, a relaxor ferroelectric, or a non-linear dielectric. In at least one embodiment, paraelectric material is same as FE material, but with chemical doping of active ferroelectric ion by an ion with no polar distortion. In at least one embodiment, non-polar ions are non-s orbital ions formed with p, d, or f external orbitals. In at least one embodiment, non-linear dielectric materials are same as paraelectric materials, relaxors, and dipolar glasses.

In at least one embodiment, FE material can be any suitable low voltage FE material that allows FE material to switch its state by a low voltage (e.g., 100 mV). In at least one embodiment, threshold in FE material has a highly non-linear transfer function in polarization versus voltage response. Threshold is related to: a) non-linearity of switching transfer function; and b) squareness of FE switching. In at least one embodiment, non-linearity of switching transfer function is width of derivative of polarization versus voltage plot. In at least one embodiment, squareness is defined by ratio of remnant polarization to saturation polarization; perfect squareness will show a value of 1.

In at least one embodiment, squareness of FE switching can be suitably manipulated with chemical substitution. In at least one embodiment, in $PbTiO_3$ a P-E (polarization-electric field) square loop can be modified by La or Nb substitution to create an S-shaped loop. Shape can be systematically tuned to ultimately yield a non-linear dielectric. In at least one embodiment, squareness of FE switching can also be changed by granularity of FE layer. In at least one embodiment, a perfect epitaxial, single crystalline FE layer may show higher squareness (e.g., ratio is closer to 1) compared to polycrystalline FE. In at least one embodiment, a perfect epitaxial can be accomplished by use of lattice matched bottom and top electrodes. In at least one embodiment, BiFeO (BFO) can be epitaxially synthesized using lattice matched $SrRuO_3$ bottom electrode yielding P-E loops that are square. In at least one embodiment, progressive doping with La may reduce squareness.

In at least one embodiment, FE material includes one of: hafnium (Hf), zirconium (Zr), aluminum (Al), silicon (Si), their oxides, or their alloyed oxides. In at least one embodiment, FE material includes bismuth ferrite (BFO), wherein the first doping material is one of lanthanum, one or more elements from lanthanide series of a periodic table, or one or more elements of a 3d, 4d, 5d, 6d, 4f, and 5f series of periodic table.

In an embodiment, BFO is doped with Mn or Sc, and wherein Mn or Sc achieve a spontaneous distortion in BFO in a range of 0.3% to 2%. In at least one embodiment, FE material includes a relaxor ferroelectric including one of barium titanium-bismuth zinc niobium tantalum (BT-BZNT) or barium titanium-barium strontium titanium (BT-BST).

In at least one embodiment, FE material includes hafnium oxides of a form, $Hf_{1-x}E_xO_2$, where E includes one of Al, Ca, Ce, Dy, Er, Gd, Ge, La, Sc, Si, Sr, Sn, or Y. In at least one embodiment, FE material includes niobate type compounds $LiNbO_3$, $LiTaO_3$, lithium iron tantalum oxy fluoride, barium strontium niobate, sodium barium niobate, or potassium strontium niobate.

In at least one embodiment, FE material includes $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, where a, b, and c are respective compositional fractions. In at least one embodiment, FE material comprises multiple layers. In at least one embodiment, alternating layers of $[Bi_2O_2]^{2+}$ and pseudo-perovskite blocks ($Bi_4Ti_3O_{12}$ and related Aurivillius phases), with perovskite layers that are n octahedral layers in thickness can be used.

In at least one embodiment, FE material comprises organic material. In at least one embodiment, polyvinylidene fluoride or polyvinylidene difluoride (PVDF) may be used. In at least one embodiment, FE material can be any suitable low voltage FE material that allows FE material to switch its state by a low voltage (e.g., 100 mV). In at least one embodiment, FE material comprises a perovskite of type $ABO_3$, where 'A' and 'B' are two cations of different sizes, and 'O' is oxygen which is an anion that bonds to both cations. Generally, size of A atoms is larger than size of B atoms. In at least one embodiment, perovskite can be doped, e.g., by one or more elements from lanthanide series of a periodic table, or one or more elements of a 3d, 4d, 5d, 6d, 4f, and 5f series of periodic table. In at least one embodiment, perovskites can be suitably doped to achieve a spontaneous distortion in a range of 0.3% to 2%. In at least one embodiment, for chemically substituted lead titanate such as Zr in Ti site and La or Nb in Ti site, concentration of substitutes is such that spontaneous distortion in range of 0.3% to 2% is achieved. In at least one embodiment, for chemically substituted $BiFeO_3$, $BiCrO_3$, and $BiCoO_3$ class of materials, La or rare earth substitution into Bi site can tune spontaneous distortion. In at least one embodiment, perovskite includes one of: $BaTiO_3$, $KNbO_3$, or $NaTaO_3$.

In at least one embodiment, FE material is perovskite, which includes one or more of: La, Sr, Co, Sr, Ru, Y, Ba, Cu, Bi, Ca, and Ni. In at least one embodiment, perovskites can be suitably doped to achieve a spontaneous distortion in a range of 0.3 to 2%. In at least one embodiment, for chemically substituted $BiFeO_3$, $BrCrO_3$, and $BuCoO_3$ class of materials, La or rate earth substitution into Bi site can tune spontaneous distortion. In at least one embodiment, perovskite can be doped (e.g., by La or lanthanides).

In at least one embodiment, FE material comprises hexagonal ferroelectrics of type h-$RMnO_3$, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). Ferroelectric phase is characterized by a buckling of layered $MnO_5$ polyhedra, accompanied by displacements of Y ions, which lead to net electric polarization. In at least one embodiment, hexagonal FE includes one of $YMnO_3$ or $LuFeO_3$.

In at least one embodiment, when ferroelectric comprises hexagonal ferroelectric material, electrodes can have hexagonal metals, spinels, or cubic metals. In at least one embodiment, hexagonal metals include $PtCoO_2$, $PdCoO_2$, and other delafossite structured hexagonal metallic oxides, such as Al-doped ZnO. In at least one embodiment, spinels include $Fe_3O_4$ and $LiV_2O_4$. In at least one embodiment, cubic metals include indium tin oxide (ITO), such as Sn-doped $In_2O_3$.

In at least one embodiment, FE material comprises improper FE material. An improper ferroelectric is a ferroelectric where primary order parameter is an order mechanism such as strain or buckling of atomic order. In at least one embodiment, improper FE material includes $LuFeO_3$ class of materials or super lattice of ferroelectric and paraelectric materials. While various embodiments here are described with reference to ferroelectric material for storing charge state, embodiments are also applicable for paraelectric material. In at least one embodiment, capacitor of various embodiments can be formed using paraelectric material instead of ferroelectric material.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. Examples of room temperature paraelectric materials include: $SrTiO_3$, $Ba_xSr_yTiO_3$, $HfZrO_2$, and Hf—Si—O.

In at least one embodiment, FE material comprises a stack of layers including low voltage FE material between oxides. In at least one embodiment, when FE material is a perovskite, conductive oxides are of type AA'BB'$O_3$. In at least one embodiment, A' is a dopant for atomic site A, it can be an element from Lanthanides series. In at least one embodiment, B' is a dopant for atomic site B, it can be an element from transition metal elements especially Sc, Ti, V, Cr, Mn, Fe, Co, Ni, Cu, and Zn. A' may have same valency of site A, with a different ferroelectric polarizability. In various embodiments, when metallic perovskite is used for FE material, conductive oxides can include one or more of: $IrO_2$, $RuO_2$, $PdO_2$, $OsO_2$, or $ReO_3$.

In at least one embodiment, FE material is contacted with a conductive metal oxide that includes one of conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_{25}$, and $LaNiO_3$.

In at least one embodiment, when FE material comprises hexagonal ferroelectrics, conductive oxides are of $A_2O_3$ (e.g., $In_2O_3$, $Fe_2O_3$) and $ABO_3$ type, where 'A' is a rare earth element and B is Mn.

In at least one embodiment, FE material is between two electrodes that comprise perovskite templated conductors. In at least one embodiment, a templated structure comprises a thin layer (e.g., approximately 10 nm) of a perovskite conductor (such as $SrRuO_3$) is coated on top of $IrO_2$, $RuO_2$, $PdO_2$, or $PtO_2$ (which have a non-perovskite structure but higher conductivity) to provide a seed or template for growth of pure perovskite ferroelectric material at low temperatures.

In at least one embodiment, charge developed on node Vs produces a voltage and current that is output of 3-input majority gate 2500. In at least one embodiment, any suitable driver circuitry 2501 can drive this output. In at least one embodiment, non-FE logic, FE logic, CMOS logic, BJT logic, etc. can be used to drive output to a downstream logic. In at least one embodiment, drivers include one or more of inverters, buffers, NAND gates, NOR gates, XOR gates, amplifiers, comparators, digital-to-analog converters, analog-to-digital converters, multiplexers, etc.

In at least one embodiment, majority function is performed at summing node Vs, and resulting voltage is projected on to capacitance of driver circuitry 2501. In at least one embodiment, majority function of currents ($I_a$, $I_b$, and $I_c$) on node Vs results in a resultant current that charges capacitor. Table 1 illustrates majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In at least one embodiment, charge developed on node Vs produces a voltage and current that is output of 3-input majority gate 2500. In at least one embodiment, any suitable driver circuitry 2501 can drive this output. For example, a non-FE logic, FE logic, CMOS logic, or BJT logic, etc. can be used to drive output to a downstream logic. In at least one embodiment, drivers include inverters, buffers, NAND gates, NOR gates, XOR gates, amplifiers, comparators, digital-to-analog converters, analog-to-digital converters, or multiplexers, etc.

While FIG. 25 illustrates a 3-input majority gate, same concept can be extended to more than 3 inputs to make an N-input majority gate, where N is greater than 2, in accordance with at least one embodiment. In at least one embodiment, 'N' is an odd number. In at least one embodiment, 5-input majority gate is similar to a 3-input majority gate 2500 but for additional inputs 'd' and 'e'. In at least one embodiment, inputs can come from same drivers or from different drivers.

In at least one embodiment, 3-input majority gate can be configured as a fast inverter with a much faster propagation delay compared to a similar sized (in terms of area footprint) CMOS inverter. In at least one embodiment, this may be useful when inputs have a significantly slower slope compared to propagation delay through non-linear input capacitors. In at least one embodiment, one way to configurate 3-input majority gate as an inverter is to set one input to a logic high (e.g., b=1) and set another input to a logic low (e.g., b=0). In at least one embodiment, third input is driving input which is to be inverted. In at least one embodiment, inversion will be at Vs node. Same technique can also be applied to N-input majority gate, where 'N' is 1 or any other odd number. In at least one embodiment, in an N-input majority gate, (N−1)/2 inputs are set to '1' and (N−1)/2 inputs are set to '0', and one input is used to decide inversion function. While at least one embodiment is described as a majority gate, same concepts are applicable to a minority gate. In at least one embodiment, driving circuitry is an inverting circuitry coupled to summing node Vs. In at least one embodiment, minority function is seen at output of inverting circuitry.

In at least one embodiment, (2N−1) input majority gate can operate as an N-input AND gate where (N−1) inputs of majority gate are set to zero. In at least one embodiment, AND function will be seen at summing node Vs. In at least one embodiment, N-input NAND, OR, NOR gates can be realized. In at least one embodiment, summing node Vs is driven by a driver circuitry (e.g., inverter, buffer, NAND gate, AND gate, OR gate, NOR gate, or any other logic circuitry). In at least one embodiment, driver circuitry 2501 can be replaced with another majority or minority gate. In at least one embodiment, storage node Vs is directly coupled to a non-linear capacitor of another majority or minority gate.

In at least one embodiment, any logic function $f(x_1, x_2, \ldots x_n)$ can be represented by two levels of logic as given by min-term expansion: $f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$ where $C_i$ is either 0 or 1. When $C_i$ is 1, $x_i^{C_i} = x_i$ (input is used in its original form). When $C_i$ is 0, $x_i^{C_i} = \overline{x_i}$ (input is used in its inverted form). In at least one embodiment, first level of logic is represented by at most $2^n$ AND gates ($\Delta$), one for each of $2^n$ possible combinations of 0 and 1 for $C_1, C_2, \ldots C_n$. Second level of logic is represented by a single OR gate (V). Each operand of OR gate is a representation of a row in truth table for $f(x_1, x_2, \ldots x_n)$.

In at least one embodiment, a (2N−1)-input majority gate can represent an N-input AND gate, by tying (N−1) of majority gate's inputs to a ground level. Similarly, a (2N−1)-input majority gate can represent an N-input OR gate, by tying (N−1) of majority gate's inputs to a supply level (Vdd). In at least one embodiment, since a majority gate can represent AND and OR gates, and inputs to AND and OR gates are either original or inverted forms of input digital signals, any logic function can be represented by majority gates and inverters.

Figure 26:
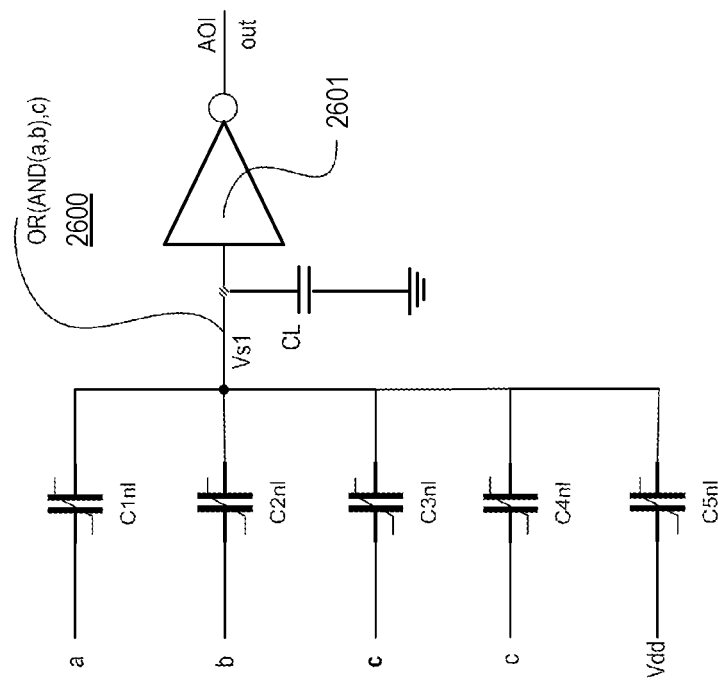
FIG. 26 illustrates a complex logic gate implemented using a 5-input majority gate, in accordance with at least one embodiment.

FIG. 26 illustrates complex logic gate 2600 implemented using a 5-input majority gate, in accordance with at least one embodiment. In at least one embodiment, an AOI (and-or-invert) logic comprises a 5-input majority gate. In at least one embodiment, 5-input majority gate includes non-linear capacitors C1*nl*, C2*nl*, C3*nl*, C4*nl*, and C5*nl*, and driving circuitry 2601 coupled as shown. In at least one embodiment, two of non-linear capacitors receive same input. Here, capacitors C3*nl* and C4*nl* receive input 'c'. In at least one embodiment, C5*nl* is coupled to Vdd to produce an OR function at node Vs, where OR function is OR (AND (a,b),c). In at least one embodiment, other logic gates can be realized by changing Vdd to ground for capacitor C5*nl*, and/or changing other inputs.

Figure 27:
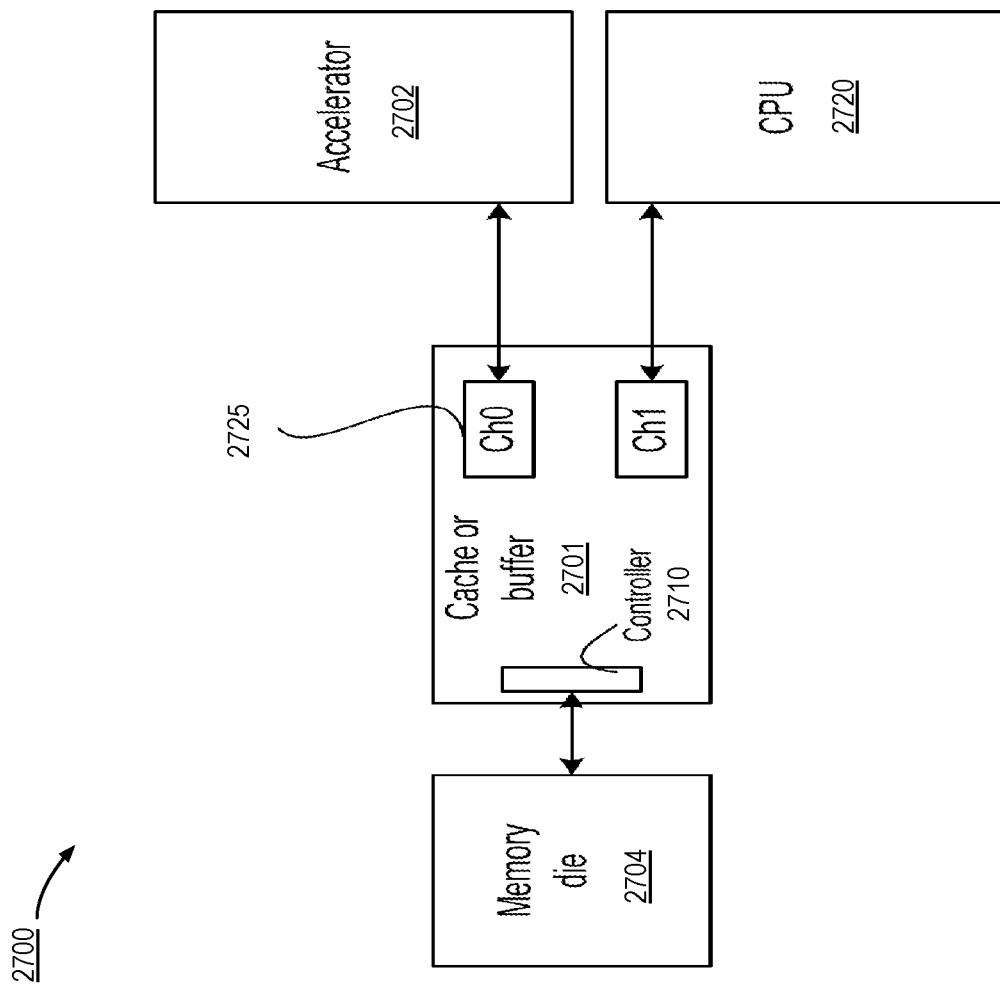
FIG. 27 illustrates a computing architecture with a coherent cache or memory-side buffer chiplet that includes a memory controller, wherein coherent cache or memory-side buffer chiplet is coupled to an accelerator, a processor, and a memory, in accordance with at least one embodiment.

FIG. 27 illustrates computing architecture 2700 with a coherent cache or memory-side buffer chiplet that includes a memory controller, wherein coherent cache or memory-side buffer chiplet is coupled to an accelerator, a processor, and a memory, in accordance with at least one embodiment. In at least one embodiment, computing architecture 2700 comprises coherent cache or memory-side buffer chiplet 2701, accelerator 2702 (e.g., inference chip), processor (e.g., processor 2720), and memory die 2704. In at least one embodiment, coherent cache or memory-side buffer chiplet 2701 comprises at least two channels 2725 which are configured to connect with accelerator 2702 and processor 2720. In at least one embodiment, coherent cache or memory-side buffer chiplet 2701 comprises I/O and controller 2710 to manage data traffic with memory die 2704. By moving controller 2710 from processor 2720 to coherent cache or memory-side buffer chiplet 2701, cost in terms of power and die area for processor 2720 is reduced. In at least one embodiment, coherent cache or memory-side buffer chiplet 2701 is a cache memory that comprises ferroelectric memory cells. For example, coherent cache or memory-side buffer chiplet 2701 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 28:
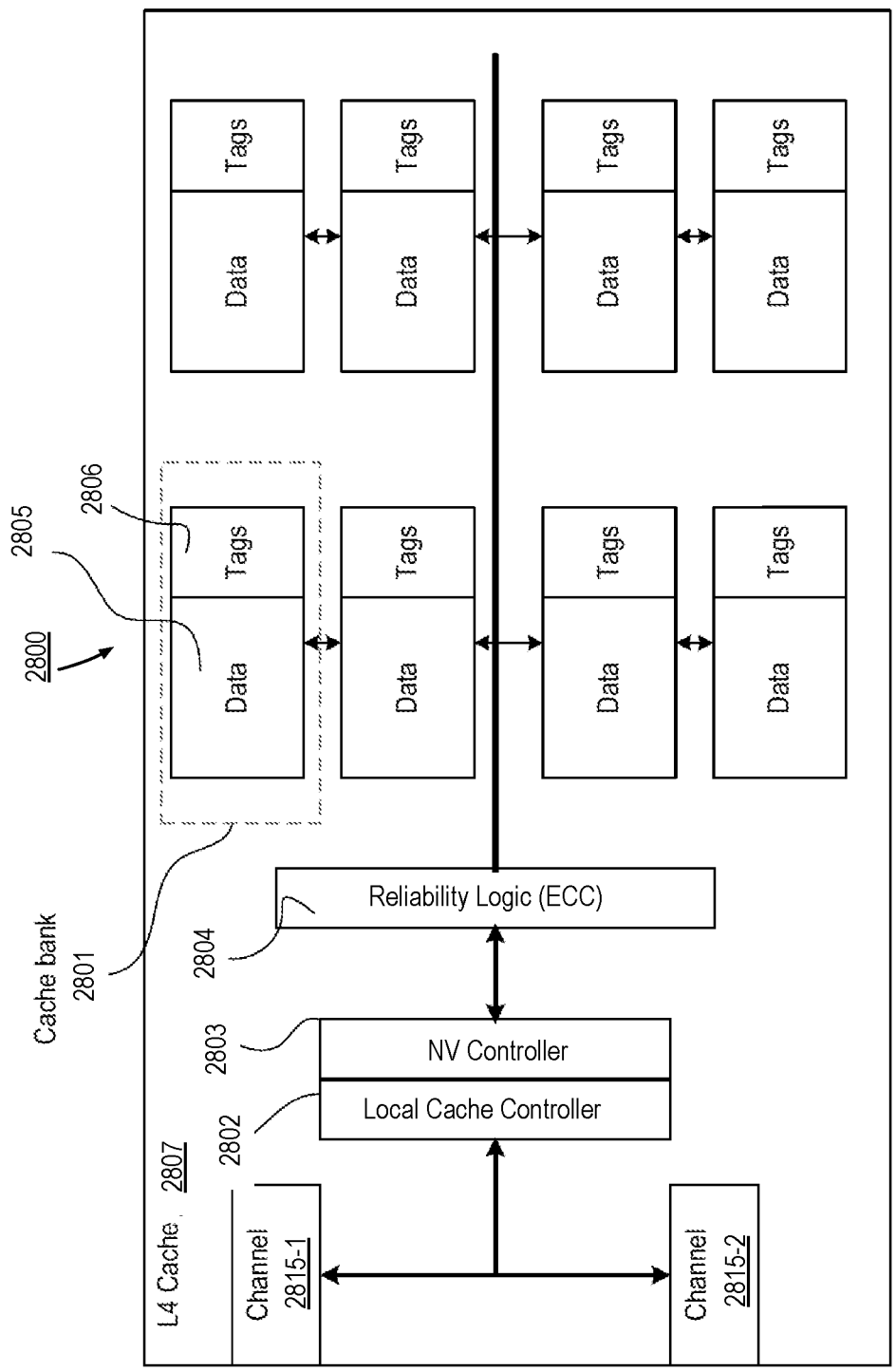
FIG. 28 illustrates an architecture of coherent cache or memory-side buffer chiplet with multiple controllers and multiple cache banks, in accordance with at least one embodiment.

FIG. 28 illustrates architecture 2800 of coherent cache or memory-side buffer chiplet 2807 with multiple controllers and multiple cache banks, in accordance with at least one embodiment. In at least one embodiment, architecture 2800 comprises channels (e.g., channel 2815-1, which can be ch0 and channel 2815-2, which can be ch1), cache banks 2801, cache controller 2802, non-volatile (NV) controller 2803, and reliability logic 2804. In at least one embodiment, cache controller 2802 is a local cache controller. In at least one embodiment, coherent cache or memory-side buffer chiplet 2807 may function as a cache or memory buffer. In at least one embodiment, cache lookups can map a large physical memory into a small physical cache using indirection via tags. Here, indirection refers to use of tags to specify which address maps to which physical location. In at least one embodiment, if multiple addresses can map to a single physical location, a tag is used to figure out which address is currently mapped.

In at least one embodiment, each cache bank 2801 includes data bank 2805 (e.g., comprising memory cells) and associated tags 2806. In at least one embodiment, data bank 2805 comprises ferroelectric memory cells. In at least one embodiment, data bank 2805 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In at least one embodiment, when data bank 2805 includes ferroelectric memory, it uses NV controller 2803 and a stronger reliability logic (e.g., error correction code) for security compared to non-ferroelectric memory for data bank 2805.

In at least one embodiment, when data bank 2805 is used to implement a cache, tags may be used to identify which addresses map to which physical locations in bank. In at least one embodiment, cache may be set associative, in which a particular address can map to several physical locations. Specific physical location a newly allocated address is mapped to may be determined by a replacement algorithm, such as LRU (least recently used) or pseudo-LRU, or even random. In at least one embodiment, cache might be direct mapped, with each address mapping to merely a single physical cache line. In at least one embodiment, in both set associative and direct mapped caches, several addresses map to a single physical cache line. In at least one embodiment, to identify address currently occupying physical cache line, tag 2806 may be coupled with a physical line. In at least one embodiment, tag 2806 may comprise some address bits, sufficient to uniquely identify which address currently occupies physical line coupled with tag.

In at least one embodiment, cache controller 2802 could be used to control state transitions used for cache look ups such as comparing requested addresses with tags stored in an array of tags 2806 and identifying a candidate for replacement (replacement algorithm) when a cache miss occurs. In at least one embodiment, cache controller could be tasked with initializing cache when cache power is on. In at least one embodiment, when FE memory of data bank 2805, which retains state across power cycles, is used, cache controller 2802 could write 0s to all memory locations to ensure that data associated with previously executed programs is erased, thus preventing any data leakage to subsequently executed programs, in at least one embodiment. In at least one embodiment, non-volatile memory may also include an NV bit, which could indicate that cache data is meant to be non-volatile and remain across power cycles. In at least one embodiment, cache controller 2802 may skip locations marked thus when initializing memory.

In at least one embodiment, reliability logic 2804 performs error correction to data. Any suitable error correction scheme (e.g., with error correction code (ECC)) may be used by reliability logic 2804. In at least one embodiment, non-volatile (NV) controller 2803 is provided to explicitly clear cache when using a non-volatile memory, such as FM memory for data bank 2805. In at least one embodiment, NV controller 2803 may include an NV bit which indicates cache lines that should not be cleared but are expected to retain their contents across power cycles. In at least one embodiment, functions of NV controller 2803 can be combined in cache controller 2802, or vice versa.

Figure 29:
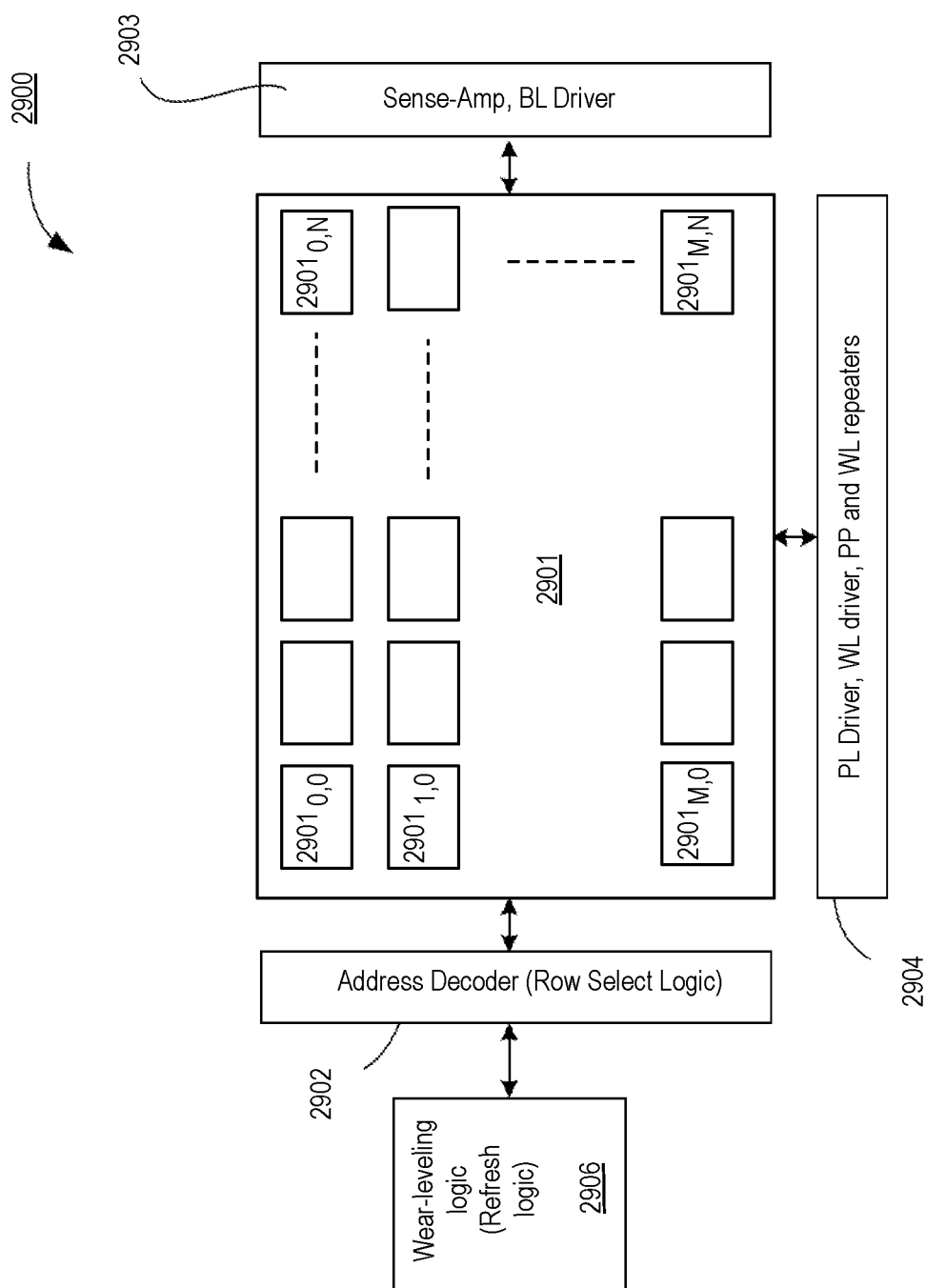
FIG. 29 illustrates an apparatus comprising memory and corresponding logic, wherein memory comprises ferroelectric (FE) memory bit-cells, in accordance with at least one embodiment.

FIG. 29 illustrates apparatus 2900 comprising an M×N memory array of bit-cells and corresponding periphery circuitry, in accordance with at least one embodiment. In at least one embodiment, apparatus 2900 comprises M×N memory array 2901 of bit-cells, logic circuitry 2902 for address decoding, and logic circuitry 2903 for sense amplifier and BL driver, and logic circuitry 2904 for write drivers, and plate-line (PL) drivers. In at least one embodiment, plate-lines PL0, PL1 through PLN are parallel to word-lines WL0, WL1, through WLM while bit-lines BL0, BL1 through BLN are orthogonal to plate-lines and word-lines, where 'N' is a number greater than 1. In at least one embodiment, plate-lines PL0, PL1, through PLN are parallel to bit-lines BL0, BL1 through BLN, while word-lines WL0, WL1, through WLM are orthogonal to plate-lines and bit-lines, where 'N' is a number greater than 1. In at least one embodiment, individual memory bit-cells in memory array 2901 are organized in rows and columns. In at least one embodiment, memory bit-cells $2901_{0,0}$ through $2901_{M,N}$ are organized in an array.

In at least one embodiment, an individual memory bit-cell (e.g., $2901_{0,0}$) is a 1TnC bit-cell. An example of a 1TnC bit-cell is described with reference to FIGS. 31A-31B. Referring again to FIG. 29, in at least one embodiment, an individual memory bit-cell (e.g., $2901_{0,0}$) is a multi-element FE gain bit-cell. An example of a 1TnC bit-cell is described with reference to FIGS. 32A-32B. Referring again to FIG. 29, in at least one embodiment, an individual memory bit-cell (e.g., $2901_{0,0}$) is a multi-element FE gain bit-cell, where an individual capacitor of bit-cell is connected to a transistor switch. In at least one embodiment, such a memory bit-cell is described with reference to FIG. 33.

Referring again to FIG. 29, in at least one embodiment, when multiple capacitors are used per bit-cell, access transistor may be made larger. In at least one embodiment, access transistor is connected to bit-line as bit-line drives a gate terminal of access transistor. In an embodiment, a larger access transistor can add capacitance to bit-line. In at least one embodiment, one way to reduce bit-line capacitance is to route bit-line on higher level metal layers. In at least one embodiment, higher-level metal layers are usually occupied by ground and supply routes. In at least one embodiment, connecting gate of access transistor to higher-level metal layers to access bit-line means traversing through contact regions and vias. Such signal path may increase resistance and capacitance on bit-line. In at least one embodiment, memory array 2901 is split into two or more subarrays with bit-line multiplexers between subarrays. In at least one embodiment, by splitting array, bit-line routes are split along subarrays via a selection circuitry. In at least one embodiment, selection circuitry decouples bit-line into separate bit-line routes which allows capacitance on bit-line to reduce as parasitic capacitance from bit-line route is reduced, and bit-line is not driving all access transistors in a row of array.

In at least one embodiment, wear-leveling logic 2906 provides one or more endurance mechanisms for 1TnC memory bit-cells. In at least one embodiment, one of endurance mechanisms involves refreshing of data content in capacitor(s).

Figure 30:
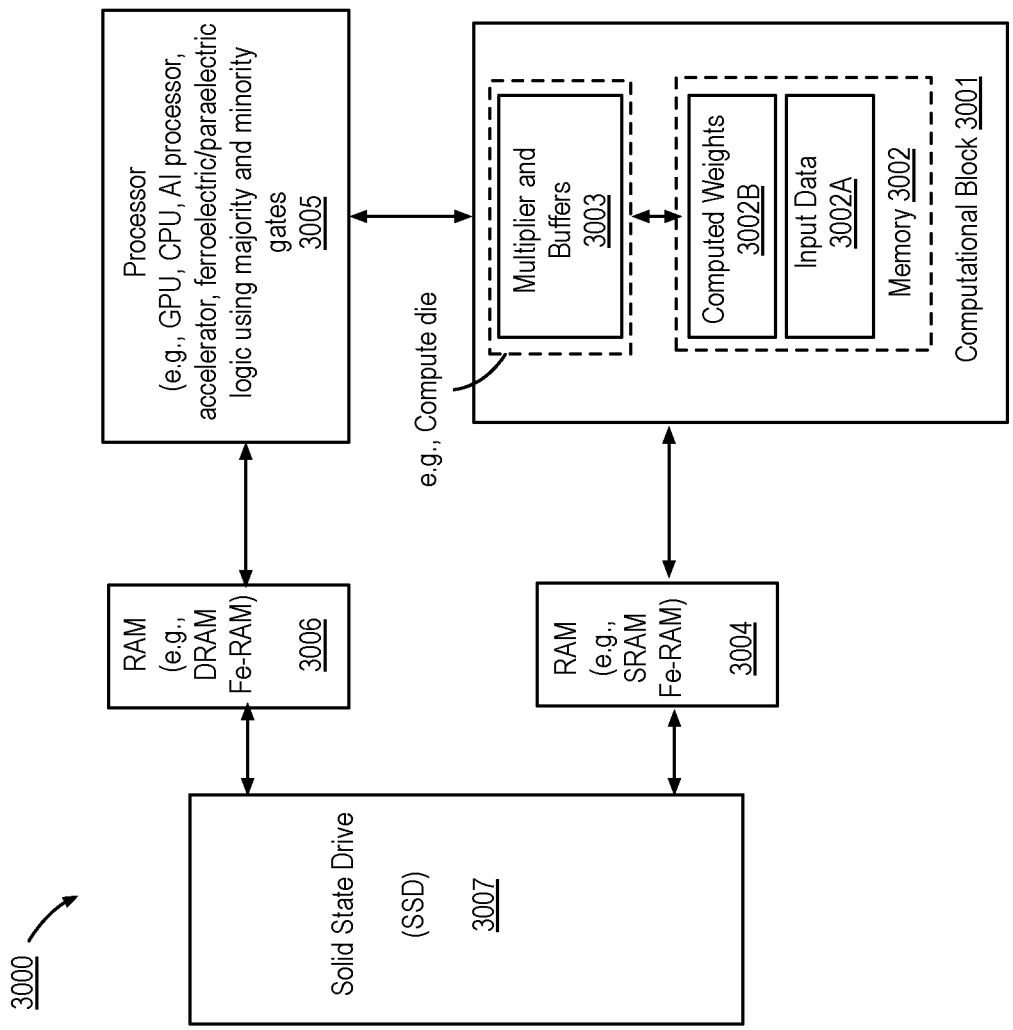
FIG. 30 illustrates a high-level architecture of an artificial intelligence (AI) machine comprising a compute die positioned on top of a memory die, in accordance with at least one embodiment.

FIG. 30 illustrates a high-level architecture of artificial intelligence (AI) machine 3000 comprising a compute die positioned on top of a memory die, in accordance with at least one embodiment. In at least one embodiment, AI machine 3000 comprises computational block 3001 or processor having random-access memory (RAM) 3002 and compute die 3003; RAM 3004 (e.g., static RAM (SRAM), ferroelectric or paraelectric RAM (FeRAM), ferroelectric or paraelectric static random-access memory (FeSRAM), processor 3005, RAM 3006 (dynamic RAM (DRAM), FeRAM), and solid-state memory or solid-state drive 3007. In at least one embodiment, some or all components of AI machine 3000 are packaged in a single package forming a system-on-chip (SoC). In at least one embodiment, SoC can be configured as a logic-on-logic configuration, which can be in a 3D configuration or a 2.5D configuration.

In at least one embodiment, computational block 3001 is packaged in a single package and then coupled to processor 3005 and RAM 3004 and 3006, and solid-state drive 3007 on a printed circuit board (PCB). In at least one embodiment, computational block 3001 is configured as a logic-on-logic configuration, which can be in a 3D configuration or a 2.5D configuration. In at least one embodiment, computational block 3001 comprises special purpose compute die 3003 or microprocessor. In at least one embodiment, compute die 3003 is a compute chiplet that performs a function of an accelerator or inference. In at least one embodiment, memory 3002 is DRAM which forms a special memory/cache for special purpose compute die 3003. In at least one embodiment, DRAM can be embedded DRAM (eDRAM) such as 1T-1C (one transistor and one capacitor) based memories. In at least one embodiment, memory 3002 is ferroelectric or paraelectric RAM (Fe-RAM).

In at least one embodiment, compute die 3003 is specialized for applications such as Artificial Intelligence, graph processing, and algorithms for data processing. In at least one embodiment, compute die 3003 further has logic computational blocks, for example, for multipliers and buffers, special data memory block (e.g., buffers) comprising DRAM, FeRAM, or a combination of them. In at least one embodiment, memory 3002 has weights and inputs stored in-order to improve computational efficiency. In at least one embodiment, interconnects between processor 3005 (also referred to as special purpose processor), RAM 3004, and compute die 3003 are optimized for high bandwidth and low latency. In at least one embodiment, architecture of FIG. 30 allows efficient packaging to lower energy, power, or cost and provides for ultra-high bandwidth between memory 3002 and compute die 3003 of computational block 3001.

In at least one embodiment, memory 3002 is partitioned to store input data (or data to be processed) 3002A and computed weights 3002B. In at least one embodiment, input data 3002A are stored in a separate memory (e.g., a separate memory die) and computed weights 3002B are stored in a separate memory (e.g., separate memory die).

In at least one embodiment, computational logic or compute die 3003 comprises matrix multiplier, adder, concatenation logic, buffers, and combinational logic. In at least one embodiment, compute die 3003 performs multiplication operation on input data 3002A and computed weights 3002B. In at least one embodiment, computed weights 3002B are fixed weights. For example, processor 3005 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 3002. In at least one embodiment, input data, that is to be analyzed using a trained model, is processed by computational block 3001 with computed weights 3002B to generate an output (e.g., a classification result).

In at least one embodiment, RAM 3004 is ferroelectric or paraelectric based SRAM. For example, six transistor (6T) SRAM bit-cells having ferroelectric or paraelectric transistors are used to implement non-volatile FeSRAM. In at least one embodiment, solid-state drive 3007 comprises NAND flash cells. In at least one embodiment, solid-state drive 3007 comprises NOR flash cells. In at least one embodiment, solid-state drive 3007 comprises multi-threshold NAND flash cells.

In at least one embodiment, non-volatility of FeRAM is used to introduce new features such as security, functional safety, and faster reboot time of AI machine 3000. Non-volatile FeRAM is a low power RAM that provides fast access to data and weights. In at least one embodiment, RAM 3004 that is an FeRAM can also serve as a fast storage for computational block 3001 (or accelerator), which typically has low capacity and fast access requirements.

In various embodiments, FeRAM (FeDRAM or FeSRAM) includes ferroelectric or paraelectric material. In at least one embodiment, ferroelectric or paraelectric (FE) material may be in a transistor gate stack or in a capacitor of memory. In at least one embodiment, ferroelectric material can be any suitable low voltage FE material that allows FE material to switch its state by a low voltage (e.g., 3000 mV). In at least one embodiment, threshold in FE material has a highly non-linear transfer function in polarization vs. voltage response. In at least one embodiment, threshold is related to: a) non-linearity of switching transfer function, and b) squareness of FE switching. Non-linearity of switching transfer function is width of derivative of polarization versus voltage plot. In at least one embodiment, squareness is defined by ratio of remnant polarization to saturation polarization; perfect squareness will show a value of 1.

In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a non-linear dielectric. Squareness of FE switching can also be changed by granularity of FE layer. In at least one embodiment, a perfectly epitaxial, single crystalline FE layer will show higher squareness (e.g., ratio is closer to 1) compared to a polycrystalline FE. In at least one embodiment, this perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. In at least one embodiment, progressive doping with La will reduce squareness.

In at least one embodiment, FE material includes material of ferroelectric layer which are same as those described herein.

In at least one embodiment, FE material is between two electrodes that comprise perovskite templated conductors. In such a templated structure, a thin layer (e.g., approximately 10 nm) of a perovskite conductor (such as $SrRuO_3$) is coated on top of $IrO_2$, $RuO_2$, $PdO_2$, or $PtO_2$ (which have a non-perovskite structure but higher conductivity) to provide a seed or template for growth of pure perovskite ferroelectric material at low temperatures.

FIG. 31A illustrates 1TnC bit-cell 3100 comprising non-linear polar material for its capacitors, where plate-lines are parallel to bit-line, in accordance with at least one embodiment. In at least one embodiment, 1TnC bit-cell 3100 (e.g., 1201$_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). In at least one embodiment, capacitors can be a planar or non-planar capacitor as described. In at least one embodiment, plurality of capacitors Cfe1, Cfe2, through Cfen are stacked and folded capacitors.

In at least one embodiment, gate terminal of transistors $MN_1$ is controllable by WL. In at least one embodiment, BL is coupled to a source or drain terminal of transistor $MN_1$. In at least one embodiment, an individual PL of a plurality of PLs is coupled to an individual capacitor. In at least one embodiment, capacitor Cfe1 is coupled to plate-line PL0_1, capacitor Cfe2 is coupled to plate_line PL0_2, and capacitor Cfen is coupled to plate_line PL0_*n*. In at least one embodiment, plurality of capacitors is coupled to storage node sn1, which is coupled to a drain or source terminal of transistor $MN_1$. In at least one embodiment, a first terminal of capacitor Cfe1 is coupled to PL0_1 and a second terminal of capacitor Cfe1 is coupled to storage node sn1. In at least one embodiment, apparatus 2900 (FIG. 29) has n-number of PLs (e.g., PL0_1 through PL0_*n*) per column which are parallel to a PL for that column.

While at least one embodiment is illustrated with reference to an n-type transistor, at least one embodiment is also applicable to a p-type transistor or a combination of n-type or p-type transistors. In at least one embodiment, when a transistor of a different conductivity type is used than what is shown in FIG. 31A, then driving logic for BL, PLs, and/or WL may also change for proper read and/or write operations.

In at least one embodiment, PLs are parallel to BL. In at least one embodiment, PL0_1, PL0_2, PL0_$n$ are parallel to BL. In at least one embodiment, transistor $MN_1$ is fabricated on frontend of die and capacitors are stacked over transistor. In at least one embodiment, capacitors are stacked along z-direction and folded along x-axis. In at least one embodiment, capacitors can be planar or non-planar capacitors. In at least one embodiment, a taller and wider bit-cell is formed with a footprint comparable to footprint of transistor $MN_1$. In at least one embodiment, x-y footprint is determined by size of transistor $MN_1$ and its connections to BL, WL, and storage node sn1.

In at least one embodiment, PL (e.g., PL0_1, PL0_2, . . . . PL0_$n$) controls which capacitor of bit-cell is programmed, and value of programming. In at least one embodiment, BL acts as a sense-line. In at least one embodiment, voltage on BL (e.g., sense voltage) can create disturbance on other bit-lines during read operation. To mitigate such disturbances. In at least one embodiment, 1TnC bit-cell is periodically refreshed (e.g., every 1 second). In at least one embodiment, periodic refresh is minimized by refreshing in active mode of operation. In at least one embodiment, in standby mode (e.g., low power mode), 1TnC bit-cell is not refreshed as there is no disturb mechanism during standby. In at least one embodiment, wear-leveling logic 2906 (FIG. 29) provides one or more endurance mechanisms for 1TnC memory bit-cells. One of endurance mechanisms involves refreshing of data content in capacitor(s).

In at least one embodiment, in 1TnC bit-cell case (e.g., bit-cell 7031$_{,0}$) with PL parallel to BL, activities seen on an unselected or un-intended bit-cell while performing read/write operations on same column as that of selected bit-cell can have large disturb effects on unselected or unintended bit-cells. In at least one embodiment, this may be true if PL within same column toggles (during read or write) a particular value to desired bit-cell. In at least one embodiment, this signal on PL of that column, which is shared with other unselected cells, can create a field across non-linear polar material based capacitors or devices of unselected cells. In at least one embodiment, field across unselected non-linear polar material based capacitors or devices is a function of dielectric component of individual non-linear polar material based capacitors or devices and total capacitance on storage node sn1 of those bit-cells. In at least one embodiment, since in 1TnC bit-cells storage capacitor has much larger capacitance load, activity seen on unselected bit-line can result into almost all voltage getting dropped across ferroelectric capacitors (e.g., Vfe=Vpl*(Cp/(Cfed+Cp), which creates a disturb effect, which in turn causes unintentional modification of polarization stage of ferroelectric capacitor.

FIG. 31B illustrates 1TnC bit-cell 3120 comprising non-linear polar material for its capacitors, where plate-lines are parallel to word-line, in accordance with at least one embodiment. 1TnC bit-cell 3120 is similar to 1TnC bit-cell 3100 but plate-lines are parallel to word line.

Figure 32A:
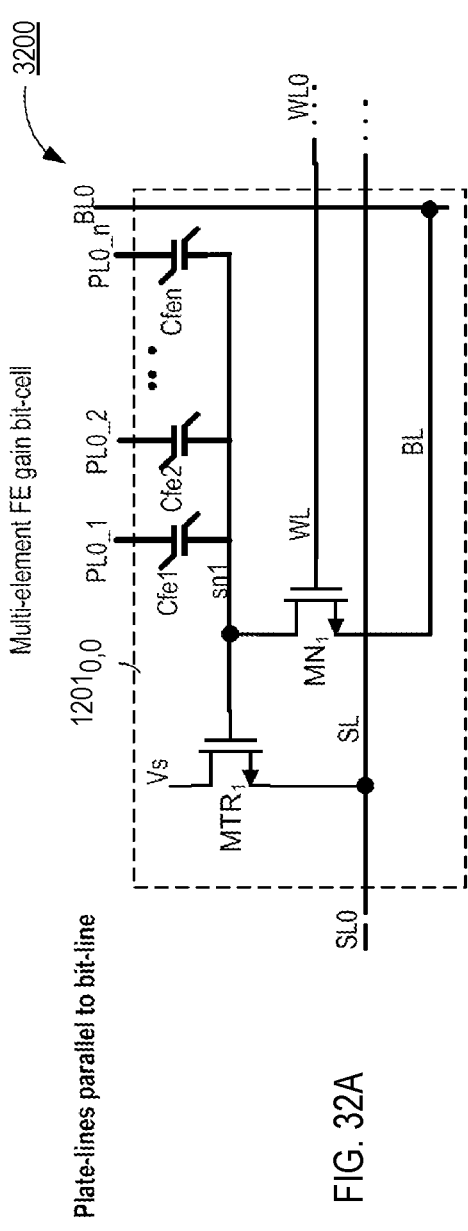
FIG. 32A illustrates a multi-element FE gain bit-cell with plate-lines parallel to bit-line, in accordance with at least one embodiment.

FIG. 32A illustrates a multi-element FE gain bit-cell 3200 with plate-lines parallel to bit-line, in accordance with at least one embodiment. In at least one embodiment, bit-cell 3200 (e.g., 701$_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In at least one embodiment, gate terminal of n-type transistor $MN_1$ is coupled to WL (e.g., WL1). In at least one embodiment, drain or source terminal of n-type transistor $MN_1$ is coupled to BL. In at least one embodiment, first terminals of each of capacitors Cfe1 through Cfen is coupled to a storage node sn1. In at least one embodiment, storage node sn1 is coupled to a source or drain terminal of n-type transistor $MN_1$ and to a gate of transistor $MTR_1$. In at least one embodiment, drain or source terminal of $MTR_1$ is coupled to a bias voltage Vs. In at least one embodiment, Vs is a programmable voltage that can be generated by any suitable source. In at least one embodiment, Vs voltage can help in biasing gain transistor in conjunction with sense-voltage that builds at sn1 node. In at least one embodiment, source or drain terminal of transistor $MTR_1$ is coupled to SL (e.g., SL1). In at least one embodiment, a p-type transistor can be used as well for gain.

In at least one embodiment, second terminals of each of capacitors Cfe1 through Cfen is coupled to a corresponding plate-line (PL). In at least one embodiment, second terminal of Cfe1 is coupled to PL0_1, second terminal of Cfe2 is coupled to PL0_2, and so on. In at least one embodiment, apparatus 2900 (FIG. 29) has n-number of PLs (e.g., PL0_1 through PL0_$n$) per column which are parallel to a BL for that column. In at least one embodiment, SL is parallel to PL. In at least one embodiment, SL is parallel to WL.

In at least one embodiment, ferroelectric (or paraelectric) capacitors Cfe1 through Cfen are planar capacitors such as those discussed with reference to various embodiments herein. In at least one embodiment, ferroelectric (or paraelectric) capacitors Cfe1 through Cfen are pillar capacitors such as those discussed with reference to various embodiments herein. In at least one embodiment, ferroelectric (or paraelectric) capacitors Cfe1 through Cfen are vertically stacked and horizontally folded allowing for tall bit-cells (e.g., higher in z-direction) but with x-y footprint of two transistors. In at least one embodiment, by folding capacitors, diffusion capacitance on BL can be reduced for a given array size, which can improve reading speed. In at least one embodiment, folding capacitors lowers effective routing capacitance on BL. In at least one embodiment, larger footprint in x-y direction of multi-element FE gain bit-cell compared to footprint in x-y direction of 1TnC bit-cell, vertical height of capacitor can be reduced as capacitors can expand in x-y direction more than before for a given height. In at least one embodiment, capacitors are folded more effectively. In at least one embodiment, n/2 capacitors per metal or via layer can be packed. In at least one embodiment, more capacitors can be stacked in multi-element FE gain bit-cell because storage node sn1 is decoupled from BL. In at least one embodiment, multi-element FE gain bit-cell can reduce thickness scaling requirement for pillar capacitor. In at least one embodiment, polarization density requirements are reduced for multi-element FE gain bit-cell compared to 1TnC bit-cell.

In at least one embodiment, x-y footprint is determined by size of transistor $MN_1$ and its connections to BL, WL, and storage node sn1. In at least one embodiment, footprint can still be decided by other factors such as: a number of capacitors that connect to node; how capacitors are arranged, e.g., more folding on same node versus stacking; effective size constraints on those capacitors; and number of capacitors that share same bit-cell. In at least one embodiment, PL (e.g., PL0_1, PL0_2, . . . . PL_n) controls which cell within same access transistor gets programmed, and value of programming. In at least one embodiment, BL acts as a sense-line. In at least one embodiment, voltage on BL (e.g., sense voltage) can create disturbance on other bit-lines during read operation. To mitigate such disturbances, in at least one embodiment, multi-element FE gain bit-cell (e.g., 701$_{0,0}$) may be periodically refreshed (e.g., every 1 second). In at least one embodiment, periodic refresh is minimized by refreshing in active mode of operation that can be coupled with advance schemes for wear leveling. In standby mode (e.g., low power mode), multi-element FE gain bit-cell (e.g., $701_{0,0}$) is not refreshed as there is no disturb mechanism during standby. In at least one embodiment, multi-element FE gain bit-cell (e.g., $701_{0,0}$) relies on isolating read mode from BL or SL capacitance by isolating through access transistor $MN_1$, where $MN_1$ transistor facilitates pre-charging sn1 node, prior to read operation.

In at least one embodiment, there is a possibility of disturbance at storage node sn1 during read operation. In at least one embodiment, PL is toggled for other capacitors to average value of disturbance that will be seen on sn1 node, e.g., when a read pulse of some polarity is applied at PL of capacitor to be read, a non-zero voltage is applied on other PLs of multi-element FE gain bit-cell (e.g., $701_{0,0}$), that matches expected disturbance seen on shared node. In at least one embodiment, PL driver is configured to support driving different voltage levels on different PLs. In at least one embodiment, wear-leveling logic 2906 (FIG. 29) provides one or more endurance mechanisms for multi-element FE gain bit-cell 3200. In at least one embodiment, one of endurance mechanisms involves refreshing of data content in capacitor(s).

Figure 32B:
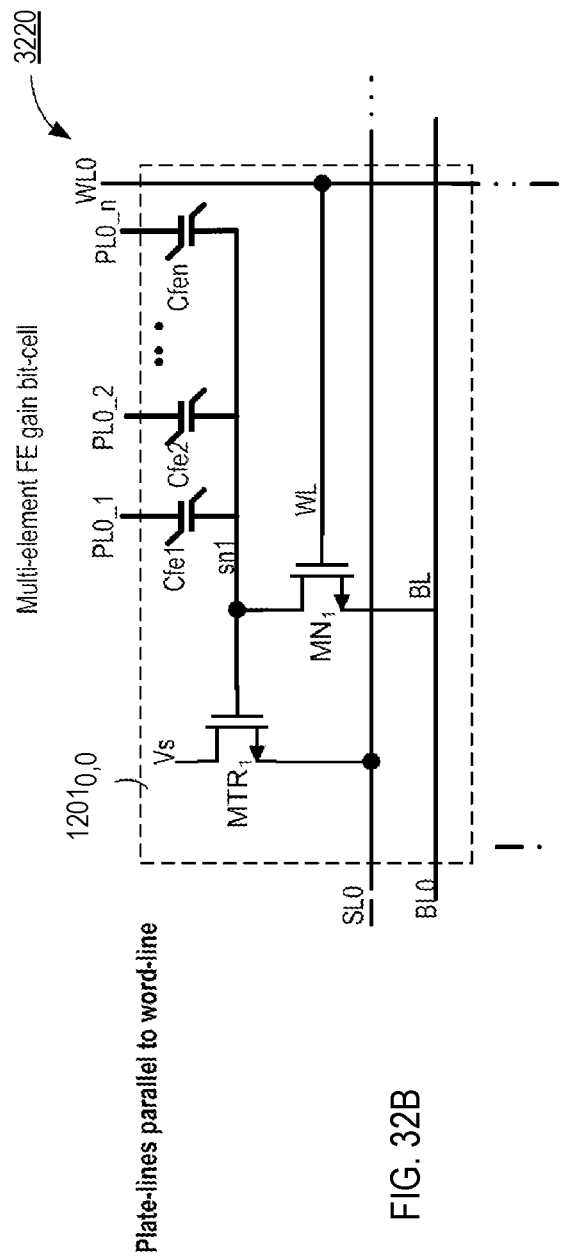
FIG. 32B illustrates a multi-element FE gain bit-cell with plate-lines parallel to word-line, in accordance with at least one embodiment.

FIG. 32B illustrates a multi-element FE gain bit-cell 3220 with plate-lines parallel to word-line, in accordance with at least one embodiment. In at least one embodiment, multi-element FE gain bit-cell 3220 is similar to multi-element FE gain bit-cell 3200 but plate-lines are parallel to word line.

Figure 33:
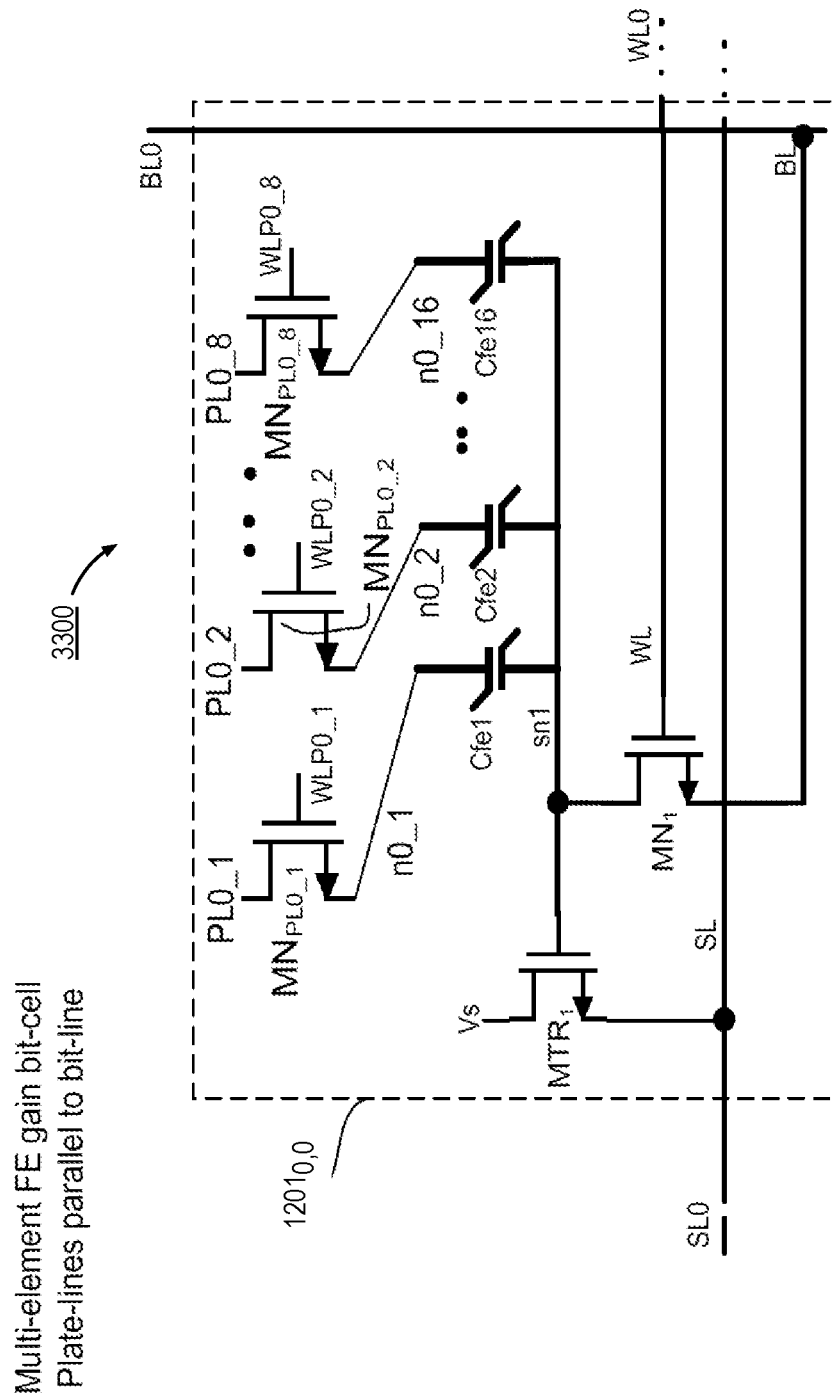
FIG. 33 illustrates a multi-element FE gain bit-cell with plate-line switches, in accordance with at least one embodiment.

FIG. 33 illustrates multi-element FE gain bit-cell or bit-cell 3300 with plate-line switches, in accordance with at least one embodiment. In at least one embodiment, bit-cell 3300 is like bit-cell 3200 (FIG. 32A), but with switches in path of plate-lines and hence a different kind of memory bit-cell. In at least one embodiment, these switches can be added to remove charge disturb effect of unselected bit-cells when bit-lines are arranged parallel to plate-lines. In at least one embodiment, charge disturb effect here is on stored state of capacitors with non-linear polar material. In at least one embodiment, by adding switches, plate-lines are no longer directly affecting charge disturb effect because of corresponding WLs that control switches.

In at least one embodiment, each memory bit-cell in bit-cell 3300 is organized in rows and columns like in apparatus 2900 (FIG. 29), but with bit-lines running parallel to plate-lines. In at least one embodiment, n-type transistor $MN_{PLO\_1}$ is coupled to Cfe1 and plate-line PL0_1. In at least one embodiment, n-type transistor $MN_{PLO\_2}$ is coupled to Cfe2 and plate-line PL0_2. In at least one embodiment, n-type transistor $MN_{PLO\_n}$ is coupled to Cfen and plate-line PL0_n. In at least one embodiment, each transistor (or switch) is controlled separately. In at least one embodiment, transistor $MN_{PLO\_1}$ is controllable by WLP0_1, transistor $MN_{PLO\_2}$ is controllable by WLP0_2, and so on. In at least one embodiment, transistor $MN_{PLO\_n}$ is controllable by WLP0_n. Here, WLP0_1 .... WLP0_n are extensions of an address space. In this case, depending upon which storage element is being programmed or read, corresponding WLP0_1 .... WLP0_n are kept high (e.g., Vdd) whenever plate-line voltage of 0V or Vdd is applied, while unselected storage element sees 0V.

While at least one embodiment is illustrated with reference to an n-type transistor or switch, at least one embodiment is also applicable to a p-type transistor or a combination of n-type or p-type transistors. In at least one embodiment, when a transistor of a different conductivity type is used than what is shown in FIG. 33, then driving logic for BL, PLs, WL, and/or WLPs may also change for proper read and/or write operations.

In at least one embodiment, switches added to plate-lines are fabricated in different layers of a die. In at least one embodiment, transistor $MN_1$ is fabricated on frontend of die while transistors $MN_{PLO\_1}$, $MN_{PLO\_2}$, ... and $MN_{PLO\_n}$, are fabricated in backend of die. In at least one embodiment, capacitor Cfe is fabricated between frontend and backend of die. In at least one embodiment, capacitors Cfe are vertically stacked capacitors and horizontally folded. In at least one embodiment, each switch and its corresponding coupled capacitor is formed in backend of die. In at least one embodiment, each switch and its corresponding coupled capacitor is stacked vertically. In at least one embodiment, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In at least one embodiment, capacitors Cfe1 and Cfe2 are stacked and folded. In at least one embodiment, these backed transistors or switches can be fabricated using any suitable technology such as IGZO (indium gallium zinc oxide).

Method of forming structures described herein are applicable to various logic embodiments. For example, memory devices or capacitive structures formed herein can be used to forming other ferroelectric/paraelectric circuits. In at least one embodiment, these circuits can be implemented majority gate, minority gate, and/or threshold gate.

Following examples are provided that illustrate at least one embodiment. Examples can be combined with other examples. As such, at least one embodiment can be combined with at least another embodiment without changing scope of at least one embodiment.

Example 1: A method of fabricating a device, the method comprising: forming a multi-layer stack above a first substrate, the multi-layer stack comprising a non-linear polar material; forming a first conductive layer on the multi-layer stack; annealing the multi-layer stack; forming a transistor above a second substrate; forming an electrode structure above the transistor, the electrode structure coupled with a terminal of the transistor; forming a second conductive layer above the electrode structure; bonding the first conductive layer with the second conductive layer; removing at least a portion of the first substrate; and patterning the multi-layer stack to form a memory device.

Example 2: The method of example 1, wherein forming the first conductive layer comprises depositing a first material with a first columnar grain structure, and wherein forming the second conductive layer comprises depositing a second material with a second columnar grain structure.

Example 3: The method of example 2, wherein bonding the first conductive layer and the second conductive layer comprises forming a stack where the first columnar grain structure and the second columnar grain structure are misaligned.

Example 4: The method of example 1, wherein the first conductive layer comprises first refractory metals or nitrides of the first refractory metals and the second conductive layer comprises second refractory metals or nitrides of the second refractory metals.

Example 5: The method of example 4, wherein forming the first conductive layer comprises depositing a first layer with a first grain structure and a second layer with a second grain structure, wherein the first grain structure has a higher density of grains than the second grain structure, wherein forming the second conductive layer comprises depositing a third layer with a third grain structure and a fourth layer with a fourth grain structure, wherein the third grain structure has a higher density of grains than the fourth grain structure.

Example 6: The method of example 2, wherein the first columnar grain structure forms a first angle relative to a lower most surface of the first substrate and wherein the second columnar grain structure forms a second angle relative to a bottom most surface of the first substrate.

Example 7: The method of example 1, wherein the first conductive layer comprises an amorphous material and the second conductive layer comprises a polycrystalline material.

Example 8: The method of example 1, wherein the first conductive layer comprises a thickness of at least 1 nm and the second conductive layer comprises a thickness of at least 1 nm.

Example 9: The method of example 1, wherein bonding further forms voids, wherein the voids comprise a thickness spanning a direction from a first surface of the first conductive layer to a second surface of the second conductive layer that is less than 1 nm.

Example 10: The method of example 9, wherein bonding further traps oxygen in the voids.

Example 11: The method of example 1, wherein prior to bonding, the method further comprises planarizing the first conductive layer and the second conductive layer.

Example 12: The method of example 1, wherein after forming the multi-layer stack, the method further comprises annealing the multi-layer stack, wherein annealing comprises utilizing a rapid thermal annealing process, wherein the rapid thermal annealing process comprises heating to a first temperature of more than 700 degrees Celsius, for a time duration between 1 s and 60 s, at a first pressure between vacuum and 760 Torr, and wherein the rapid thermal annealing process further comprises flowing $O_2$, $N_2$, or Argon gas while operating at the first pressure between 1 Torr and 760 Torr.

Example 13: The method of example 1 further comprising patterning the first conductive layer and the second conductive layer to form a plate, wherein the plate is coupled between the memory device and the electrode structure.

Example 14: The method of example 13, further comprising forming a dielectric spacer adjacent to sidewalls of the memory device prior to forming the plate.

Example 15: A method of fabricating a 1T-1C cell, the method comprising: bonding a first conductive layer of a first substrate with a second conductive layer of second substrate, wherein the first conductive layer is a first terminal of a capacitor comprising a non-linear polar material and wherein the second conductive layer is coupled with a second terminal of a transistor.

Example 16: The method of example 15, further comprising patterning the first conductive layer and the second conductive layer to form a plate, wherein the plate is coupled between the capacitor and an electrode structure, and wherein the electrode structure is coupled between the capacitor and the second terminal of the transistor.

Example 17: The method of example 16, further comprising forming a dielectric spacer adjacent to sidewalls of the capacitor prior to forming the plate.

Example 18: A method of fabricating a device array, the method comprising: forming a multi-layer stack above a first substrate, the multi-layer stack comprising a non-linear polar material; forming a first conductive layer on the multi-layer stack; annealing the multi-layer stack; forming a first transistor and a second transistor above a second substrate; forming a bridge structure above the first transistor and the second transistor, the bridge structure coupled between a first terminal of the first transistor and a second terminal of the second transistor; forming a second conductive layer above the bridge structure; bonding the first conductive layer with the second conductive layer; removing at least a portion of the first substrate and exposing an uppermost surface of the multi-layer stack; patterning the multi-layer stack to form a first memory device and a second memory device; and patterning the first conductive layer and the second conductive layer to form a plate, wherein the plate is coupled between the first memory device and the bridge structure.

Example 19: The method of example 18, where first transistor is fabricated laterally apart from the second transistor, wherein the first transistor is identical to the second transistor.

Example 20: The method of example 18, wherein forming the multi-layer stack comprises: depositing a third conductive layer comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$; depositing a dielectric layer on the third conductive layer, the dielectric layer comprising one of: a perovskite material which includes one of: $BaTiO_3$, $KNbO_3$, or $NaTaO_3$; lead zirconium titanate (PZT), or PZT with a doping material, wherein the doping material is one of La or Nb; bismuth ferrite (BFO) with a doping material, wherein the doping material is one of lanthanum, one or more elements from lanthanide series of a periodic table, or one or more elements of a 3d, 4d, 5d, 6d, 4f and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides; hafnium oxide of a form $Hf_{1-x}E_xO_z$, where 'x' denotes a fraction, and E includes one of Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(a)}Mg_{(b)}Nb_{(c)}N$, wherein a, b, and c are respective compositional fractions; niobate type compounds including $LiNbO_3$, $LiTaO_3$, $LiTaO_2F_2$, $Sr_xBa_{1-x}Nb_2O_6$ where $0.32 \leq x \leq 0.8$, or $KSr_2Nb_5O_{15}$; an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $Ba_xSr_yTiO_3$, $HfZrO_2$, Hf—Si—O, or a PMN-PT based relaxor ferroelectrics; and depositing a fourth conductive layer on the dielectric layer, the fourth conductive layer comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$.

Example 1a: A device comprising: a transistor above a substrate; an electrode structure coupled with a terminal of the transistor; a plate electrode coupled with the electrode structure, the plate electrode comprising at least a first conductive layer and a second conductive layer on the first conductive layer and wherein the first conductive layer is part of a first die, and the second conductive layer is part of a second die; and a planar capacitor comprising a non-polar material on at least a portion of the first conductive layer.

Example 2a: The device of example 1a, wherein the first conductive layer comprises first refractory metals or nitrides of the first refractory metals and the second conductive layer comprises second refractory metals or nitrides of the second refractory metals.

Example 3a: The device of example 1a, wherein the first conductive layer comprises a first grain configuration and wherein the second conductive layer comprises a second grain configuration.

Example 4a: The device of example 3a, wherein the first grain configuration comprises a first columnar structure, wherein the second grain configuration comprises second columnar structure, and wherein the first grain configuration and the second grain configuration are misaligned.

Example 5a: The device of example 4a, wherein the first columnar structure is at a first angle, wherein the second columnar structure is at a second angle.

Example 6a: The device of example 1a, wherein the first conductive layer comprises first zone with a first grain structure and a second zone with a second grain structure, wherein the second zone is above the first zone, wherein the first grain structure has a higher density of grains than the second grain structure, wherein the second conductive layer comprises a third zone with a third grain structure and a fourth zone with a fourth grain structure, wherein the fourth zone is above the third zone, wherein the fourth grain structure has a higher density of grains than the third grain structure.

Example 7a: The device of example 1a, wherein oxygen is present at an interface between the first conductive layer and a second conductive layer.

Example 8a: The device of example 1a, wherein the first conductive layer is amorphous or polycrystalline. and the second conductive layer is amorphous or polycrystalline.

Example 9a: The device of example 1a, wherein an interface between the first conductive layer and a second conductive layer comprises one or more voids, where the one or more voids have a length that is less than 1 nm.

Example 10a: The device of example 1a further comprising a dielectric spacer, the dielectric spacer comprising a first sidewall adjacent to a second sidewall of the planar capacitor, and wherein the first sidewall is aligned with a third sidewall of the plate electrode.

Example 11a: The device of example 10a, wherein the dielectric spacer is a first dielectric spacer and the device further comprises a second dielectric spacer adjacent to the third sidewall.

Example 12a: A system comprising: a first conductive layer of a first substrate in contact with a second conductive layer of second substrate, wherein the first conductive layer is a first terminal of a capacitor comprising a non-linear polar material and wherein the second conductive layer is coupled with a terminal of a transistor.

Example 13a: The system of example 12a, wherein the first conductive layer comprises refractory metals or nitrides of refractory metals and the second conductive layer comprises refractory metals or nitrides of refractory metals.

Example 14a: The system of example 12a, wherein the capacitor is a first capacitor in a plurality of capacitors, wherein the plurality of capacitors are on the first conductive layer.

Example 15a: The system of example 14a, wherein the first conductive layer and the second conductive layer are components of a plate electrode having a sidewall that extends beyond sidewalls of the plurality of capacitors.

Example 16a: A device comprising: a transistor above a substrate; a conductive interconnect within a first dielectric, the conductive interconnect coupled with a terminal of the transistor; an electrode structure coupled with the conductive interconnect, the electrode structure comprising at least a first conductive layer and a second conductive layer on the first conductive layer and oxygen at an interface between the first conductive layer and the second conductive layer, and wherein the first conductive layer is part of a first die, and the second conductive layer is part of a second die; a first capacitor comprising a non-polar material on a first portion of the electrode structure; a second capacitor comprising the non-polar material on a second portion of the electrode structure; and a dielectric spacer laterally adjacent to a first sidewall of the first capacitor and on a second sidewall of the second capacitor.

Example 17a: The device of example 16a, wherein the electrode structure laterally beyond the dielectric spacer adjacent to the first sidewall and the second sidewall.

Example 18a: The device of example 16a, wherein a material of the dielectric spacer extends laterally on an uppermost surface of the electrode structure to a third sidewall of the electrode structure, and wherein the dielectric spacer is a first dielectric spacer, and the device further comprises a second dielectric spacer on the third sidewall.

Example 19a: The device of example 16a, wherein the transistor is a first transistor, and the device further comprises a second transistor identical to the first transistor, wherein the first transistor and the second transistor are on a same plane.

Example 20a: The device of example 19a further comprising a drain contact coupled between a drain of the first transistor and the electrode structure and a gate contact coupled between the electrode structure and a gate of the second transistor.

Example 1b: A method of fabricating a device, the method comprising: forming a multi-layer stack above a first substrate, the multi-layer stack comprising a non-linear polar material; patterning the multi-layer stack to form a capacitor; forming a first conductive structure on the capacitor; forming a transistor above a second substrate; forming a second conductive structure above the transistor, wherein the second conductive structure is coupled with a terminal of the transistor; and bonding the first conductive structure with the second conductive structure.

Example 2b: The method of example 1b further comprises forming an encapsulation layer on sidewalls of the capacitor and forming an insulator on the encapsulation layer.

Example 3b: The method of example 2b, wherein forming the first conductive structure comprises: depositing a first dielectric on the capacitor, on the encapsulation layer, and on the insulator; forming a first opening in the first dielectric to expose the capacitor; depositing a first material of the first conductive structure in the first opening; and planarizing to form the first conductive structure; wherein forming the second conductive structure comprises: depositing a second dielectric on the capacitor; forming a second opening in the second dielectric to expose an electrode structure coupled with the terminal of the transistor; depositing a second material of the second conductive structure into the second opening; and planarizing to form the second conductive structure.

Example 4b: The method of example 3b, wherein depositing the first material comprises depositing a first refractory metal, nitrides of the first refractory metal, or platinum, iridium or palladium and wherein depositing the second material comprises depositing a second refractory metal, nitrides of the second refractory metal, or platinum, iridium or palladium.

Example 5b: The method of example 1b, wherein forming the capacitor comprises etching the multi-layer stack to form a taper in the capacitor, wherein the taper causes a bottom portion of the capacitor to be wider than a top portion.

Example 6b: The method of example 3b, wherein bonding the first conductive structure with the second conductive structure further comprises: bringing a first uppermost surface of the first conductive structure in contact with a second uppermost surface of the second conductive structure; and bonding the first dielectric with the second dielectric.

Example 7b: The method of example 1b, wherein the first conductive structure has a first lateral thickness that is substantially equal to a second lateral thickness of the second conductive structure.

Example 8b: The method of example 1b, wherein bonding the first conductive structure with the second conductive structure causes misalignment between the first conductive structure and the second conductive structure.

Example 9b: The method of example 3b, wherein bonding the first conductive structure with the second conductive structure causes misalignment between the first conductive structure and the second conductive structure, and wherein a portion of the first conductive structure is in contact with the second dielectric and wherein a portion of the second conductive structure is in contact with the first dielectric.

Example 10b: The method of example 3b, wherein forming the first opening comprises recessing the insulator adjacent to the encapsulation layer and wherein depositing the first material comprises depositing adjacent to a portion of the encapsulation layer.

Example 11b: The method of example 1b, wherein prior to bonding the method further comprises annealing the first substrate at a first temperature, and annealing the second substrate at a second temperature, wherein the first temperature is greater than the second temperature.

Example 12b: The method of example 1b, wherein the capacitor is a first capacitor, wherein the method further comprises forming a second capacitor laterally separated from the first capacitor, and wherein forming the first conductive structure comprises forming on the first capacitor and on the second capacitor.

Example 13b: The method of example 1b, wherein the method further comprises forming a via electrode on the capacitor by a process comprising: removing the second substrate; planarizing and removing a portion of a third dielectric above the capacitor; forming an opening in the third dielectric; and depositing one or more via electrode materials into the opening.

Example 14b: A method of fabricating a 1T-1C cell, the method comprising: bonding a first conductive structure of a first substrate with a second conductive structure of second substrate, wherein the first conductive structure is coupled with a first terminal of a capacitor comprising a non-linear polar material, wherein the second conductive structure is coupled with a second terminal of a transistor.

Example 15b: The method of example 14b, wherein the method further comprises bonding a first dielectric laterally adjacent to the first conductive structure with a second dielectric laterally adjacent to the second conductive structure.

Example 16b: The method of example 14b, wherein forming the first conductive structure comprises depositing a first material with a first columnar grain structure, and wherein forming the second conductive structure comprises depositing a second material with a second columnar grain structure, wherein the first columnar grain structure and the second columnar grain structure are misaligned.

Example 17b: A method of fabricating a device, the method comprising: forming a multi-layer stack above a first substrate, the multi-layer stack comprising a non-linear polar material; patterning the multi-layer stack to form a first capacitor and a second capacitor; forming an encapsulation adjacent to a first sidewall of the first capacitor and a second sidewall of the second capacitor; forming a first conductive structure, wherein the first conductive structure extends from the first capacitor; forming a transistor above a second substrate; forming a second conductive structure above the transistor, wherein the second conductive structure is coupled with a terminal of the transistor; and bonding the first conductive structure with the second conductive structure.

Example 18b: The method of example 17b, wherein forming the first conductive structure comprises depositing a first layer with a first grain structure and a second layer with a second grain structure, wherein the first grain structure has a higher density of grains than the second grain structure, wherein forming the second conductive structure comprises depositing a third layer with a third grain structure and a fourth layer with a fourth grain structure, wherein the third grain structure has a higher density of grains than the fourth grain structure, wherein the first layer and the second layer comprise a same material, wherein the third layer and the fourth layer comprise a same material, and wherein the second layer is in contact with the third layer.

Example 19b: The method of example 17b, wherein forming the first conductive structure comprises extending the first conductive structure beyond a sidewall of the second capacitor and wherein forming the second conductive structure comprises aligning sidewalls of the second conductive structure with sidewalls of the first conductive structure.

Example 20b: The method of example 17b, wherein forming the first capacitor and the second capacitor comprises forming a first electrode, a second electrode and a dielectric layer therebetween, wherein the first electrode comprises a first lateral thickness and the second electrode comprises a second lateral thickness, wherein the first lateral thickness is greater than that second lateral thickness, and wherein the first electrode is closer to the transistor than the second electrode.

Example 1c: A method of fabricating a device, the method comprising: bonding a first conductive layer of a first substrate with a second conductive layer of second substrate, wherein the first conductive layer is coupled with a first terminal of a first capacitor comprising a first non-linear polar material, wherein the second conductive layer is coupled with a second terminal of a transistor; and bonding a third conductive layer formed above the first capacitor with a fourth conductive layer of a third substrate, wherein the fourth conductive layer is coupled with a third terminal of a second capacitor comprising a second non-linear polar material.

Example 2c: The method of example 1c, wherein the first capacitor is formed by masking and etching a first multi-layer stack above the first substrate after bonding the first conductive layer with the second conductive layer.

Example 3c: The method of example 1c, wherein the second capacitor is formed by masking and etching a second multi-layer stack formed above the third substrate after bonding the third conductive layer with the fourth conductive layer.

Example 4c: The method of example 1c, wherein the third conductive layer is coupled with the first terminal of the first capacitor.

Example 5c: The method of example 1c, wherein the first conductive layer comprises a first refractory metal, nitrides of the first refractory metal, or platinum, iridium or palladium and wherein the second conductive layer comprises a second refractory metal, nitrides of the second refractory metal, or platinum, iridium or palladium, wherein the third conductive layer comprises a third refractory metal, nitrides of the second refractory metal, or platinum, iridium or palladium, and wherein the fourth conductive layer comprises a fourth refractory metal, nitrides of the second refractory metal, or platinum, iridium or palladium.

Example 6c: A method of fabricating a device, the method comprising: forming a first multi-layer stack above a first substrate, the first multi-layer stack comprising a non-linear polar material; forming a first conductive layer on the first multi-layer stack; forming a transistor above a second substrate; forming a second conductive layer above the transistor, wherein the second conductive layer is coupled with a terminal of the transistor; bonding the first conductive layer with the second conductive layer; patterning the first multi-layer stack to form a first capacitor after removing at least a portion of the first substrate; forming a second multi-layer stack above a third substrate, the second multi-layer stack comprising a second non-linear polar material; forming a third conductive layer on the second multi-layer stack; forming a fourth conductive layer above the first capacitor; bonding the third conductive layer with the fourth conductive layer; and patterning the second multi-layer stack to form a second capacitor after removing at least a portion of the third substrate.

Example 7c: The method of example 6c, wherein forming the first conductive layer comprises blanket depositing the first conductive layer on the first multi-layer stack, wherein forming the second conductive layer comprises blanket depositing the second conductive layer on an electrode structure coupled with the transistor, wherein the method further comprises patterning the first conductive layer and the second conductive layer to form a first plate electrode after forming the first capacitor.

Example 8c: The method of example 7c, wherein forming the third conductive layer comprises blanket depositing the third conductive layer on the second multi-layer stack, wherein forming the fourth conductive layer comprises blanket depositing the fourth conductive layer on an electrode structure coupled with the first plate electrode, wherein the method further comprises patterning the third conductive layer and the fourth conductive layer to form a second plate electrode after forming the second capacitor.

Example 9c: The method of example 8c, further comprising forming a first encapsulation layer adjacent to sidewalls of the first capacitor prior to forming the first plate electrode and forming a second encapsulation layer adjacent to the second capacitor prior to forming the second plate electrode.

Example 10c: The method of example 9c, further comprising forming a first spacer adjacent to sidewalls of the first plate electrode and forming a second spacer adjacent to sidewalls of the second plate electrode.

Example 11c: The method of example 6c, further comprising forming a signal electrode in contact with the second conductive layer prior to bonding the third conductive layer with the fourth conductive layer.

Example 12c: The method of example 11c, further comprising: forming a third capacitor on the second conductive layer, the third capacitor laterally adjacent to the first capacitor; and forming a fourth capacitor on the third conductive layer, the fourth capacitor laterally adjacent to the second capacitor, wherein the signal electrode is laterally between the first capacitor and the third capacitor.

Example 13c: The method of example 6c, wherein the first conductive layer comprises a first refractory metal or nitrides of the first refractory metal, the second conductive layer comprises a second refractory metal or nitrides of the second refractory metal, wherein the third conductive layer comprises a third refractory metal or nitrides of the third refractory metal, and wherein the fourth conductive layer comprises a fourth refractory metal or nitrides of the fourth refractory metal.

Example 14c: The method of example 6c, wherein forming the first conductive layer comprises depositing a first material with a first columnar grain structure, and wherein forming the second conductive layer comprises depositing a second material with a second columnar grain structure, wherein forming the third conductive layer comprises depositing a third material with a third columnar grain structure, and wherein forming the fourth conductive layer comprises depositing a fourth material with a fourth columnar grain structure.

Example 15c: The method of example 14c, wherein bonding the first conductive layer and the second conductive layer comprises forming a first stack where the first columnar grain structure and the second columnar grain structure are misaligned and wherein bonding the third conductive layer and the fourth conductive layer comprises forming a second stack where the third columnar grain structure and the fourth columnar grain structure are misaligned.

Example 16c: The method of example 6c, wherein forming the first conductive layer comprises depositing a first layer with a first grain structure and a second layer with a second grain structure, wherein the first grain structure has a higher density of grains than the second grain structure, wherein forming the second conductive layer comprises depositing a third layer with a third grain structure and a fourth layer with a fourth grain structure, wherein the third grain structure has a higher density of grains than the fourth grain structure.

Example 17c: The method of example 6c, wherein prior to bonding the first conductive layer with the second conductive layer, the method further comprises planarizing the first conductive layer and the second conductive layer, and wherein prior to bonding the third conductive layer with the fourth conductive layer, the method further comprises planarizing the third conductive layer and the fourth conductive layer.

Example 18c: The method of example 6c, wherein after forming the first multi-layer stack, the method further comprises annealing the first multi-layer stack, wherein annealing comprises utilizing a rapid thermal annealing process, wherein the rapid thermal annealing process comprises heating to a first temperature of more than 700 degrees Celsius, for a time duration between 1s and 60s, at a first pressure between vacuum and 760 Torr, and wherein the rapid thermal annealing process further comprises flowing $O_2$, $N_2$, or Argon gas while operating at the first pressure between 1 Torr and 760 Torr, and wherein after forming the second multi-layer stack, the method further comprises annealing the second multi-layer stack, wherein annealing comprises utilizing a rapid thermal annealing process, wherein the rapid thermal annealing process comprises heating to a first temperature of more than 700 degrees Celsius, for a time duration between 1s and 60s, at a first pressure between vacuum and 760 Torr, and wherein the rapid thermal annealing process further comprises flowing $O_2$, $N_2$, or Argon gas while operating at the first pressure between 1 Torr and 760 Torr.

Example 19c: A method of fabricating, the method comprising: performing a first bonding process comprising bringing into contact a first conductive layer of a first substrate with a second conductive layer of second substrate, wherein the first conductive layer is coupled with a first terminal of a first capacitor comprising a first non-linear polar material, wherein the second conductive layer is coupled with a second terminal of a first transistor and a third terminal of a second transistor; and performing a second bonding process comprising bringing into contact a third conductive layer formed above the first capacitor with a fourth conductive layer of a third substrate, wherein the third conductive layer is coupled with the first terminal of the first capacitor and a third terminal of a second capacitor comprising a second non-linear polar material.

Example 20c: The method of example 19c, wherein the first transistor and the second transistor are formed on a same level, wherein the second terminal and the third terminal are coupled together by a bridge structure between the first conductive layer and the first transistor and the second transistor.

Example 1d: A method of fabricating a system, the method comprising: bonding a first conductive layer of a first substrate with a second conductive layer of second substrate, wherein the first conductive layer is coupled with a first terminal of a capacitor, the capacitor comprising a non-linear polar material, wherein the second conductive layer is coupled with a second terminal of a first transistor, wherein the capacitor and the first transistor are in a first region; and forming a via electrode in a dielectric extending from the first region to a second region, the second region adjacent to the first region, and wherein the via electrode is coupled with a second transistor of the second substrate.

Example 2d: The method of example 1d wherein after bonding the first conductive layer with the second conductive layer, the capacitor is formed by masking and etching a multi-layer stack formed above the first substrate.

Example 3d: The method of example 2d wherein forming the via electrode comprises forming after the capacitor is formed.

Example 4d: The method of example 1d, wherein the first conductive layer comprises a first refractory metal, nitrides of the first refractory metal, or platinum, iridium, or palladium and wherein the second conductive layer comprises a second refractory metal, nitrides of the second refractory metal, platinum, iridium, or palladium.

Example 5d: The method of example 1d wherein the capacitor is formed by masking and etching a multi-layer stack formed above the first substrate prior to bonding the first conductive layer with the second conductive layer.

Example 6d: The method of example 5d, wherein a portion of the first conductive layer is in contact with a first insulator layer of the second substrate, and a portion of the second conductive layer is in contact with a second insulator layer of the first substrate.

Example 7d: A method of fabricating a device, the method comprising: forming a multi-layer stack above a first substrate, the multi-layer stack comprising a non-linear polar material; forming a first conductive layer on the multi-layer stack; forming a first transistor and a second transistor above a second substrate; forming a second conductive layer above the first transistor and the second transistor; bonding the first conductive layer with the second conductive layer; removing at least a portion of the first substrate; patterning the multi-layer stack to form a capacitor above the first transistor; patterning the first conductive layer and the second conductive layer to form a plate electrode, wherein the plate electrode is coupled with the capacitor and the first transistor; and forming a via electrode coupled with the second transistor.

Example 8d: The method of example 7d, wherein the first conductive layer comprises a first refractory metal, nitrides of the first refractory metal, or platinum, iridium or palladium and wherein the second conductive layer comprises a second refractory metal, nitrides of the second refractory metal, platinum, iridium or palladium.

Example 9d: The method of example 7d, wherein the first conductive layer comprises a first zone with a first grain structure and a second zone with a second grain structure, wherein the second zone is above the first zone, wherein the first grain structure has a higher density of grains than the second grain structure, wherein the second conductive layer comprises a third zone with a third grain structure and a fourth zone with a fourth grain structure, wherein the fourth zone is above the third zone, wherein the fourth grain structure has a higher density of grains than the third grain structure.

Example 10d: The method of example 7d, wherein one or more of gold, silver, copper, or oxygen is present at an interface between the first conductive layer and the second conductive layer.

Example 11d: The method of example 7d, wherein patterning the first conductive layer and the second conductive layer further comprises removing the first conductive layer and the second conductive layer from above the second transistor and exposing an electrode structure coupled with the second transistor.

Example 12d: The method of example 7d, wherein the plate electrode is a first plate electrode, wherein patterning the first conductive layer and the second conductive layer further comprises forming a second plate electrode, and wherein the second plate electrode is vertically between the via electrode and the second transistor.

Example 13d: The method of example 7d further comprising: depositing an encapsulation layer comprising an insulator material on the capacitor and on the second conductive layer and etching the encapsulation layer prior to forming the plate electrode.

Example 14d: The method of example 13d, wherein the encapsulation layer extends to a sidewall of the plate electrode.

Example 15d: The method of example 7d, wherein the via electrode is a first via electrode, wherein a sum of a first vertical thickness of the plate electrode, a second vertical thickness of the capacitor, a third vertical thickness of a second via electrode formed on the capacitor is equal to a fourth vertical thickness of the first via electrode.

Example 16d: The method of example 7d further comprising: recessing at least a portion of the second conductive layer during patterning of the multi-layer stack to form a recess, wherein the recess forms a sidewall in the second conductive layer; depositing an encapsulation layer comprising an insulator material on the capacitor and on the sidewall of the second conductive layer and etching the encapsulation layer prior to forming the plate electrode.

Example 17d: A method of fabricating a device, the method comprising: forming a multi-layer stack above a first substrate, the multi-layer stack comprising a non-linear polar material; forming a first conductive layer on the multi-layer stack; annealing the multi-layer stack; forming a first transistor in a first region and a second transistor in a second region, wherein the first transistor and the second transistor are above a second substrate; forming a second conductive layer above the first transistor and the second transistor; bonding the first conductive layer with the second conductive layer; removing at least a portion of the first substrate; patterning the multi-layer stack to form a first capacitor and a second capacitor above the first transistor, wherein the first capacitor and a second capacitor comprise a non-linear polar material; patterning the first conductive layer and the second conductive layer to form a plate electrode coupled with the first capacitor and the second capacitor, wherein the plate electrode is further coupled with the first transistor; and forming a via electrode coupled with the second transistor.

Example 18d: The method of example 17d further comprising a third transistor adjacent to the first transistor, wherein a first terminal of the third transistor is coupled with a second terminal of the first transistor by a conductive structure, and wherein the conductive structure is vertically between the plate electrode and the first transistor.

Example 19d: The method of example 17d further comprising a signal electrode laterally between the first capacitor and the second capacitor, wherein the signal electrode is coupled with the plate electrode.

What is claimed is:

1. A method of fabricating a device, the method comprising:
    forming a multi-layer stack above a first substrate, the multi-layer stack comprises a non-linear polar dielectric material having a form $ABO_X$, wherein A and B are two different cations, and wherein x is 1, 2, or 3;
    patterning the multi-layer stack to form a capacitor;
    forming a first conductive structure on the capacitor;
    forming a transistor above a second substrate;
    forming a second conductive structure above the transistor, wherein the second conductive structure is coupled with a terminal of the transistor; and
    bonding the first conductive structure with the second conductive structure.

2. The method of claim 1 further comprises:
    forming an encapsulation layer on sidewalls of the capacitor; and
    forming an insulator on the encapsulation layer.

3. The method of claim 2, wherein forming the first conductive structure comprises:
    depositing a first dielectric on the capacitor, on the encapsulation layer, and on the insulator;
    forming a first opening in the first dielectric to expose the capacitor;
    depositing a first material of the first conductive structure in the first opening; and
    planarizing to form the first conductive structure;
wherein forming the second conductive structure comprises:
    depositing a second dielectric on the transistor;
    forming a second opening in the second dielectric to expose an electrode structure coupled with the terminal of the transistor;
    depositing a second material of the second conductive structure into the second opening; and
    planarizing to form the second conductive structure.

4. The method of claim 3, wherein depositing the first material comprises depositing a first refractory metal, nitrides of the first refractory metal, or platinum, iridium, or palladium; and wherein depositing the second material comprises depositing a second refractory metal, nitrides of the second refractory metal, or platinum, iridium, or palladium.

5. The method of claim 1, wherein forming the capacitor comprises etching the multi-layer stack to form a taper in the capacitor, and wherein the taper causes a bottom portion of the capacitor to be wider than a top portion.

6. The method of claim 3, wherein bonding the first conductive structure with the second conductive structure further comprises:
    bringing a first uppermost surface of the first conductive structure in contact with a second uppermost surface of the second conductive structure; and
    bonding the first dielectric with the second dielectric.

7. The method of claim 1, wherein the first conductive structure has a first lateral thickness that is substantially equal to a second lateral thickness of the second conductive structure.

8. The method of claim 1, wherein bonding the first conductive structure with the second conductive structure causes misalignment between the first conductive structure and the second conductive structure.

9. The method of claim 3, wherein forming the first opening comprises recessing the insulator adjacent to the encapsulation layer; and wherein depositing the first material comprises depositing the first material adjacent to a portion of the encapsulation layer.

10. The method of claim 1, wherein the non-linear polar dielectric material comprises one of:
    a perovskite material which includes one of: $BaTiO_3$, $KNbO_3$, or $NaTaO_3$;
    lead zirconium titanate (PZT), or PZT;
    bismuth ferrite (BFO);
    a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
    a hexagonal ferroelectric which includes one of: $YMnO_3$ or $LuFeO_3$;
    hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
    hafnium oxide of a form $Hf_{1-y}E_yO_z$, where 'y' is a fraction, and E includes one of Al, Ca, Ce, Dy, Er, Gd, Ge, La, Sc, Si, Sr, Sn, Zr, or Y;
    $Al_{(1-m)}Sc_{(m)}N$, $Ga_{(1-m)}Sc_{(m)}N$, $Al_{(1-m)}Y_{(m)}N$ or $Al_{(a)}Mg_{(b)}Nb_{(c)}N$, wherein m, a, b, and c are respective compositional fractions;
    niobate type compounds including $LiNbO_3$, $LiTaO_3$, $LiTaO_2F_2$, $Sr_pBa_{1-p}Nb_2O_6$, where $0.32 \le p \le 0.8$ or $KSr_2Nb_5O_{15}$;
    an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, $HfZrO_2$, combination of Ba, Sr, and $TiO_3$, or Hf—Si—O, or a PMN-PT based relaxor ferroelectric.

11. The method of claim 1, wherein A is combined with an A site dopant, wherein the A site dopant comprises an element from lanthanide series of periodic table, wherein B is combined with a dopant, and wherein the dopant is a B site dopant and comprises an element from 3d, 4d, 5d, 6d, 4f, or 5f series of periodic table.

12. The method of claim 1, wherein the capacitor is a first capacitor, wherein the method further comprises forming a second capacitor laterally separated from the first capacitor, and wherein forming the first conductive structure comprises forming on the first capacitor and on the second capacitor.

13. The method of claim 1, wherein the method further comprises forming a via electrode on the capacitor by a process comprising:
   removing the second substrate;
   planarizing and removing a portion of a third dielectric above the capacitor;
   forming an opening in the third dielectric; and
   depositing one or more via electrode materials into the opening.

14. A method of fabricating a 1T-1C cell, the method comprising:
   bonding a first conductive structure of a first substrate with a second conductive structure of second substrate, wherein the first conductive structure is coupled with a first terminal of a capacitor comprising a non-linear polar dielectric material having a form $ABO_X$, wherein A and B are two different cations, wherein x is 1, 2, or 3, and wherein the second conductive structure is coupled with a second terminal of a transistor.

15. The method of claim 14, wherein the method further comprises bonding a first dielectric laterally adjacent to the first conductive structure with a second dielectric laterally adjacent to the second conductive structure.

16. The method of claim 14, wherein forming the first conductive structure comprises depositing a first material with a first columnar grain structure, and wherein forming the second conductive structure comprises depositing a second material with a second columnar grain structure, and wherein the first columnar grain structure and the second columnar grain structure are misaligned.

17. A method of fabricating a device, the method comprising:
   forming a multi-layer stack above a first substrate, the multi-layer stack comprising a non-linear polar dielectric material having a form $ABO_X$, wherein A and B are two different cations, and wherein x is 1, 2, or 3;
   patterning the multi-layer stack to form a first capacitor and a second capacitor;
   forming an encapsulation adjacent to a first sidewall of the first capacitor and a second sidewall of the second capacitor;
   forming a first conductive structure, wherein the first conductive structure extends from the first capacitor;
   forming a transistor above a second substrate;
   forming a second conductive structure above the transistor, wherein the second conductive structure is coupled with a terminal of the transistor; and
   bonding the first conductive structure with the second conductive structure.

18. The method of claim 17, wherein forming the first conductive structure comprises depositing a first layer with a first grain structure and a second layer with a second grain structure, wherein the first grain structure has a higher density of grains than the second grain structure, wherein forming the second conductive structure comprises depositing a third layer with a third grain structure and a fourth layer with a fourth grain structure, wherein the third grain structure has a higher density of grains than the fourth grain structure, wherein the first layer and the second layer comprise a same material, wherein the third layer and the fourth layer comprise a same material, and wherein the second layer is in contact with the third layer.

19. The method of claim 17, wherein forming the first conductive structure comprises extending the first conductive structure beyond a sidewall of the second capacitor, and wherein forming the second conductive structure comprises aligning sidewalls of the second conductive structure with sidewalls of the first conductive structure.

20. The method of claim 17, wherein forming the first capacitor and the second capacitor comprises forming a first electrode, a second electrode and a dielectric layer comprising the non-linear polar dielectric material therebetween, wherein the first electrode comprises a first lateral thickness and the second electrode comprises a second lateral thickness, wherein the first lateral thickness is greater than that second lateral thickness, and wherein the first electrode is closer to the transistor than the second electrode.

21. The method of claim 17, wherein forming the multi-layer stack comprises:
   depositing a first conductive layer comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_x$, Ru, $RuO_x$, Mo, $MoO_x$, W, or $WO_x$;
   depositing a dielectric layer on the first conductive layer, the dielectric layer comprising the non-linear polar dielectric material, wherein the non-linear polar dielectric material comprises one of:
   a perovskite material which includes one of: $BaTiO_3$, $KNbO_3$, or $NaTaO_3$;
   lead zirconium titanate (PZT) or PZT;
   bismuth ferrite (BFO);
   a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
   a hexagonal ferroelectric which includes one of: $YMnO_3$ or $LuFeO_3$;
   a hexagonal ferroelectric of a type $h-RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides;
   hafnium oxide of a form $Hf_{1-y}E_yO_z$, where 'y' is a fraction, and E includes one of Al, Ca, Ce, Dy, Er, Gd, Ge, La, Sc, Si, Sr, Sn, Zr, or Y;
   $Al_{(1-m)}Sc_{(m)}N$, $Ga_{(1-m)}Sc_{(m)}N$, $Al_{(1-m)}Y_{(x)}N$ or $Al_{(a)}Mg_{(b)}Nb_{(c)}N$, wherein m, a, b, and c are respective compositional fractions;

niobate type compounds including $LiNbO_3$, $LiTaO_3$, $LiTaO_2F_2$, $Sr_pBa_{1-p}Nb_2O_6$ where $0.32 \leq p \leq 0.8$ or $KSr_2Nb_5O_{15}$;

an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100; or a paraelectric material that comprises $SrTiO_3$, a combination of Ba, Sr, and $TiO_3$, $HfZrO_2$, or Hf—Si—O, or a PMN-PT based relaxor ferroelectric; and depositing a second conductive layer on the dielectric layer, the second conductive layer comprising one of: $(La,Sr)FeO_3$, $(La,Sr)CoO_3$, $(La,Ca)MnO_3$, $(La,Sr)MnO_3$, $SrRuO_3$, $Sr_2RuO_4$, $(Ba,Sr)RuO_3$, $SrMoO_3$, $(La,Sr)MnO_3$, $SrCoO_3$, $SrCrO_3$, $SrFeO_3$, $SrVO_3$, $CaMoO_3$, $SrNbO_3$, $LaNiO_3$, $YBa_2Cu_3O_7$, $Bi_2Sr_2CaCuO_8$, $CaRuO_3$, Ir, $Ir_2O_q$, Ru, $RuO_q$, Mo, $MoO_q$, W, or $WO_q$.

22. The method of claim 17, wherein A is combined with an A site dopant, wherein the A site dopant comprises an element from lanthanide series of periodic table, wherein B is combined with a dopant, and wherein the dopant is a B site dopant and comprises an element from 3d, 4d, 5d, 6d, 4f, or 5f series of periodic table.

* * * * *